(12) United States Patent
Jorgenson

(10) Patent No.: US 12,211,690 B1
(45) Date of Patent: Jan. 28, 2025

(54) GROUP IIIA NITRIDE GROWTH SYSTEM AND METHOD

(71) Applicant: Robbie J. Jorgenson, Minneapolis, MN (US)

(72) Inventor: Robbie J. Jorgenson, Minneapolis, MN (US)

( * ) Notice: Subject to any disclaimer, the term of this patent is extended or adjusted under 35 U.S.C. 154(b) by 0 days.

(21) Appl. No.: 18/131,679

(22) Filed: Apr. 6, 2023

Related U.S. Application Data

(63) Continuation of application No. 17/135,046, filed on Dec. 28, 2020, now Pat. No. 11,651,959, which is a continuation of application No. 16/234,070, filed on Dec. 27, 2018, now Pat. No. 10,879,062, which is a continuation of application No. 15/607,194, filed on May 26, 2017, now Pat. No. 10,170,303.

(Continued)

(51) Int. Cl.
*H01L 21/02* (2006.01)

(52) U.S. Cl.
CPC .... *H01L 21/0254* (2013.01); *H01L 21/02458* (2013.01); *H01L 21/02502* (2013.01);
(Continued)

(58) Field of Classification Search
CPC .......... H01L 21/0254; H01L 21/02458; H01L 21/02502; H01L 21/0257; H01L 21/02576;
(Continued)

(56) References Cited

U.S. PATENT DOCUMENTS

| | | |
|---|---|---|
| 4,780,749 A | 10/1988 | Schulman |
| 5,362,977 A | 11/1994 | Hunt et al. |

(Continued)

FOREIGN PATENT DOCUMENTS

| | | |
|---|---|---|
| EP | 3464689 | 7/2020 |
| JP | 2008-333194 | 12/1996 |

(Continued)

OTHER PUBLICATIONS

Armitage, et al., "Lattice-matched HfN buffer layers for epitaxy of GaN on Si", "Applied Physics Letters". Aug. 19, 2002, pp. 1450-1452, vol. 81, No. 2.

(Continued)

*Primary Examiner* — Kyoung Lee
(74) *Attorney, Agent, or Firm* — DeWitt LLP

(57) ABSTRACT

A system and method for growing a gallium nitride (GaN) structure that includes providing a template; and growing at least a first GaN layer on the template using a first sputtering process, wherein the first sputtering process includes: controlling a temperature of a sputtering target, and modulating between a gallium-rich condition and a gallium-lean condition, wherein the gallium-rich condition includes a gallium-to-nitrogen ratio having a first value that is greater than 1, and wherein the gallium-lean condition includes the gallium-to-nitrogen ratio having a second value that is less than the first value. Some embodiments include a load lock configured to load a substrate wafer into the system and remove the GaN structure from the system; and a plurality of deposition chambers, wherein the plurality of deposition chambers includes a GaN-deposition chamber configured to grow at least the first GaN layer on a template that includes the substrate wafer.

20 Claims, 24 Drawing Sheets

Related U.S. Application Data

(60) Provisional application No. 62/462,169, filed on Feb. 22, 2017, provisional application No. 62/412,694, filed on Oct. 25, 2016, provisional application No. 62/396,646, filed on Sep. 19, 2016, provisional application No. 62/385,089, filed on Sep. 8, 2016, provisional application No. 62/342,026, filed on May 26, 2016.

(52) U.S. Cl.
CPC .... *H01L 21/0257* (2013.01); *H01L 21/02576* (2013.01); *H01L 21/02581* (2013.01); *H01L 21/02631* (2013.01)

(58) Field of Classification Search
CPC ......... H01L 21/02581; H01L 21/02631; H01L 21/02505; H01L 21/02507; H01L 21/02579; H01L 21/67098; H01L 21/67248; H01L 29/15; H01L 2924/10323; H01L 2924/1033; C23C 14/34
See application file for complete search history.

(56) References Cited

U.S. PATENT DOCUMENTS

| | | |
|---|---|---|
| 5,557,627 A | 9/1996 | Schneider et al. |
| 5,619,059 A | 4/1997 | Li et al. |
| 5,633,192 A | 5/1997 | Moustakas et al. |
| 5,882,948 A | 3/1999 | Jewell |
| 5,966,393 A | 10/1999 | Hide et al. |
| 6,045,626 A | 4/2000 | Yano et al. |
| 6,100,545 A | 8/2000 | Chiyo et al. |
| 6,239,005 B1 | 5/2001 | Sumiya et al. |
| 6,323,417 B1 | 11/2001 | Gillespie et al. |
| 6,420,199 B1 | 7/2002 | Coman et al. |
| 6,426,512 B1 | 7/2002 | Ito et al. |
| 6,531,719 B2 | 3/2003 | Shibata et al. |
| 6,549,556 B1 | 4/2003 | Hwang et al. |
| 6,563,141 B1 | 5/2003 | Dawson et al. |
| 6,573,537 B1 | 6/2003 | Steigerwald |
| 6,589,808 B2 | 7/2003 | Chiyo et al. |
| 6,614,060 B1 | 9/2003 | Wang et al. |
| 6,692,568 B2 | 2/2004 | Cuomo et al. |
| 6,784,085 B2 | 8/2004 | Cuomo et al. |
| 6,800,500 B2 | 10/2004 | Coman et al. |
| 6,830,949 B2 | 12/2004 | Senda et al. |
| 6,831,302 B2 | 12/2004 | Erchak et al. |
| 6,872,965 B2 | 3/2005 | Ito et al. |
| 6,929,867 B2 | 8/2005 | Armitage et al. |
| 6,943,377 B2 | 9/2005 | Gaska et al. |
| 6,969,874 B1 | 11/2005 | Gee et al. |
| 6,979,844 B2 | 12/2005 | Moku et al. |
| 6,998,281 B2 | 2/2006 | Taskar et al. |
| 7,001,813 B2 | 2/2006 | Mantra et al. |
| 7,030,417 B2 | 4/2006 | Ishibashi et al. |
| 7,148,520 B2 | 12/2006 | Yoo |
| 7,176,483 B2 | 2/2007 | Grupp et al. |
| 7,215,692 B2 | 5/2007 | Jewell |
| 7,223,998 B2 | 5/2007 | Schwach et al. |
| 7,257,140 B2 | 8/2007 | Yoneda |
| 7,279,347 B2 | 10/2007 | Hon et al. |
| 7,332,365 B2 | 2/2008 | Nakamura et al. |
| 7,335,924 B2 | 2/2008 | Liu et al. |
| 7,339,728 B2 | 3/2008 | Hartig |
| 7,345,315 B2 | 3/2008 | Hon et al. |
| 7,368,316 B2 | 5/2008 | Yokouchi et al. |
| 7,465,592 B2 | 12/2008 | Yoo |
| 7,582,910 B2 | 9/2009 | David et al. |
| 7,825,006 B2 | 11/2010 | Nakamura et al. |
| 7,842,939 B2 | 11/2010 | Jorgenson et al. |
| 7,879,697 B2 | 2/2011 | Cohen et al. |
| 7,915,624 B2 | 3/2011 | Jorgenson |
| 7,964,478 B2 | 6/2011 | Choi et al. |
| 8,168,460 B2 | 5/2012 | Miki et al. |
| 8,183,557 B2 | 5/2012 | Iza et al. |
| 8,373,363 B2 | 2/2013 | Grajcar |
| 8,389,313 B2 | 3/2013 | Miki et al. |
| 8,482,104 B2 | 7/2013 | D'Evelyn et al. |
| 8,519,430 B2 | 8/2013 | Peng et al. |
| 8,541,791 B2 | 9/2013 | Lamaestre et al. |
| 8,637,390 B2 | 1/2014 | Ganguli et al. |
| 8,890,183 B2 | 11/2014 | Jorgenson |
| 9,163,997 B2 | 10/2015 | Vassant et al. |
| 9,330,911 B2 | 5/2016 | Zhang et al. |
| 9,396,933 B2 | 7/2016 | Zhu et al. |
| 9,508,890 B2 | 11/2016 | Li et al. |
| 9,515,226 B2 | 12/2016 | Xi |
| 9,608,145 B2 | 3/2017 | Jorgenson |
| 9,711,697 B2 | 7/2017 | Vassant et al. |
| 10,170,303 B2 * | 1/2019 | Jorgenson ........ H01L 21/02502 |
| 10,263,144 B2 | 4/2019 | Jorgenson |
| 10,879,062 B2 | 12/2020 | Jorgenson |
| 11,851,959 B2 | 5/2023 | Jorgenson |
| 2001/0043629 A1 | 11/2001 | Sun et al. |
| 2003/0183835 A1 | 10/2003 | Moku et al. |
| 2003/0235934 A1 | 12/2003 | Mantra et al. |
| 2003/0235970 A1 | 12/2003 | Hsu et al. |
| 2006/0202211 A1 | 9/2006 | Ueda et al. |
| 2006/0273324 A1 | 12/2006 | Asai et al. |
| 2006/0275937 A1 | 12/2006 | Aoyagi et al. |
| 2007/0045607 A1 | 3/2007 | Chen et al. |
| 2007/0096127 A1 | 5/2007 | Pattison et al. |
| 2008/0257409 A1 | 10/2008 | Li et al. |
| 2008/0259980 A1 | 10/2008 | Wierer et al. |
| 2009/0087936 A1 * | 4/2009 | Miki ................ H01L 21/0242 |
| | | 438/46 |
| 2009/0289270 A1 | 11/2009 | Hanawa et al. |
| 2010/0117118 A1 | 5/2010 | Dabiran et al. |
| 2010/0176369 A2 | 7/2010 | Oliver et al. |
| 2012/0199952 A1 | 8/2012 | D'Evelyn et al. |
| 2013/0056777 A1 | 3/2013 | Jorgenson |
| 2013/0285065 A1 | 10/2013 | Zhu et al. |
| 2014/0008660 A1 | 1/2014 | Jorgenson |
| 2014/0191188 A1 | 7/2014 | Vassant et al. |
| 2015/0014697 A1 | 1/2015 | Xi |
| 2017/0110626 A1 | 4/2017 | Jorgenson |

FOREIGN PATENT DOCUMENTS

| | | |
|---|---|---|
| JP | 09-232631 | 9/1997 |
| JP | 10-026480 | 1/1998 |
| JP | 10-039381 | 2/1998 |
| JP | 10-321954 | 12/1998 |
| JP | 2000-193859 | 7/2000 |
| JP | 2000261033 | 9/2000 |
| JP | 2000323753 | 11/2000 |
| JP | 2003163373 | 6/2003 |
| JP | 2006160566 | 6/2006 |
| JP | 2008-91470 | 4/2008 |
| JP | 2008098224 | 4/2008 |
| JP | 2010500751 | 1/2010 |
| JP | 2011-238685 | 11/2011 |
| JP | 2013098697 | 5/2013 |
| JP | 2013239471 | 11/2013 |
| JP | 2015-524020 | 8/2015 |
| WO | 2007119433 | 10/2007 |
| WO | 2008-020599 | 2/2008 |
| WO | 2008019059 | 2/2008 |
| WO | 2015015800 | 2/2015 |
| WO | 2016009577 | 1/2016 |
| WO | 2017205815 | 11/2017 |

OTHER PUBLICATIONS

Behrisch, et al., "Sputtering yield increase with target temperature for Ag,", "Nuclear Instruments and Methods in Physics Research B", Jul. 2, 1993, pp. 255-258, vol. 82.

Belacel, et al., "Controlling spontaneous emission with plasmonic optical patch antennas", "Nano Lett.", Apr. 10, 2013, pp. 1516-1521, vol. 13, No. 4.

(56) References Cited

OTHER PUBLICATIONS

Bigourdan, et al., "Design of highly efficient mettallo-dielectric patch antennas for single-photon emission". "Optics Expres, Optical Society of America", Feb. 2014, pp. 2337-2347, vol. 22, No. 3.
Burnham, "Improved Understanding and control of Mg-doped GaN by Plasma Assisted Molecular Beam Epitaxy", "Internet download from: http://hdl.handle.net/1853/16228", Aug. 2007,Publisher. Ph.D. dissertation.
Chen, N.C., et al., "Nitride light-emitting diodes grown on Si (111) using a TiN template", "Applied Physics Letters", May 10, 2006, pp. 191110-1-191110-3, vol. 88, No. 91110.
Chen, et al., "Metallodielectric hybrid antennas for ultrastrong enhancement of spontaneous emission", Phys. Rev. Lett., Jun. 8, 2012, pp. 233001-1-233001-5, vol. 108.
Cho, et al., "Surface plasmon-enhanced light-emitting diodes with silver nanoparticles and SiO2 nano-disks embedded in p. GaN", "Applied Physics Letters", Jul. 2011, pp. 041107-1-041107-3, vol. 99.
Corbett, "Amber green emitters targeting high temperature applications", "Information Societies Technology (IST), Agetha IST-1999-10292, Final Report", 1999, pp. 1-87.
Devilez, et al., "Compact metallo-dielectric optical antenna for ultra directional and enhanced radiative emission", "ACS Nano", May 28, 2010, pp. 3390-3396, vol. 4.
Egan, et al., "Dynamic instabilities in master oscillator power amplifier semiconductor lasers", "IEEE Journal of Quantum Electronics", Jan. 1998, pp. 166-170, vol. 34, No. 1.
Esteban, et al., "Optical patch antennas for single photon emission using surface plasmon resonances", "Phys Rev. Lett", Jan. 15, 2010, p. 026802, vol. 104.
Galfsky, et al., "Active hyperbolic metamaterials: enhanced spontaneous emission and light extraction", "Optica", Jan. 16, 2015, pp. 62-65, vol. 2, No. 1.
Hoffman, et al., "Fabrication and characterization of plasmonic nanocone antennas for strong spontaneous emission enhancement", "Nanotechnology", Sep. 17, 2015, pp. 404001 1-8, vol. 26.
Isic, et al., "Plasmonic lifetimes and propagation lenghts in metallodielectric superlattices", "Phys. Rev. B", Apr. 28, 2014, pp. 165427-1165427-7, vol. 89.
Jacob, et al., "Engineering photonic density of states using metamaterials", "Appl. Phys. B,", Jun. 16, 2010, pp. 215-218, vol. 100.
Junaid, "Magnetron Sputter Epitaxy of GaN Epilayers and Nanorods", "Download from: https://www.researchgate.net/publication/277669178_Magnetron_Sputter_Epitaxy_of_GaN_Epilayers_and_Nanorods", 2012, Publisher: Linkping University, Dissertation No. 1482.
Junaid, et al., "Stress Evolution During Growth of GaN (0001)/Al2O3(0001) by Reactive DC Magnetron Sputter Epitaxy", J. Phys. D: Appl. Phys., Mar. 21, 2014, p. 145301, vol. 47.
Khurgin, et al., "Reflecting upon the losses in plasmonics and metamaterials", "MRS Bulletin", Aug. 2012, pp. 768-779, vol. 37, No. 8.
Kim, et al., "Metamaterials and imaging", "Nano Convergence", Nov. 9, 2015, vol. 2, No. 22.
Kwon, et al., "Surface-plasmon-enhanced light-emitting diodes", "Advanced Materials", Mar. 7, 2008, pp. 125-1257, vol. 20.
Lau, et al., "Enhanced modulation bandwidth of nanocavity light emitting devices", "Opt. Express", Apr. 27, 2009, pp. 7790-7799, vol. 17.
Leszczynski, et al., "Thermal Expansion of Gallium Nitride", "J. Appl. Phys", Oct. 15, 1994, p. 4909, vol. 76, No. 8.
Lu, et al., "Enhancing spontaneous emission rates of molecules using nanopatterned multilayer hyperbolic metamaterials", "Nature Nanotechnology", Jan. 2014., pp. 48-53, vol. 9.

Motamdi, et al., "A route to Low Temperature Growth of Single Crystal GaN on Sapphire", "J. Mater. Chem. C", Jun. 2015, pp. 7428-7436, vol. 3.
Naik, et al., "Alternative plasmonic materials: beyond gold and silver", "Advanced Materials", May 15, 2013, pp. 3264-3294, vol. 25.
Nami, et al., "Optical properties of plasmonic light-emitting diodes based on flip-chip III-nitride core-shell nanowires", "Optics Express, Optical Society of America", Dec. 2014, p. 29445, vol. 22, No. 24.
Okamoto, et al., "Epitaxial growth of GaN on single-crystal Mo substrates using HfN buffer layers", "Journal of Crystal Growth", Feb. 15, 2009, pp. 1311-1315, vol. 311, No. 5.
Oliver, Mark H., et al., "Organometallic vapor phase epitaxial growth of GaN on ZrN/AlN/Si Substrates", "Applied Physics Letters", Jul. 16, 2006, pp. 023109-1-023109-3, vol. 93, No. 023109.
Park, et al., "X-ray and Raman Analysis of GaN Produced by Ultrahigh-rate Magnetron Sputter Epitaxy", "[Window Title]", Sep. 2, 2002, p. 1797, vol. 81.
Pattison, Paul Morgan, "Fabrication and characterization of Gallium Nitride based Macro-Cavity Light Emitting Diodes", "ProQuest Information an Learning Company", Sep. 2006, pp. 1-128, vol. 3238796.
Peeples, John W., "Vapor Compression Cooling for High Performance Applications", "Coolers, Design—downloaded from: https://www.electronics-cooling.com/2001/08/vapor-compression-cooling-for-high-performance-applications/", Aug. 1, 2001, vol. 3, No. 7.
Savelev, et al., "Loss compensation in metal-dielectric layered metamaterials", "Physical Review B", Mar. 27, 2013, pp. 115139-1-115139-7, vol. 87.
Shen, Y.C., et al., "Optical cavity effects in InGaN—GaN quantum-well-heterostructure flip-chip light-emitting diodes", "Applied Physics Letters", Apr. 7, 2003, pp. 2221-2223, vol. 82, No. 14.
Shinoda, et al., "Structural Properties of GaN Layers Grown on Al2O3 (0001) and GaN/Al2O3 Template by Reactive Radio-Frequency Magnetron Sputter Epitaxy", "Vacuum", Mar. 2016, pp. 133-140, Volume [Window Title].
Wang, et al., "Dispersion Engineering for Vertical Microcavities Using Subwavelength Gratings", "Physical Review Letters", Feb. 17, 2015.
Webb, et al., "Magnetron Sputter Epitaxy of Gallium Nitride on (0001) Sapphire", "Materials Science Forum", Feb. 1998, pp. 1229-1234, vol. 264-268.
Wu, et al., "Radiative Enhancement of Plasmonic Nanopatch Antennas", "Plasmonics—published online", Aug. 7, 2015.
Japanese Patent Examiner first Office Action, dated Jun. 21, 2021, in related Application JP 2018-562262, 14 pages.
Japanese Patent Examiner second Office Action, dated Dec. 2, 2021, in related Application JP 2018-562262, 11 pages.
Canadian Patent Examiner first Office Action, dated Jul. 13, 2022, in related Application CA 3,132,525, 4 pages.
EPO Patent Examiner Supplementary Search Report and Opinion, dated Jun. 24, 2020 in related Application EP 1703716.4 (published as EP3464689), 9 pages.
PCT Search Report/Written Opinion for related PCT/US2017/034810 application, mailed Nov. 13, 2017, 14 pages.
Feltin, et al., "Stress control in GaN grown on silicon (111) by metalorganic vapor phase epitaxy," Applied Physics Letters, 79, 3230 (2001).
Wang, et al., "AlN/AlGaN superlattices as dislocation filter for low-threading-dislocation thick AlGaN layers on sapphire," Applied Physics Letters, 81, 604 (2002).
Su, et al., "Stress engineering with AlN/GaN superlattices for epitaxial GaN on 200 mm silicon substrates using a single wafer rotating disk MOCVD reactor," Journal of Materials Research, vol. 30, Issue 19, pp. 2846-2858 (2015).

* cited by examiner

601

| SPUTTERED AlN (NM) | | SPUTTERED GaN (NM) (DOPING PROFILES VARY) | |
|---|---|---|---|
| MIN | MAX | MIN | MAX |
| ONE MONOLAYER | 5 | 10 | 20000 |
| 5 | 10 | 10 | 20000 |
| 10 | 15 | 10 | 20000 |
| 15 | 20 | 10 | 20000 |
| 20 | 25 | 10 | 20000 |
| 25 | 30 | 10 | 20000 |
| 30 | 35 | 10 | 20000 |
| 35 | 40 | 10 | 20000 |
| 40 | 45 | 10 | 20000 |
| 45 | 50 | 10 | 20000 |
| 50 | 55 | 10 | 20000 |
| 55 | 60 | 10 | 20000 |
| 60 | 65 | 10 | 20000 |
| 65 | 70 | 10 | 20000 |
| 70 | 75 | 10 | 20000 |
| 75 | 80 | 10 | 20000 |
| 80 | 85 | 10 | 20000 |
| 85 | 90 | 10 | 20000 |
| 90 | 95 | 10 | 20000 |
| 95 | 100 | 10 | 20000 |
| 100 | 105 | 10 | 20000 |

| SPUTTERED AIN (NM) | | SPUTTERED GaN (NM) (DOPING PROFILES VARY) | |
|---|---|---|---|
| MIN | MAX | MIN | MAX |
| 105 | 110 | 10 | 20000 |
| 110 | 115 | 10 | 20000 |
| 115 | 120 | 10 | 20000 |
| 120 | 125 | 10 | 20000 |
| 125 | 130 | 10 | 20000 |
| 130 | 135 | 10 | 20000 |
| 135 | 140 | 10 | 20000 |
| 140 | 145 | 10 | 20000 |
| 145 | 150 | 10 | 20000 |
| 150 | 155 | 10 | 20000 |
| 155 | 160 | 10 | 20000 |
| 160 | 165 | 10 | 20000 |
| 165 | 170 | 10 | 20000 |
| 170 | 175 | 10 | 20000 |
| 175 | 180 | 10 | 20000 |
| 180 | 185 | 10 | 20000 |
| 185 | 190 | 10 | 20000 |
| 190 | 195 | 10 | 20000 |
| 195 | 200 | 10 | 20000 |
| 200 | 205 | 10 | 20000 |
| 205 | 210 | 10 | 20000 |

| GaN OMEGA ROCKING CURVE FWHM (ARCSECONDS) | |
|---|---|
| 002 PEAK | 102 PEAK |
| BETWEEN 14.4 AND 619 | BETWEEN 2365 AND 2515 |
| BETWEEN 14.4 AND 619 | BETWEEN 2365 AND 2103.4 |
| BETWEEN 14.4 AND 619 | BETWEEN 2103.4 AND 1841.8 |
| BETWEEN 14.4 AND 619 | BETWEEN 1841.8 AND 1580.2 |
| BETWEEN 14.4 AND 619 | BETWEEN 1580.2 AND 1318.6 |
| BETWEEN 14.4 AND 619 | BETWEEN 1318.6 AND 1057 |
| BETWEEN 14.4 AND 619 | BETWEEN 1057 AND 795.4 |
| BETWEEN 14.4 AND 619 | BETWEEN 795.4 AND 533.8 |
| BETWEEN 14.4 AND 619 | BETWEEN 533.8 AND 272.2 |
| BETWEEN 14.4 AND 619 | BETWEEN 272.2 AND 10.6 |
| BETWEEN 14.4 AND 619 | BETWEEN 10.6 AND 5 |
| BETWEEN 14.4 AND 619 | BETWEEN 5 AND 0 |
| BETWEEN 14.4 AND 239 | BETWEEN 2365 AND 2515 |
| BETWEEN 14.4 AND 239 | BETWEEN 2365 AND 2103.4 |
| BETWEEN 14.4 AND 239 | BETWEEN 2103.4 AND 1841.8 |
| BETWEEN 14.4 AND 239 | BETWEEN 1841.8 AND 1580.2 |
| BETWEEN 14.4 AND 239 | BETWEEN 1580.2 AND 1318.6 |

| GAN OMEGA ROCKING CURVE FWHM (ARCSECONDS) | |
|---|---|
| 002 PEAK | 102 PEAK |
| BETWEEN 14.4 AND 239 | BETWEEN 1318.6 AND 1057 |
| BETWEEN 14.4 AND 239 | BETWEEN 1057 AND 795.4 |
| BETWEEN 14.4 AND 239 | BETWEEN 795.4 AND 533.8 |
| BETWEEN 14.4 AND 239 | BETWEEN 533.8 AND 272.2 |
| BETWEEN 14.4 AND 239 | BETWEEN 272.2 AND 10.6 |
| BETWEEN 14.4 AND 239 | BETWEEN 10.6 AND 5 |
| BETWEEN 14.4 AND 239 | BETWEEN 5 AND 0 |
| BETWEEN 0 AND 14.4 | BETWEEN 2365 AND 2515 |
| BETWEEN 0 AND 14.5 | BETWEEN 2365 AND 2103.4 |
| BETWEEN 0 AND 14.6 | BETWEEN 2103.4 AND 1841.8 |
| BETWEEN 0 AND 14.7 | BETWEEN 1841.8 AND 1580.2 |
| BETWEEN 0 AND 14.8 | BETWEEN 1580.2 AND 1318.6 |
| BETWEEN 0 AND 14.9 | BETWEEN 1318.6 AND 1057 |
| BETWEEN 0 AND 14.10 | BETWEEN 1057 AND 795.4 |
| BETWEEN 0 AND 14.11 | BETWEEN 795.4 AND 533.8 |
| BETWEEN 0 AND 14.12 | BETWEEN 533.8 AND 272.2 |
| BETWEEN 0 AND 14.13 | BETWEEN 272.2 AND 10.6 |
| BETWEEN 0 AND 14.14 | BETWEEN 10.6 AND 5 |
| BETWEEN 0 AND 14.15 | BETWEEN 5 AND 0 |

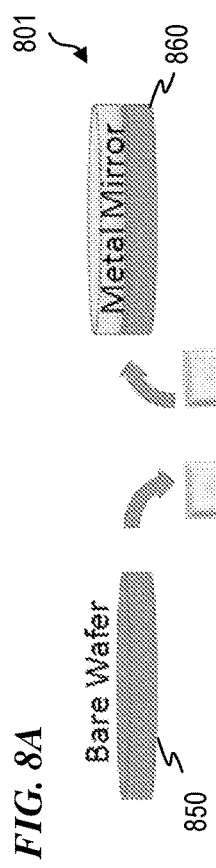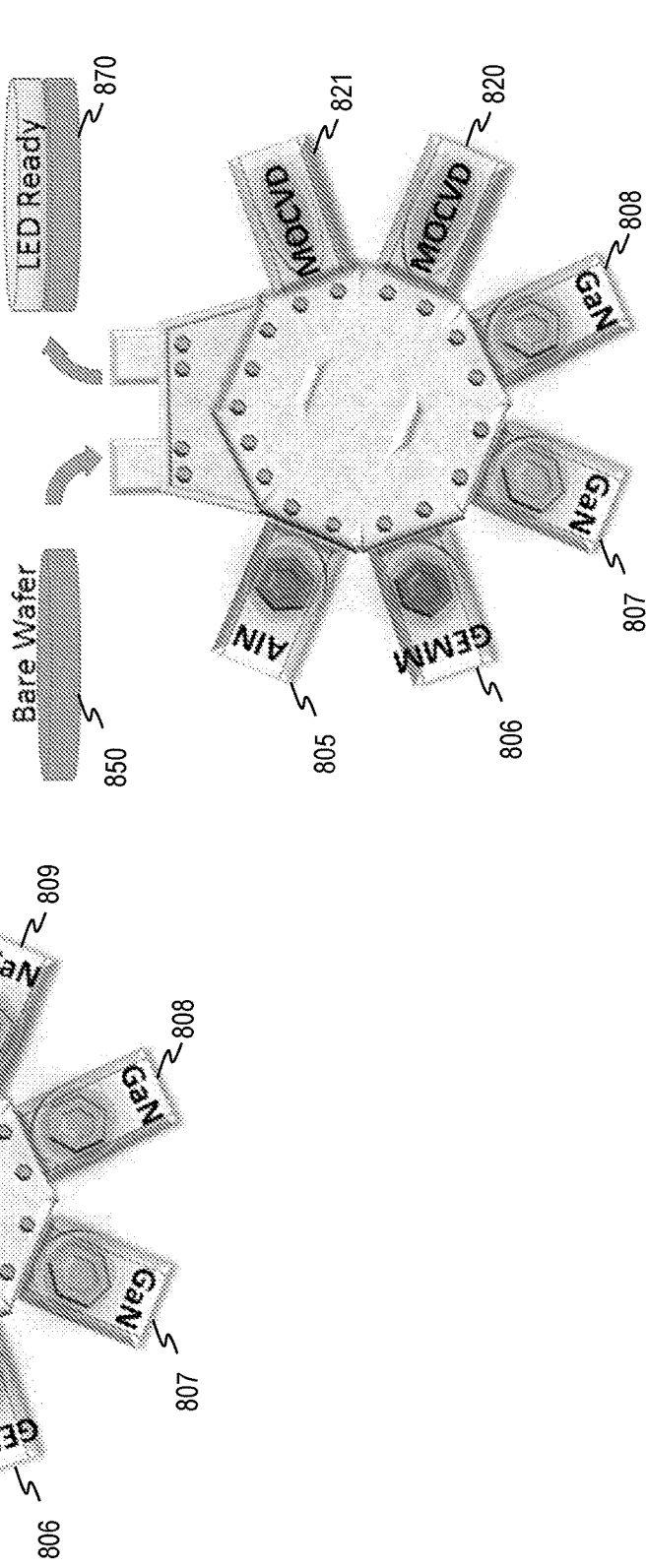
FIG. 8A
FIG. 8B

GROUP IIIA NITRIDE GROWTH SYSTEM AND METHOD

CROSS-REFERENCE TO RELATED APPLICATIONS

This application claims priority benefit, under 35 U.S.C. § 119(e), of U.S. Provisional Patent Application No. 62/342,026 filed May 26, 2016 by Robbie J. Jorgenson, titled "Low Temperature Gallium Nitride by Magnetron Sputtering/PVD Materials, Process and Equipment", U.S. Provisional Patent Application No. 62/385,089 filed Sep. 8, 2016 by Robbie J. Jorgenson, titled "SYSTEM AND METHOD FOR DOPING GALLIUM NITRIDE DURING GROWTH BY PHYSICAL VAPOR DEPOSITION AND RESULTING MATERIALS AND DEVICES", U.S. Provisional Patent Application No. 62/396,646 filed Sep. 19, 2016 by Robbie J. Jorgenson, titled "SYSTEM AND METHOD FOR DOPING GALLIUM NITRIDE DURING GROWTH BY PHYSICAL VAPOR DEPOSITION AND RESULTING MATERIALS AND DEVICES", U.S. Provisional Patent Application No. 62/412,694 filed Oct. 25, 2016 by Robbie J. Jorgenson, et al., titled "GALLIUM NITRIDE GROWTH BY SPUTTERING AND RESULTING MATERIALS AND DEVICES", and of U.S. Provisional Patent Application No. 62/462,169 filed Feb. 22, 2017 by Robbie J. Jorgenson, titled "GALLIUM NITRIDE GROWTH BY SPUTTERING AND RESULTING MATERIALS AND DEVICES", each of which is incorporated herein by reference in its entirety.

This application is related to prior:
- U.S. patent application Ser. No. 15/294,558, titled "SYSTEM AND METHOD FOR LIGHT-EMITTING DEVICES ON LATTICE-MATCHED METAL SUBSTRATES" filed Oct. 14, 2016, and published as Application Publication US 2017/0110626 on Apr. 20, 2017;
- U.S. Provisional Patent Application No. 62/242,604, titled "METHOD AND HYPER EMISSION GREEN LIGHT-EMITTING DIODE ON LATTICE-MATCHED METAL SUBSTRATES FOR ADVANCED OPTICAL FIBER NETWORKING" filed Oct. 16, 2015;

each of which is hereby incorporated by reference in its entirety.

This application is also related to prior:
- U.S. Provisional Patent Application No. 60/835,934, titled "III-NITRIDE LIGHT-EMITTING DEVICES WITH ONE OR MORE RESONANCE REFLECTORS AND REFLECTIVE ENGINEERED GROWTH TEMPLATES FOR SUCH DEVICES, AND METHODS" filed Aug. 6, 2006;
- U.S. Provisional Patent Application No. 60/821,588, titled "III-NITRIDE LIGHT-EMITTING DEVICES WITH ONE OR MORE RESONANCE REFLECTORS AND REFLECTIVE ENGINEERED GROWTH TEMPLATES FOR SUCH DEVICES, AND METHODS" filed Aug. 7, 2006;
- U.S. Provisional Patent Application No. 61/066,960, titled "CURRENT-INJECTING/TUNNELING LIGHT EMITTING DEVICE AND METHOD" filed Feb. 25, 2008;
- U.S. Provisional Patent Application No. 61/610,943, titled "METALLO-SEMICONDUCTOR STRUCTURES FOR III-NITRIDE DEVICES" filed Mar. 14, 2012;
- U.S. Provisional Patent Application No. 61/623,885, titled "STRUCTURES FOR III-NITRIDE DEVICES" filed Apr. 13, 2012;
- U.S. Provisional Patent Application No. 61/655,477, titled "METAL-BASE TRANSISTORS FOR III-NITRIDE DEVICES" filed Jun. 4, 2012;
- U.S. Pat. No. 7,915,624, issued Mar. 29, 2011, titled "III-NITRIDE LIGHT-EMITTING DEVICES WITH ONE OR MORE RESONANCE REFLECTORS AND REFLECTIVE ENGINEERED GROWTH TEMPLATES FOR SUCH DEVICES, AND METHODS";
- U.S. Pat. No. 8,253,157 (a divisional of the application that is now U.S. Pat. No. 7,915,624), issued Aug. 28, 2012, titled "III-NITRIDE LIGHT-EMITTING DEVICES WITH REFLECTIVE ENGINEERED GROWTH TEMPLATES AND METHODS OF MANUFACTURE";
- U.S. Pat. No. 8,890,183 (a divisional of the application that is now U.S. Pat. No. 8,253,157), issued Nov. 18, 2014, titled "III-NITRIDE LIGHT-EMITTING DEVICES WITH REFLECTIVE ENGINEERED GROWTH TEMPLATES AND MANUFACTURING METHOD";
- U.S. Pat. No. 7,842,939, issued Nov. 30, 2010, titled "CURRENT-INJECTING/TUNNELING LIGHT-EMITTING DEVICE AND METHOD";
- U.S. Pat. No. 8,865,492 (a divisional of the application that is now U.S. Pat. No. 7,842,939), issued Oct. 21, 2014, titled "METHOD OF FORMING CURRENT-INJECTING/TUNNELING LIGHT-EMITTING DEVICE"; and
- U.S. Pat. No. 9,608,145, issued Mar. 28, 2017, titled "MATERIALS, STRUCTURES, AND METHODS FOR OPTICAL AND ELECTRICAL III-NITRIDE SEMICONDUCTOR DEVICES";

each of which is incorporated herein by reference in its entirety.

There are multiple embodiments described herein, each of which can be combined with one or more other embodiments described herein and/or incorporated by reference. In some other embodiments, the present invention provides subcombinations that include most features of the various embodiments, but omit one or more features that are individually shown and described herein.

FIELD OF THE INVENTION

The present invention relates to the field of semiconductor devices and methods of manufacturing semiconductor devices, and more specifically to materials, structures, and methods for growing Group-III-nitride devices.

BACKGROUND OF THE INVENTION

Publication titled "Magnetron Sputter Epitaxy of Gallium Nitride on (0001) Sapphire," by J. B. Webb, D. Northcott, S. Charbonneau, F. Yang, D. J. Lockwood, O. Malvezin, P. Singh, J. Corbett, Materials Science Forum, Vols. 264-268, pp. 1229-1234 (1998) is incorporated herein by reference.

Publication titled "Thermal Expansion of Gallium Nitride," by M. Leszczynski, T. Suski, H. Teisseyre, P. Perlin, I. Grzegory, J. Jun, S. Porowski, T. D. Moustakas, J. Appl. Phys., 4909 76 (8) (1994) is incorporated herein by reference.

Publication titled "Improved Understanding and Control of Mg-doped GaN by Plasma Assisted Molecular Beam Epitaxy," by S. D. Burnham, dissertation at http://hdl.handle.net/1853/16228 (2007) is incorporated herein by reference.

Publication titled "Stress Evolution During Growth of GaN (0001)/Al2O3(0001) by Reactive DC Magnetron Sputter Epitaxy," by M. Junaid, P. Sandström, J. Palisaitis, V. Darakchieva, C-L Hsiao, P. O. A. Persson, L. Hultman, J. Birch, J. Phys. D: Appl. Phys. 47, 145301 (2014) is incorporated herein by reference.

Publication titled "A route to Low Temperature Growth of Single Crystal GaN on Sapphire," by Motamedi, Pouyan, Dalili, Neda, Cadien, Kenneth, J. Mater. Chem. C, 3, 7428-7436 (2015) is incorporated herein by reference.

Publication titled "X-ray and Raman Analyses of GaN Produced by Ultrahigh-rate Magnetron Sputter Epitaxy," by Minseo Park, J.-P. Maria, J. J. Cuomo, Y. C. Chang, J. F. Muth, R. M. Kolbas, R. J. Nemanich, E. Carlson, J. Bumgarner, Applied Physics Letters, 81, 1797 (2002) is incorporated herein by reference.

Publication titled "Structural Properties of GaN Layers Grown on $Al_2O_3$(0001) and GaN/$Al_2O_3$ Template by Reactive Radio-Frequency Magnetron Sputter Epitaxy," by Hiroyuki Shinoda, Nobuki Mutsukura, Vacuum, vol. 125, pp. 133-140 (2016) is incorporated herein by reference.

Publication titled "Magnetron Sputter Epitaxy of GaN Epilayers and Nanorods," by Muhammad Junaid, Linköping Studies in Science and Technology, Dissertation No. 1482, Linköping University (2012) is incorporated herein by reference.

Publication titled "Sputtering yield increase with target temperature for Ag," by R. Behrisch and W. Eckstein, Nuclear Instruments and Methods in Physics Research B, vol. 82, pp. 255-258 (1993) is incorporated herein by reference.

Publication titled "Stress control in GaN grown on silicon (111) by metalorganic vapor phase epitaxy," by E. Feltin, B. Beaumont, M. Latigt, P. de Mierry, P. Venniguts, H. Lahrbche, M. Leroux, and P. Gibart, Applied Physics Letters, 79, 3230 (2001) is incorporated herein by reference.

Publication titled "AlN/AlGaN superlattices as dislocation filter for low-threading-dislocation thick AlGaN layers on sapphire," by Hong-Mei Wang, Jian-Ping Zhang, Chang-Qing Chen, Q. Fareed, Jin-Wei Yang, and M. Asif Khan, Applied Physics Letters, 81, 604 (2002) is incorporated herein by reference.

Publication titled "Stress engineering with AlN/GaN superlattices for epitaxial GaN on 200 mm silicon substrates using a single wafer rotating disk MOCVD reactor," by J. Su, E. Armour, B. Krishnan, Soo Min Lee, and G. Papasouliotis, Journal of Materials Research, vol. 30, issue 19, pp. 2846-2858 (2015) is incorporated herein by reference.

U.S. Pat. No. 6,323,417 to Timothy J. Gillespie, et al., titled "METHOD OF MAKING I-III-VI SEMICONDUCTOR MATERIALS FOR USE IN PHOTOVOLTAIC CELLS," issued on Nov. 27, 2001 is incorporated herein by reference.

U.S. Pat. No. 6,692,568 to J. J. Cuomo, titled "METHOD AND APPARATUS FOR PRODUCING MHIN COLUMNS AND MHIN MATERIALS GROWN THEREON," issued on Feb. 17, 2004 is incorporated herein by reference.

U.S. Pat. No. 6,784,085 to J. J. Cuomo, titled "MIIN BASED MATERIALS AND METHODS AND APPARATUS FOR PRODUCING SAME," issued on Aug. 31, 2004 is incorporated herein by reference.

U.S. Pat. No. 7,879,697 to P. I. Cohen, titled "GROWTH OF LOW DISLOCATION DENSITY GROUP-III NITRIDES AND RELATED THIN-FILM STRUCTURES," issued on Feb. 1, 2011 is incorporated herein by reference.

SUMMARY OF THE INVENTION

In some embodiments, the present invention provides epitaxial atomic layer sputtering (EALS) utilizing a solid gallium target (in some such embodiments, the EALS includes magnetron sputtering). In some embodiments, the present invention produces films with two-dimensional (2D) step growth where columnar growth is avoided. Such a process enables high-quality Gallium Nitride (GaN) films that are lower in hydrogen and carbon. In some embodiments, unlike with Metal-Organic Chemical Vapor Deposition (MOCVD), metal organics are not required. In some embodiments, the plasma used during the process lowers the required growth temperature (compared to MOCVD) and increases the growth rate (compared to Molecular Beam Epitaxy (MBE)) while still maintaining high-quality films.

In some embodiments, the present invention provides systems and methods for growing cost effective epitaxial materials of high quality that push the envelope of the current industry's capabilities. In some embodiments, such materials have larger epitaxial domains prior to coalescence and a different density of misfit dislocations.

In some embodiments, the associated ion interaction makes the density of dislocations self-annihilate (self-react) within a thinner film thickness, as compared to the purely thermal environment of MOCVD.

Additionally, since there exists a thermal contraction difference (e.g., due to different coefficients of thermal expansion (CTE)) between GaN and substrate, in some embodiments, when GaN is grown upon sapphire at lower temperatures than that of the temperatures used by MOCVD, the degree of subsequent wafer bowing and wafer stress is reduced. This solves many problems of wafer cracking, epitaxy cracking, non-uniformities, the need for thicker sapphire substrates, and the need for engineered wafer pockets in the MOCVD system for the subsequent active region growth.

BRIEF DESCRIPTION OF THE DRAWINGS

FIG. 6A is a table 601 of thicknesses (in nanometers) for the AlN and GaN layers set forth in GaN structure 301 of FIG. 3.

FIG. 6B is a continuation of table 601.

FIG. 7A is a table 701 showing the Omega rocking curve full-width half-maximum (FWHM) X-ray diffraction (XRD) values (in arcseconds) for GaN produced according to some embodiments of the present invention.

FIG. 7B is a continuation of table 701.

FIG. 8A is a schematic diagram of a template and device epitaxy system 801 for electronics and solid-state lighting (SSL).

FIG. 8B is a schematic diagram of a template and device epitaxy system 802 for electronics and SSL.

DESCRIPTION OF PREFERRED EMBODIMENTS

Figure 1:
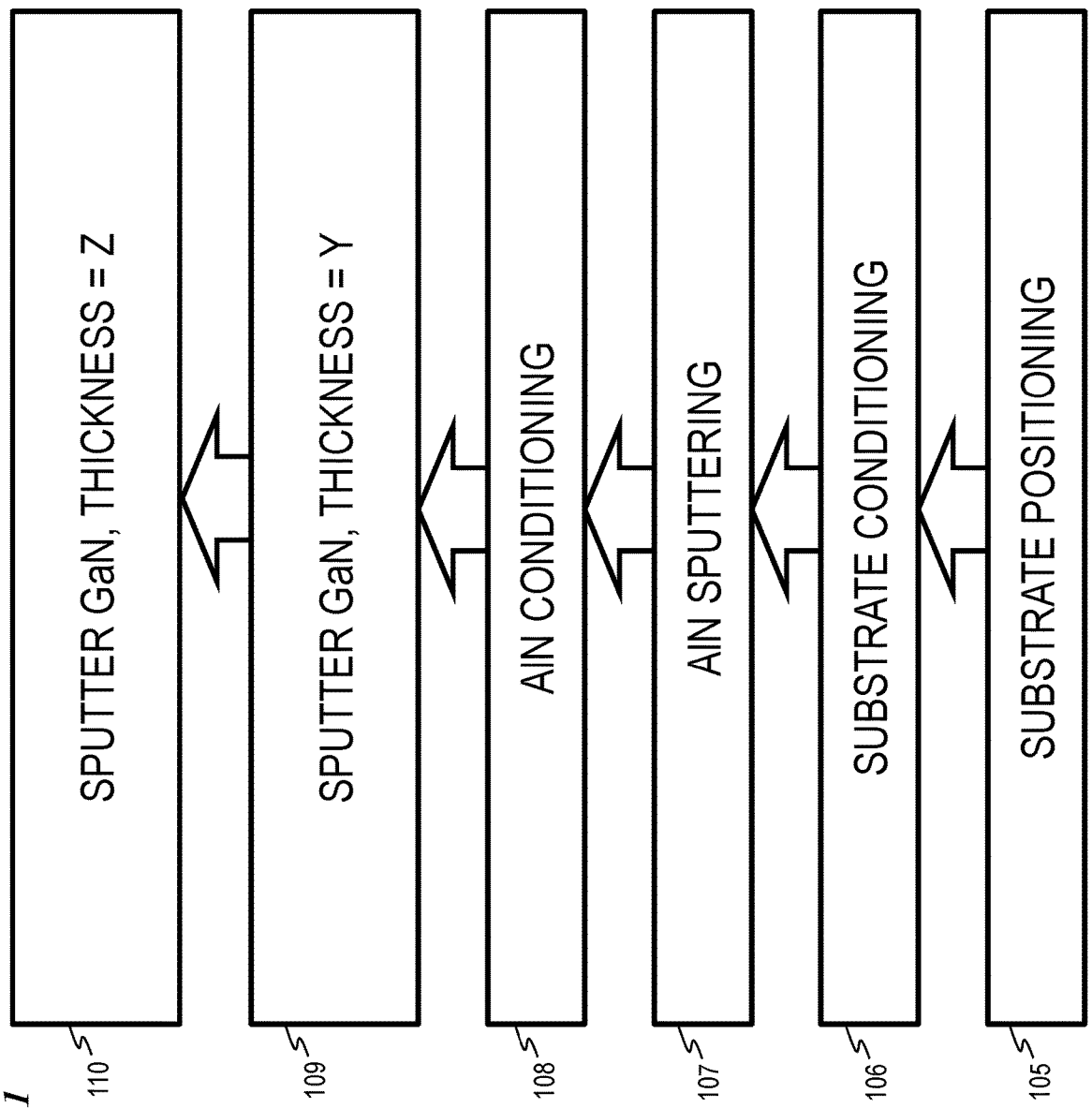
FIG. 1 is a flowchart of a method 101 for growing gallium-nitride (GaN)-based devices.

Although the following detailed description contains many specifics for the purpose of illustration, a person of ordinary skill in the art will appreciate that many variations and alterations to the following details are within the scope of the invention. Specific examples are used to illustrate particular embodiments; however, the invention described in the claims is not intended to be limited to only these examples, but rather includes the full scope of the attached claims. Accordingly, the following preferred embodiments of the invention are set forth without any loss of generality to, and without imposing limitations upon the claimed invention. Further, in the following detailed description of the preferred embodiments, reference is made to the accompanying drawings that form a part hereof, and in which are shown by way of illustration specific embodiments in which the invention may be practiced. It is understood that other embodiments may be utilized and structural changes may be made without departing from the scope of the present invention. The embodiments shown in the Figures and described here may include features that are not included in all specific embodiments. A particular embodiment may include only a subset of all of the features described, or a particular embodiment may include all of the features described.

The leading digit(s) of reference numbers appearing in the Figures generally corresponds to the Figure number in which that component is first introduced, such that the same reference number is used throughout to refer to an identical component which appears in multiple Figures. Signals and connections may be referred to by the same reference number or label, and the actual meaning will be clear from its use in the context of the description.

As used herein, the term "substrate" means a material upon which a process is conducted and substrates include silicon, sapphire, or other suitable materials.

As used herein, the term "template" means one or more layers that form a base suitable for epitaxial growth, and templates include silicon, sapphire, GaN/silicon, GaN/sapphire, GaN/Aluminum Nitride (AlN), GaN/Hafnium Nitride (HfN), GaN/Zirconium Nitride (ZrN), or any other suitable materials, structures, pattern templates, or substrates.

As used herein, physical vapor deposition ("PVD") describes deposition methods that can be used to produce thin films and coatings, and PVD includes cathode arc deposition, electron-beam PVD, evaporative deposition, pulsed-laser deposition, and sputtering.

As used herein, "sputtering" includes one or more of the following: direct current (DC) sputtering, radio frequency (RF) sputtering, reactive sputtering, and magnetron sputtering.

It is noted that many processes and methods described herein make use of numbered/lettered steps. These processes and methods can be performed in the order established by the numbers/letters, but the specification of the present invention also contemplates performing these processes and methods in any other suitable order. Moreover, the specification also contemplates performing the corresponding processes and methods with any one or more of the described steps such that a given step or steps could be optionally omitted and/or an additional step or steps could be optionally-added.

FIG. 1 is a flowchart of a method 101 for growing gallium-nitride (GaN)-based devices. In some embodiments, the method of flowchart 101 is performed within a single deposition chamber. In other embodiments, method 101 is performed in a plurality of separate deposition chambers. In some embodiments, method 101 includes any one or more of blocks 105-110 (for example, in some embodiments, blocks 106 and 108 are optional). In some embodiments, at block 105, a substrate (e.g., sapphire or silicon) is positioned for subsequent deposition. In some embodiments, at block 106, substrate conditioning is performed. In some embodiments, at block 107, aluminum nitride (AlN) is sputtered onto the substrate, where X represents the thickness of the sputtered AlN. In some embodiments, at block 108, AlN conditioning is performed (e.g., in some embodiments, oxide removal). In some embodiments, at block 109, GaN is sputtered, where Y represents the thickness of the sputtered GaN. In some such embodiments, the GaN sputtering includes doping (e.g., doping with silicon, magnesium, iron, carbon, or the like) and/or increased adatom mobility. In some embodiments, at block 110, GaN is sputtered, wherein Z represents the thickness of the sputtered GaN. In some such embodiments, the GaN sputtering includes doping (e.g., doping with silicon, magnesium, iron, carbon, or the like) and/or increased adatom mobility (sometimes referred to herein as EALS). In some embodiments, the GaN is alloyed with scandium, zirconium, hafnium, indium, aluminum, or any other suitable element.

Figure 2:
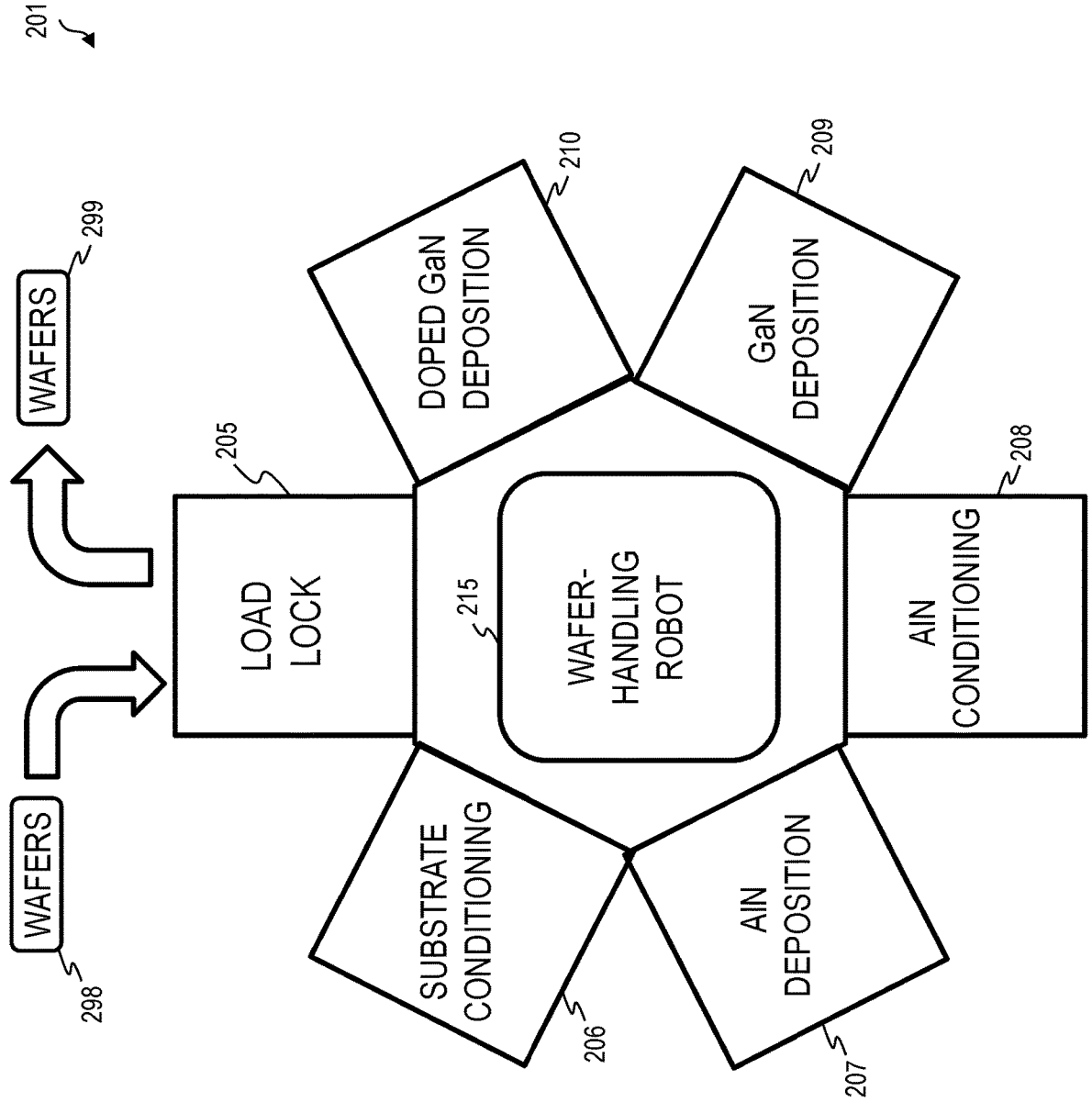
FIG. 2 is a schematic diagram of a system 201 for growing GaN-based devices.

FIG. 2 is a schematic diagram of a system 201 for growing GaN-based devices. In some embodiments, system 201 is used to perform the method of flowchart 101 shown in FIG. 1. In some embodiments, system 201 includes a load lock 205 where substrate wafers 298 are loaded into and finished wafers 299 are removed from system 201. In some embodiments, system 201 includes a substrate-conditioning module 206 (e.g., a module for performing block 106 of FIG. 1), an AlN-deposition module 207 (e.g., a module for performing block 107 of FIG. 1), an AlN-conditioning module 208 (e.g., a module for performing block 108 of FIG. 1), a GaN-deposition module 209 (e.g., a module for performing block 109 of FIG. 1), and a doping module 210 for doped GaN deposition. In some embodiments, modules 205-210 are contained within a single deposition chamber. In other embodiments, each of modules 205-210 is a deposition chamber. In some embodiments, system 201 includes a wafer-handling robot 215 for moving the wafer from module to module within system 201.

Figure 3:
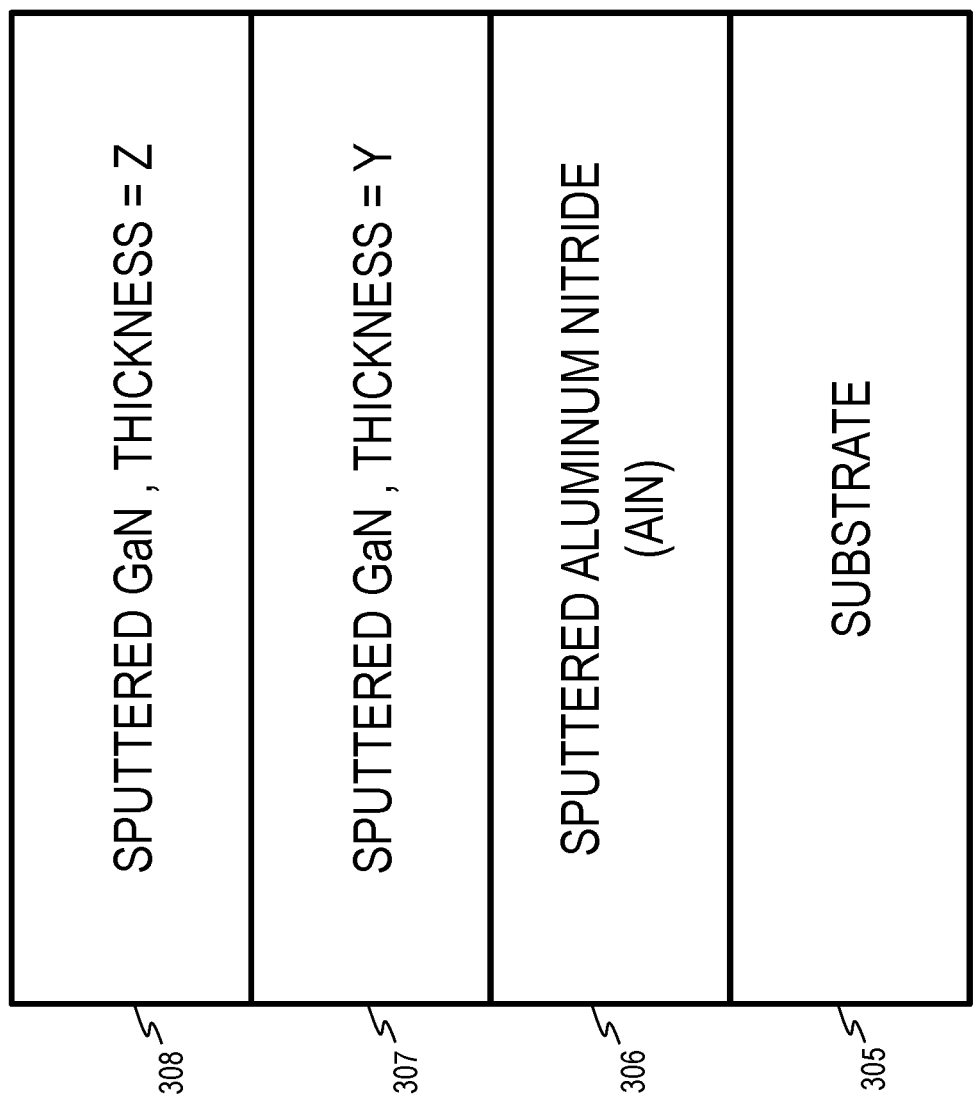
FIG. 3 is a schematic diagram of a GaN structure 301.

FIG. 3 is a schematic diagram of a GaN structure 301. In some embodiments, GaN structure 301 is produced using system 201 of FIG. 2 and/or method 101 of FIG. 1. In some embodiments, GaN structure 301 includes a substrate layer 305, a sputtered aluminum nitride (AlN) layer 306 on substrate layer 305 (in some such embodiments, the thickness of AlN layer 306=X), a sputtered GaN layer 307 on AlN layer 306 where the thickness of GaN layer 307=Y (in some such embodiments, GaN layer 307 is doped (e.g., doped with silicon, magnesium, or the like)), and a sputtered GaN layer 308 on GaN layer 307 where the thickness of GaN layer 308=Z (in some such embodiments, GaN layer 308 is doped (e.g., doped with silicon, magnesium, or the like)).

Conventional industry systems produce GaN-based devices using metal-organic chemical vapor deposition (MOCVD) for the growth of the GaN. In some embodiments, the present invention substitutes conventional MOCVD GaN processes with sputtered GaN, which allows for: lower wafer bow and thus better wafer/device uniformity due to the sputtering, lower process temperature, and less costly chemical usage of $NH_3$ and $Ga(CH_3)_3$ and the like. In some embodiments, sputtering processes are more simply employed and less costly than MBE processes due to less complex equipment requirements.

Figure 4:
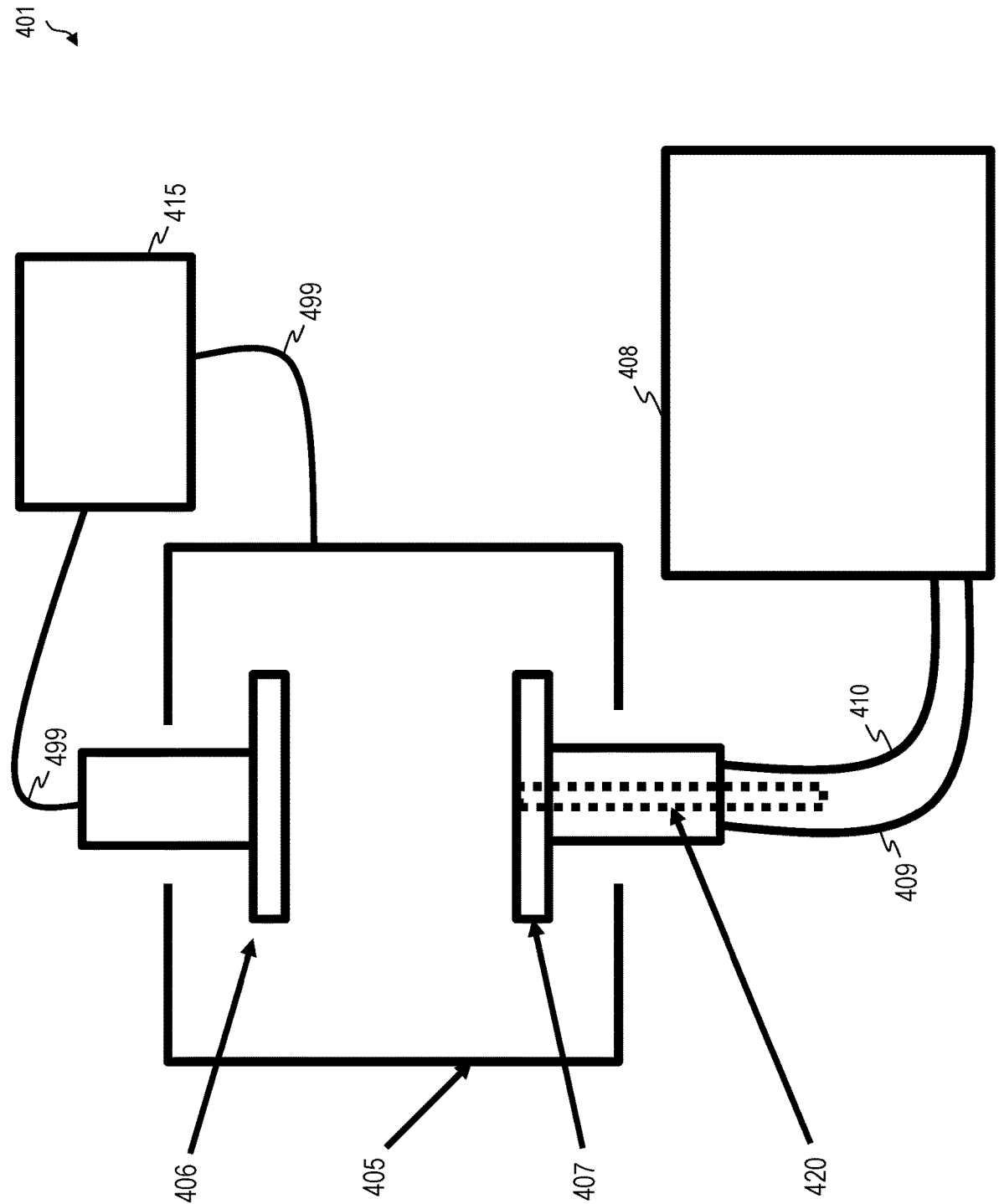
FIG. 4 is a schematic diagram of a low-temperature group IIIA-nitride sputtering system 401.

FIG. 4 is a schematic diagram of a low-temperature group IIIA-nitride sputtering system 401. In some embodiments, sputtering system 401 includes a vacuum chamber 405. In some embodiments, chamber 405 includes a wafer holder 406 and a sputtering gun 407 (e.g., in some embodiments, sputtering gun 407 is a gallium sputtering gun and includes a gallium target). In some embodiments, sputtering gun 407 includes metal gaskets and other suitable components such that it is suitable to operate in low temperatures (e.g., below zero degrees Celsius). In some embodiments, system 401 includes a cooling system 408 that cools the gallium target of sputtering gun 407 such that the gallium target is maintained in a solid state during sputtering. In some embodiments, cooling system 408 is operatively coupled to sputtering gun 407 via cold-input line 409 and heat-output line 410. In some embodiments, cooling system 408 circulates one or more heat-transfer fluids through lines 409 and 410 to maintain the gallium target in a solid state during sputtering (e.g., in some such embodiments, the heat-transfer fluid is a cryogenic fluid such as liquid nitrogen and/or liquid hydrogen (in some embodiments, liquid nitrogen and/or liquid hydrogen is used when sputtering system 401 is used with large wafer and/or wafer platter production systems), one or more alcohols, or other suitable heat-transfer fluids). In some embodiments, system 401 includes a voltage supply 415 that is connected to system 401 via wires 499. In some embodiments, voltage is increased by voltage supply 415 as wafer-size increases. In some embodiments, system 401 includes an optical path 420 for in situ closed or open process monitoring (in some such embodiments, path 420 is operatively coupled to a pyrometer and/or an optical reflectivity system that is computer corrected for emissivity).

In some embodiments, the GaN growth processes/systems described herein are complementary to epitaxial atomic layer sputtering (EALS). In some embodiments, EALS is a process that results in effectively stoichiometric epitaxial growth of a metal-nitride compound material upon a substrate using sputtering or reactive sputtering where the ratio of the metal (e.g., gallium) to active nitrogen (N) atoms arriving at the surface of the metal nitride being formed is periodically varied between metal-rich to N-rich conditions as compared to the stoichiometric composition of the metal-nitride compound. In some embodiments, this process of switching from metal-rich conditions to metal-lean conditions is accomplished by (1) reducing the metal flux to the surface of the metal nitride being formed, or (2) increasing the active nitrogen flux, or (3) increasing the temperature of the substrate (or exposing the surface of the metal nitride being formed) to increase evaporation rate (i.e., lower the residence time) of the metal adatoms, or any combination of (1)-(3). In some embodiments, the metal-rich conditions increase the mobility of adatom by reducing the effect of unsatisfied (or dangling) bonds at the surface to enhance surface migration, which results in non-columnar step growth and thus higher-quality and smoother films. In general, in some embodiments, increased surface migration of adatoms improves crystal quality of the deposited materials by assisting the adatoms to incorporate in low-energy sites on the growth front. Similarly, in some embodiments, increasing the surface temperature or applying low-energy ions can increase surface migration of adatoms to improve thin film quality. Accordingly, in some embodiments, the present invention provides EALS. In some embodiments, this process includes using a separate nitrogen plasma source (e.g., a radio frequency (RF) nitrogen source) or even ion beam-assisted deposition.

Figure 5A:
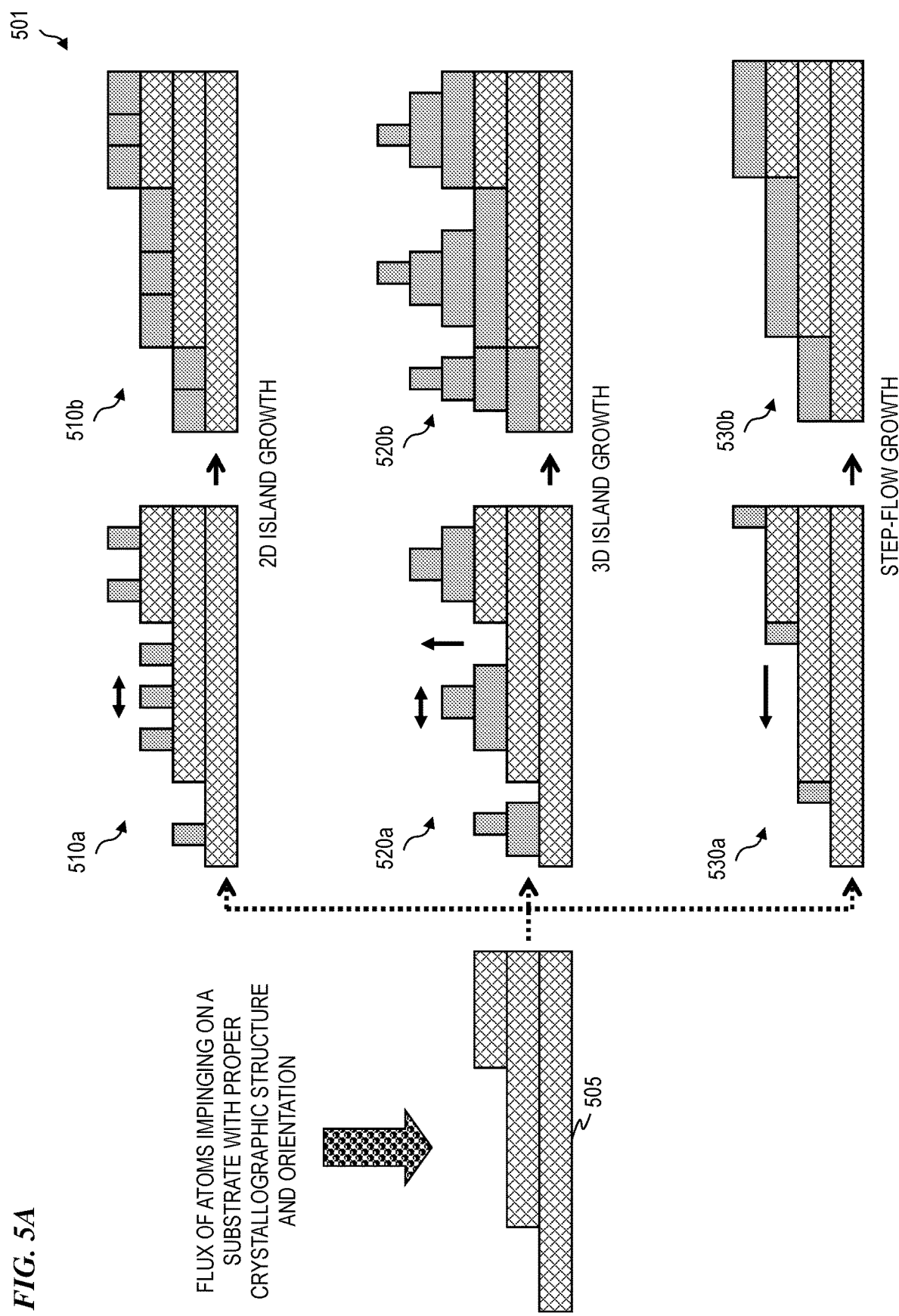
FIG. 5A include schematic diagrams of a plurality 501 of growth modes that illustrate different epitaxial growth modes according to some embodiments of the present invention.

FIG. 5A is a schematic diagram that illustrates a plurality 501 of different epitaxial growth modes according to some embodiments of the present invention. In epitaxial film growth, deposited material(s) ideally form ordered crystals with atomic arrangement and orientation that are determined by the crystallographic structure of the substrate 505. In some embodiments, depending on the surface mobility of arriving atoms and the properties of the substrate and epitaxial film, different growth modes 510, 520, and/or 530 are obtained. In some embodiments, depending on the surface mobility of the arriving atoms on the substrate surface, and other factors such as average terrace length of surface steps, crystal orientation and defect density of substrate, surface and interface energetic, lattice mismatch between film and substrate, the epitaxial growth process 1) starts and progresses in one of the above modes, 2) is a mixture of two or more modes, or 3) starts in one mode and then transitions to another mode or a mixed growth mode.

In some embodiments, growth mode 510 (represented by the progression from 510a to 510b) is referred to as two-dimensional (2D) island growth. In some embodiments, in mode 510, small islands nucleate over the surface and laterally grow to coalesce into a layer, resulting in many grain boundaries. In some embodiments, growth mode 520 (represented by the progression from 520a to 520b) is referred to as three-dimensional (3D) island growth. In some embodiments, in mode 520, small islands nucleate over the surface and grow while more islands am formed on top of earlier islands before the bottom layers are completed, resulting in increased surface roughness (in some embodiments, mode 520 includes columnar growth). In some embodiments, growth mode 530 (represented by the progression from 530a to 530b) is referred to as step-flow growth. In some embodiments, in mode 530, atoms arriving on the surface migrate and incorporate at step edges to complete layers by step flow (in some embodiments, mode 530 occurs when the surface diffusion is large compared to average terrace length).

Figure 5B:
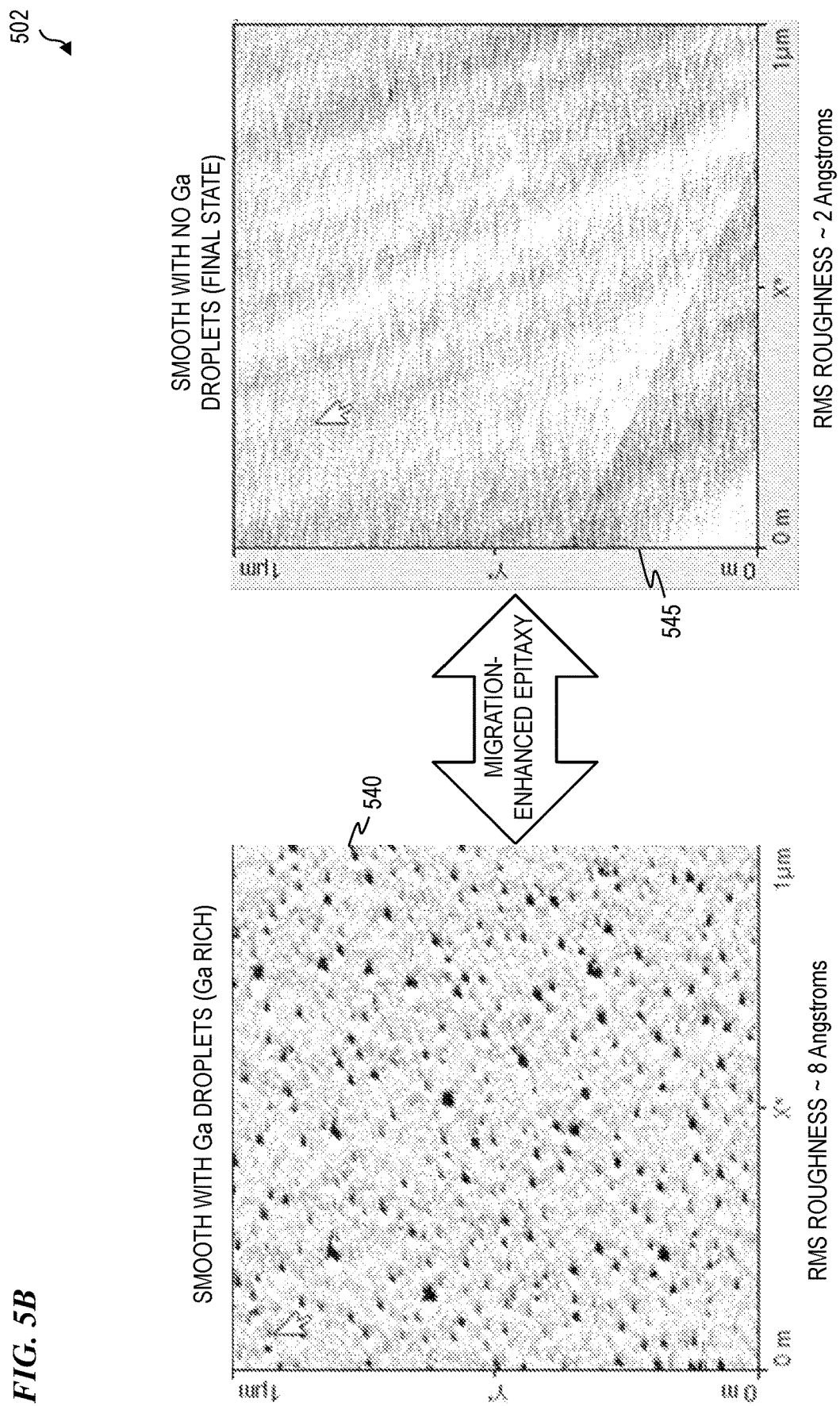
FIG. 5B is a set 502 of atomic-force microscopy (AFM) images of GaN growth.

FIG. 5B is a set 502 of atomic-force microscopy (AFM) images of GaN growth. Image 540 shows the smooth GaN with Ga droplets that occurs in some embodiments where Ga-rich growth conditions are in place. In some embodiments, epitaxial atomic layer sputtering (EALS) is implemented during the growth of the GaN such that there is a modulation between the Ga-rich growth conditions shown in image 540 and nitrogen-rich growth conditions. Image 545 shows the atomic steps of the smooth GaN with no Ga droplets that are present in the final state of the GaN film (after the modulations between the Ga-rich conditions and the nitrogen-rich conditions), prior to subsequent deposition. In some embodiments, the root-mean-squared (RMS) roughness of image 540 is about 8 Angstroms. In some embodiments, the RMS roughness of image 545 is about 2 Angstroms.

In some embodiments, the present invention generates a material that includes GaN on two-dimensional (2D) photonic crystal using one or more of the processes described herein. In some embodiments, the GaN on 2D photonic crystal includes repeating periods of air/GaN, which are located on a layer of GaN, which is (optionally) located on a layer of AlN, which is located on sapphire. In some embodiments, the GaN on 2D photonic crystal includes repeating periods of air/GaN, which are located on a layer of GaN, which is (optionally) located on a layer of AlN, which is located on HfN. In some embodiments, the GaN on 2D photonic crystal includes repeating periods of air/GaN, which are located on a layer of GaN, which is (optionally) located on a layer of AlN, which is located on ZrN. In some embodiments, the GaN on 2D photonic crystal includes repeating periods of air/GaN, which are located on a layer of GaN, which is (optionally) located on a layer of AlN, which is located on any other suitable Group IIIA nitride. In some embodiments, any of the GaN structures are replaced by HfGaN. In some embodiments, any of the GaN structures are replaced by ZrGaN.

In some embodiments, the resulting material thickness of the air is represented as: thickness of air void $(T_{air})$= (wavelength)*(1−2M)/4, where M=Integer (0, 1, 2, 3, 4, 5 . . . ).

In some embodiments, the resulting material thickness of GaN between the air and sapphire $(Al_2O_3)$ is represented as: thickness of GaN between air and $Al_2O_3(T_{GaN})$=(wavelength)*(1−2M)/(4n), where M is an integer (e.g., 0, 1, 2, 3, 4, 5 . . . ) and n is the index of refraction.

In some embodiments, the GaN on 2D photonic crystal includes effectively no carbon compared to GaN formed by MOCVD. In some embodiments, the GaN on 2D photonic crystal includes effectively no hydrogen compared to GaN formed by MOCVD.

In some embodiments, the GaN on 2D photonic crystal includes effectively larger epitaxial grains or epi-islands as compared to GaN formed by MOCVD and/or MBE. In some embodiments, the GaN on 2D photonic crystal includes epitaxial films with a substantially non-columnar structure.

In some embodiments, the GaN on 2D photonic crystal includes ultra-smooth surfaces due to improved 2D growth. In some embodiments, the GaN on 2D photonic crystal includes quantum wells that are smoother than GaN formed by conventional processes. In some embodiments, thinner GaN thickness is required for dislocation self-annihilation and/or dislocation bending, as compared to conventional methods of GaN growth. In some embodiments, low-temperature sputtered GaN on any material, template, or substrate has significantly different density of misfit dislocations than high-temperature growth of GaN. In some embodiments, the GaN on 2D photonic crystal includes point-defect density that is substantially different than GaN formed by conventional processes. In some embodiments, the GaN on 2D photonic crystal includes lower wafer bow than GaN formed by conventional methods. In some embodiments, the GaN on 2D photonic crystal includes substantially different stress levels in films, as compared to GaN formed by conventional methods. In some such embodiments, the film stress levels are detectable by Raman spectroscopy.

In some embodiments, subsequent epitaxial growth of the GaN materials of the present invention results in any suitable light emitting, light detecting, light harvesting, or transistor devices (including transistors with vertical carrier flow). In some embodiments, the GaN materials of the present invention are used with GaN-based displays (e.g., cell phones, tablets, and the like), GaN-based solar cells, GaN-based detector arrays, GaN-based very large scale integration applications, GaN coatings for windows, a GaN-based high temperature indium tin oxide (ITO) replacement, and the like. In some embodiments, wafers of the GaN materials of the present invention have a diameter that is approximately six inches or less. In some embodiments, wafers of the GaN materials of the present invention have a diameter that is larger than approximately six inches.

In some embodiments, the present invention provides a magnetron reactive sputtering system for making the GaN materials of the present invention. In some embodiments, other suitable sputtering techniques are used such as direct current (DC) or radio frequency (RF) sputtering. In some embodiments, the system for making the GaN materials of the present invention includes a nitrogen plasma source or an ion gun. In some embodiments, a gallium target in a solid state is used and EALS processes are implemented to make the GaN materials of the present invention. In some such embodiments, the solid-state gallium allows for sputter up, sputter down, or sputter sideways configurations.

In some embodiments, the present invention provides a sputter GaN growth process that uses a solid gallium source that is located in close proximity (e.g., less than about 8 inches) to the heated substrate. In some embodiments, the solid gallium source is located further away from the substrate. In some embodiments, the wafer substrate is heated to a range of 1100-1000 degrees Celsius (C), in some embodiments, a range of 1000-900 degrees C., in some embodiments, a range of 900-800 degrees C., in some embodiments, a range of 800-700 degrees C., in some embodiments, a range of 700-600 degrees C., in some embodiments, a range of 600-500 degrees C., in some embodiments, a range of 500-400 degrees C., and, in some embodiments, a range of 400 degrees C. down to room temperature.

In some embodiments, the proximity and type of sputtering gun (e.g., balanced, unbalanced, and partially balanced) allow the process to achieve desired add-atom energy due to the sputter gun's plasma interaction while minimizing damage to the GaN film. In some embodiments, the ionization brought about by the close proximity of the source and the type of sputtering gun allows for dislocation bending and/or self-annihilation.

In some embodiments, the sputtering gun used for the processes of the present invention is manufactured with all-metal gasket seals and/or the temperatures of the $N_2$ used with the sputtering gun are kept at or below the melting point of gallium so that the gallium can be made solid. In some embodiments, heat-transfer liquids such as various alcohols are used. In some embodiments, the characteristic dimension of the sputtering target is larger than 2 inches in diameter with such a cooling system.

In some embodiments, there are advantages for a gallium gun to incorporate a rotating magnet sputtering gun. In some embodiments, there are other advantages of using ringed sputtering targets and/or multiple ring sputtering targets for co-deposition of compound materials like indium gallium nitride (InGaN) and/or aluminum gallium nitride (AlGaN). In some embodiments, hafnium, zirconium, or silicon are included as sputtering targets. In some embodiments, dilute $SiH_4$ in nitrogen is supplied and the gas-delivery system contains a double-dilution system. In some embodiments, a ringed sputtering target allows for in situ reflectivity measurements. In some embodiments, radio frequency or direct current processes are both applicable. In some embodiments, when EALS is used, varying between gallium-rich and gallium-lean conditions is accomplished by varying the temperature, the pressure, the argon, the nitrogen, the gallium source power, the growth rate, or any other suitable variable.

In some embodiments, the present invention provides a magnetron sputtering epitaxial process that includes any one or more of the following steps: (1) providing any combination of substrate that includes any number and/or size wafer substrate(s) or wafer substrate cassettes that enter a load lock, (2) wherein the substrate is silicon, sapphire, GaN/sapphire, AlN/sapphire, GaN/silicon, AlN/silicon or any other suitable template such as any other Group IIIA nitride on sapphire or silicon, (3) transferring the wafer substrate to an epitaxial chamber via any suitable method or mechanism of manual or robotic transfer, (4) placing the wafer substrate into an AlN epitaxial sputtering (or other PVD), MOCVD, or MBE chamber where AlN is grown to any thickness (columnar or non-columnar) on the wafer substrate, (5) transferring the AlN/wafer substrate via any suitable method or mechanism of manual or robotic transfer, (6) placing the AlN/substrate wafer into a GaN epitaxial sputtering chamber where GaN is grown to any thickness via sputtering upon the AlN/wafer substrate (in some embodiments, during this step, the gallium is in a solid state and EALS processes are implemented, and, in some embodiments, optional silicon (Si), hafnium (Hf), and/or zirconium (Zr) doping is included in the process), (7) transferring the sputtered GaN/AlN/wafer substrate via any suitable method or mechanism of manual or robotic transfer, (8) placing the sputtered GaN/AlN/wafer substrate into a Grown-Epitaxial Metal Mirror (GEMM) sputtering chamber where GEMM growth occurs via sputtering upon the sputtered GaN/AlN/wafer substrate (in some such embodiments, the GEMM growth is performed according to the descriptions in U.S. Pat. Nos. 7,915,624, 8,253,157, and/or 8,890,183, which were introduced above and incorporated herein by reference); in some embodiments, the process repeats steps 5, 6, 7 in any order or combination as required, (9) optionally growing a layer of AlN to any suitable thickness via sputtering upon the GEMM, (10) transferring the sputtered GEMM/GaN/AlN/wafer substrate via any suitable method or mechanism of manual or robotic transfer, (11) capping the sputtered GEMM/GaN/AlN/substrate by a final layer of sputtered GaN grown to any suitable thickness via sputtering, (12) transferring the sputtered GaN/GEMM/GaN/AlN/wafer substrate via any suitable method or mechanism of manual or robotic transfer, and (13) placing the sputtered GaN/GEMM/GaN/AlN/wafer substrate into an MOCVD, MBE, or sputtering (or other PVD) system for the growth of quantum well or quantum wells (also known as the active region) and a P-type layer or P-type layers.

In some embodiments, the present invention provides an epitaxial materials growth process that includes any one or more of the following steps: (1) providing any combination of substrate that includes any number and/or size wafer substrate(s) or wafer substrate cassettes that enter a load lock, (2) wherein the substrate is silicon, sapphire, GaN/sapphire, AlN/sapphire, GaN/silicon, AlN/silicon or any other suitable template such as any other Group IIIA nitride on sapphire or silicon, (3) transferring the wafer substrate to an epitaxial chamber via any suitable method or mechanism of manual or robotic transfer, (4) placing the wafer substrate into an AlN epitaxial sputtering (or other PVD), MOCVD, or MBE chamber where AlN is grown to any thickness (columnar or non-columnar) on the wafer substrate, (5) transferring the AlN/wafer substrate via any suitable method or mechanism of manual or robotic transfer, (6) placing the AlN/substrate wafer into a Grown-Epitaxial Metal Mirror (GEMM) sputter chamber where GEMM growth occurs via sputtering upon the AlN/wafer substrate (in some such embodiments, the GEMM growth is performed according to the descriptions in U.S. Pat. Nos. 7,915,624, 8,253,157, and/or 8,890,183, which were introduced above and incorporated herein by reference); in some embodiments, the process repeats steps 1-6 in any order or combination as required, (7) growing a layer of AlN to any suitable thickness via sputtering upon the GEMM, (8) transferring the sputtered GEMM/AlN/wafer substrate via any suitable method or mechanism of manual or robotic transfer, (9) capping the sputtered GEMM/AlN/wafer substrate by a final layer of sputtered GaN grown to any suitable thickness via sputtering upon the GEMM/AlN/wafer substrate (in some such embodiments, the gallium is in a solid state and EALS processes are implemented, and, in some embodiments, Si, Hf, Zr doping occurs), (10) transferring the sputtered GaN/GEMM/AlN/wafer substrate via any suitable method or mechanism of manual or robotic transfer, and (11) placing the sputtered GaN/GEMM/AlN/wafer substrate into an MOCVD, MBE, or sputtering (or other PVD) system for the growth of quantum well or quantum wells (also known as the active region) and a P-type layer or P-type layers.

In some embodiments, the present invention provides an epitaxial materials growth process that includes any one or more of the following steps: (1) providing any combination of substrate that includes any number and/or size wafer substrate(s) or wafer substrate cassettes that enter a load lock, (2) wherein the substrate is silicon, sapphire, GaN/sapphire, AlN/sapphire, GaN/silicon, AlN/silicon or any other suitable template such as any other Group IRA nitride on sapphire or silicon, (3) transferring the wafer substrate to an epitaxial chamber via any suitable method or mechanism of manual or robotic transfer, (4) placing the wafer substrate into a Grown-Epitaxial Metal Mirror (GEMM) sputtering chamber where GEMM growth occurs via sputtering upon the wafer substrate (in some such embodiments, the GEMM growth is performed according to the descriptions in U.S. Pat. Nos. 7,915,624, 8,253,157, and/or 8,890,183, which were introduced above and incorporated herein by reference), (5) transferring the GEMM/wafer substrate to an epitaxial chamber via any suitable method or mechanism of manual or robotic transfer, (6) placing the GEMM/wafer substrate into an AlN epitaxial sputtering chamber where AlN is grown to any suitable thickness (columnar or non-columnar); in some embodiments, the process repeats steps 4 and 5 as required, (7) optionally growing a layer of AlN to any suitable thickness via sputtering upon the GEMM, (8) transferring the sputtered GEMM/ALN/GEMM wafer substrate via any suitable method or mechanism of manual or robotic transfer, (9) capping the sputtered GEMM/ALN/GEMM/wafer substrate by a final layer of sputtered GaN grown to any suitable thickness via sputtering upon the GEMM/ALN/GEMM/wafer substrate (in some such embodiments, the gallium target used during the sputtering is in a solid state and EALS processes are implemented, and, in some embodiments, Si, Hf, Zr doping occurs), (10) transferring the sputtered GaN/GEMM/ALN/GEMM/wafer substrate via any suitable method or mechanism of manual or robotic transfer, and (11) placing the sputtered GaN/GEMM/ALN/GEMM/wafer substrate into an MOCVD, MBE, or sputtering (or other PVD) system for the growth of quantum well or quantum wells (also known as the active region) and a P-type layer or P-type layers.

In some embodiments, the present invention provides an epitaxial materials growth process that includes any one or more of the following steps: (1) providing any combination of substrate that includes any number and/or size wafer substrate(s) or wafer substrate cassettes that enter a load lock, (2) wherein the substrate is silicon, sapphire, GaN/sapphire, AlN/sapphire, GaN/silicon, AlN/silicon or any other suitable template such as any other Group IIIA nitride on sapphire or silicon, (3) transferring the wafer substrate to a sputtering epitaxial chamber via any suitable method or mechanism of manual or robotic transfer, (4) growing any Group IIIA nitride material to any suitable thickness (columnar or non-columnar) on the wafer substrate, (5) transferring the Group IIIA nitride/wafer substrate via any suitable method or mechanism of manual or robotic transfer, (6) placing the Group IIIA nitride/wafer substrate into a GEMM sputtering chamber where GEMM growth occurs via sputtering upon the Group IIIA nitride/wafer substrate (in some such embodiments, the GEMM growth is performed according to the descriptions in U.S. Pat. Nos. 7,915,624, 8,253,157, and/or 8,890,183, which were introduced above and incorporated herein by reference); in some embodiments, the process repeats in any order or combination as required, (7) optionally growing a layer of AlN or any other Group IIIA nitride to any suitable thickness via sputtering upon the GEMM, (8) transferring the sputtered GEMM/Group IIIA nitride/wafer substrate via any suitable method or mechanism of manual or robotic transfer, (9) capping the sputtered GEMM/Group IIIA nitride/wafer substrate by a final layer of sputtered GaN grown to any suitable thickness via sputtering upon the GEMM/Group IIIA nitride/wafer substrate (in some such embodiments, the gallium is in a frozen/solid state and EALS processes are implemented, and, in some embodiments, Si, Hf, Zr doping is implemented), (10) transferring the sputtered GaN/GEMM/Group IIIA nitride/wafer substrate via any suitable method or mechanism of manual or robotic transfer, and (11) placing the sputtered GaN/GEMM/Group IIIA nitride/wafer substrate into a MOCVD, MBE, or sputtering (or other PVD) system for the growth of quantum well or quantum wells (also known as the active region) and a P-type layer or P-type layers.

In some embodiments, the Group IA nitride is replaced by any other Group IIIA nitride, or any combination of Group IIIA nitride layers and/or compounds. In addition, in some embodiments, these materials include silicon (Si), Hf, Zr, and/or magnesium (Mg). In some embodiments, a wafer(s) and/or substrate(s) is inserted, moved or otherwise directly transferred via any suitable method or mechanism (manual or robotic) within or between any combination and/or any number of materials-specific or process-specific epitaxial sputtering (or other PVD), MOCVD, or MBE chambers or equipment. In some embodiments, the processes of the present invention occur in materials-specific sputtering (or other PVD), MOCVD, or MBE epitaxial chamber(s) and/or with any combination of optional wafer transfer(s) within and between materials-specific sputtering (or other PVD), MOCVD or MBE chamber(s). In some embodiments, the processes of the present invention occur in a materials-specific sputtering (or other PVD), MOCVD or MBE epitaxial chamber(s) with no wafer transfer(s).

Growing gallium nitride (GaN) films by conventional sputtering techniques is typically considered not useful due to the film quality being poor (e.g., GaN films grown by conventional sputtering techniques generally have a characteristic X-ray diffraction (XRD) rocking curve full width at half maximum value of 620 arcseconds and/or greater). Since these sputtered epitaxial grown films are considered lower quality than what can be produced by MOCVD or MBE methods, conventional sputtered epitaxial growth techniques have not been designed with intentional doping.

In some embodiments, the present invention provides N-type doping GaN with a background electron concentration of about $5 \times 10^{16}/cm^3$ (also known unintentionally doped) that is intentionally doped with a doping element such as silicon (or titanium (Ti), zirconium (Zr), hafnium (Hf), oxygen (O), sulfur (S), selenium (Se) and/or tellurium (Te)) to achieve an electron concentration of greater than $5 \times 10^{16}/cm^3$ such as $1 \times 10^{18}/cm^3$ to $5 \times 10^{20}/cm^3$ or higher. In some embodiments, these intentionally doped materials' electron concentrations are used for making ohmic contacts and used as a conductive material.

In some embodiments, the present invention provides a method for growing high quality GaN by sputtering with optional n-type doping that includes any one or more of the following: (1) out-gassing the wafer, chamber and wafer holder, (2) GaN nucleation, wherein the GaN nucleation includes (a) setting the temperature to allow sufficient adatom energy so that adatoms are able to find an energetically favorable place in the surface of the template to create initial epitaxial growth, (b) setting the chamber vacuum pressure to allow the formation of a plasma, (c) supplying plasma gas to the chamber, (d) supplying nitrogen gas to the chamber, and (e) providing power to the gun of solid gallium (Ga) target to provide gallium and to allow sufficient adatom energy so that adatoms are able to find an energetically favorable place in the surface of the template to create initial epitaxial growth, wherein the method further includes (3) once nucleation is reached with minimal thickness, shutting off the plasma gas source, (4) growing GaN with appropriate temperatures and gas flows and Ga gun target power to allow for best GaN growth upon GaN layers, wherein the GaN sputtering includes doping, and the doping includes (a) co-sputtering of dopant, (b) thermal evaporation of dopant, (c) e-beam evaporation of dopant, (d) Ga mixture with dopant in sputtering gun, (e) gas injection of dopant reactant including examples of dilute $SiH_4$, $Si_2H_6$, tetraethylsilane, and/or other reactants holding dopant (Si) in a carrier gas ($H_2$, $N_2$, Ar, Xe, He, Kr, Rn, and the like), and (f) ion implantation doping of silicon, wherein the method further includes (5) ramping temperature to high enough temperature to remove any potential gallium droplets and letting sit until the gallium droplets are gone, and (6) turning off any of the above-mentioned variables as needed to remove the wafer.

The GaN industry is concerned with both the X-ray diffraction (XRD) 002 (symmetric) and 102 (asymmetric) peak full-width half-maximum (FWHM) values of Omega rocking curves for determination of quality for their resulting devices. In some embodiments, the present invention provides a sputtering GaN process that enables both 002 and 102 peak FWHM values to be under 1000 arcseconds, and in some embodiments, below 600 arcseconds, and in some embodiments, below 300 arcseconds, and in some embodiments, below 200 arcseconds, and in some embodiments, below 100 arcseconds. In some embodiments of the invention, the 002 peak FWHM is below 500 arcseconds and the 102 peak FWHM is below 1000 arcseconds.

In some embodiments of the invention, the 002 peak FWHM is below 400 arcseconds and the 102 peak FWHM is below 800 arcseconds. In some embodiments, the 002 peak FWHM is below 300 arcseconds and the 102 peak FWHM is below 600 arcseconds. In some embodiments, the 002 peak FWHM is below 300 arcseconds and the 102 peak FWHM is below 500 arcseconds. In some embodiments, the 002 peak FWHM is below 300 arcseconds and the 102 peak FWHM is below 400 arcseconds. In some embodiments, the 002 peak FWHM is below 250 arcseconds and the 102 peak FWHM is below 350 arcseconds.

In some embodiments, the present invention provides a method that includes growing gallium nitride (GaN) via physical vapor deposition (PVD) (e.g., via sputtering) such that the grown GaN has an Omega rocking curve full-width half-maximum (FWHM) X-ray diffraction measurement for both 002 and 102 peaks that is less than 1000 arcseconds.

In some embodiments, the present invention provides: (1) co-sputtering any of Si, Ti, Zr, Hf, O, S, Se and/or Te while growing GaN via sputtering, (2) thermal evaporation of Si, Ti, Zr, Hf, O, S, Se and/or Te while growing GaN via sputtering, (3) e-beam evaporation is of Si, Ti, Zr, Hf, O, S, Se and/or Te while growing GaN via sputtering, (4) Ga mixture with Si, Ti, Zr, Hf, O, S, Se and/or Te to grow n-type GaN, (5) gas injection of dilute $SiH_4$, $GeH_4$, $Si_2H_6$, tetraethylsilane, and/or other reactants holding the already mentioned elements in carrier gas ($H_2$, $N_2$, Ar, Xe, He, Kr, Rn . . . ) while growing GaN via sputtering, and (6) ion implantation doping of Si, Ti, Zr, Hf, O, S, Se and/or Te while growing GaN via sputtering. In some embodiments, the present invention further includes (7) other group IV element doping (e.g., in some embodiments, Ge or Sn), (8) co-doping any combination of the above elements, (9) Surfactant (e.g., In) enhanced n-doping, (10) modulated doping to create special doping profile or internal electric fields, and/or (11) delta doping any of the above-mentioned elements. In some embodiments, the present invention includes applications of surfactants for modifying or enhancing growth.

In some embodiments, the GaN grown using the methods described herein has an Omega rocking curve full-width half-maximum (FWHM) X-ray diffraction measurement (for the 002 peak and/or the 102 peak) of 0-5 arcseconds; in some embodiments, a FWHM of 5-10 arcseconds; in some embodiments, a FWHM of 10-15 arcseconds; in some embodiments, a FWHM of 15-20 arcseconds; in some embodiments, a FWHM of 20-25 arcseconds; in some embodiments, a FWHM of 25-30 arcseconds; in some embodiments, a FWHM of 30-40 arcseconds; in some embodiments, a FWHM of 40-50 arcseconds; in some embodiments, a FWHM of 50-100 arcseconds; in some embodiments, a FWHM of 100-150 arcseconds; in some embodiments, a FWHM of 150-200 arcseconds; in some embodiments, a FWHM of 200-250 arcseconds; in some embodiments, a FWHM of 250-300 arcseconds; in some embodiments, a FWHM of 300-400 arcseconds; in some embodiments, a FWHM of 400-500 arcseconds; in some embodiments, a FWHM of 500-600 arcseconds; in some embodiments, a FWHM less than 620 arcseconds; in some embodiments, a FWHM of less than 600 arcseconds; in some embodiments, a FWHM of less than 500 arcseconds; in some embodiments, a FWHM of less than 400 arcseconds; in some embodiments, a FWHM of less than 300 arcseconds; in some embodiments, a FWHM of less than 240 arcseconds; in some embodiments, a FWHM of less than 200 arcseconds; in some embodiments, a FWHM of less than 100 arcseconds; in some embodiments, a FWHM of less than 50 arcseconds; in some embodiments, a FWHM of less than 40 arcseconds; in some embodiments, a FWHM of less than 30 arcseconds; in some embodiments, a FWHM of less than 27 arcseconds; in some embodiments, a FWHM of less than 25 arcseconds; in some embodiments, a FWHM of less than 20 arcseconds; in some embodiments, a FWHM of less than 10 arcseconds, and in some embodiments, a FWHM of less than 5 arcseconds.

In some embodiments, the present invention provides a method that includes growing gallium nitride (GaN) via physical vapor deposition (PVD) (e.g., via sputtering) such that the grown GaN has an Omega rocking curve full-width half-maximum (FWHM) X-ray diffraction measurement of less than 620 arcseconds. In some embodiments, the grown GaN has an Omega rocking curve full-width half-maximum (FWHM) X-ray diffraction measurement of less than 1000 arcseconds. In some embodiments, the method further includes during the PVD of the GaN, doping the GaN by co-sputtering at least one dopant selected from the group consisting of: silicon (Si), titanium (Ti), zirconium (Zr), hafnium (Hf), oxygen (O), sulfur (S), selenium (Se), and tellurium (Te). In some embodiments, the method further includes during the PVD of the GaN, doping the GaN by thermally evaporating at least one selected from the group consisting of: Si, Ti, Zr, Hf, O, S, Se, and Te. In some embodiments, the method further includes during the PVD of the GaN, doping the GaN by e-beam evaporating at least one selected from the group consisting of: Si, Ti, Zr, Hf, O, S, Se, and Te.

In some embodiments of the method, the growing of the GaN includes doping the GaN to form an n-type GaN using a mixture of Ga and at least one selected from the group consisting of: Si, Ti, Zr, Hf, O, S, Se, and Te. In some embodiments, the method further includes during the PVD of the GaN, doping the GaN by: gas injecting at least one selected from the group consisting of dilute: $SiH_4$, $GeH_4$, $Si_2H_6$, tetraethylsilane, and/or other reactants; and holding in a carrier gas ($H_2$, $N_2$, Ar, Xe, He, Kr, Rn, or the like) and gas injecting at least one selected from the group consisting of: Si, Ti, Zr, Hf, O, S, Se, and Te. In some embodiments, the method further includes during the PVD of the GaN, doping the GaN by ion-implantation doping at least one selected from the group consisting of: Si, Ti, Zr, Hf, O, S, Se, and Te.

In some embodiments of the method, the doping of the GaN uses at least one dopant selected from the group consisting of germanium (Ge) and tin (Sn) instead of, or in addition to, the previously recited elements. In some embodiments, the doping of the GaN includes surfactant-enhanced (e.g., In) n-doping. In some embodiments, the doping of the GaN includes modulated doping to create a special doping profile or internal electric field. In some embodiments, the doping of the GaN includes delta doping any of the previously recited elements.

In some embodiments, the present invention provides a method that includes growing gallium nitride (GaN) via physical vapor deposition (PVD) (e.g., in some embodiments, via sputtering) such that the grown GaN has an Omega rocking curve full-width half-maximum (FWHM) X-ray diffraction measurement (in the 002 plane and/or the 102 plane) of less than 25 arcseconds.

In some embodiments, the present invention provides a method that includes growing gallium nitride (GaN) via physical vapor deposition (PVD) (e.g., in some embodiments, via sputtering) such that the grown GaN has an Omega rocking curve full-width half-maximum (FWHM) X-ray diffraction measurement for both 002 and 102 peaks that is less than 1000 arcseconds.

In some embodiments, the present invention provides a method that includes sputtering epitaxial GaN; and intentional n-type doping during the sputtering. In some embodiments of the method, the doping includes co-sputtering silicon (Si). In some embodiments, the doping includes thermal evaporation of Si. In some embodiments, the doping includes e-beam evaporation of Si. In some embodiments, the sputtering includes using a target material that includes a mixture of Ga and Si. In some embodiments, the doping includes gas injecting $SiH_4$, $Si_2H_6$, tetraethylsilane, and/or other reactants (in some embodiments, in dilute portions) with a carrier gas (e.g., $H_2$, $N_2$, Ar, Xe, He, Kr, Rn, and the like) holding Si.

In some embodiments, the doping includes ion-implantation doping of Si. In some embodiments, the doping includes sputtering at least one selected from the group consisting of silicon (Si), titanium (Ti), zirconium (Zr), hafnium (Hf), oxygen (O), sulfur (S), selenium (Se), and tellurium (Te). In some embodiments, the doping includes thermal evaporation of at least one selected from the group consisting of Si, Ti, Zr, Hf, O, S, Se, and Te. In some embodiments, the doping includes e-beam evaporation of at least one selected from the group consisting of Si, Ti, Zr, Hf, O, S, Se, and Te. In some embodiments, the sputtering includes using a target material that includes a mixture of Ga and at least one selected from the group consisting of Si, Ti, Zr, Hf, O, S, Se, and Te. In some embodiments, the doping includes gas injecting $SiH_4$, $Si_2H_6$, tetraethylsilane, and/or other reactants with a carrier gas (e.g., $H_2$, $N_2$, Ar, Xe, He, Kr, Rn, and the like) holding at least one selected from the group consisting of Si, Ti, Zr, Hf, O, S, Se, and Te.

In some embodiments, the doping includes ion-implantation doping of at least one dopant selected from the group consisting of Si, Ti, Zr, Hf, O, S, Se, and Te. In some embodiments, the doping includes modulated doping using at least one dopant selected from the group consisting of Si, Ti, Zr, Hf, O, S, Se, and Te to create a special doping profile or internal electric fields. In some embodiments, the doping includes delta doping at least one dopant selected from the group consisting of Si, Ti, Zr, Hf, O, S, Se, and Te. In some embodiments, the doping includes co-doping at least one dopant selected from the group consisting of Si, Ti, Zr, Hf, O, S, Se, and Te. In some embodiments, the doping includes surfactant (e.g., In) enhanced n-doping. In some embodiments, the method further includes other group IV element doping (e.g., in some embodiments, Ge or Sn) instead of, or in addition to, the elements recited above.

FIG. 6A is a table 601 of thicknesses (in nanometers) for the AlN and GaN layers set forth in GaN structure 301 of FIG. 3. In some embodiments, each row of table 601 refers to a range of thicknesses for the AlN layer (e.g., layer 306 of FIG. 3) and a corresponding range of thicknesses for at least one of the GaN layers (e.g., layer 307 and/or layer 308 of FIG. 3). In some embodiments, thickness of the AlN layer is in a range of approximately one monolayer to 210 nanometers (nm), and the thickness of the GaN layer(s) is in a range of approximately 10 to 20,000 nm.

FIG. 6B is a continuation of table 601.

FIG. 7A is a table 701 showing the Omega rocking curve full-width half-maximum (FWHM) X-ray diffraction (XRD) values (in arcseconds) for GaN produced according to some embodiments of the present invention. Table 701 includes rocking curve values for both the 002 (symmetric) and 102 (asymmetric) peaks. In some embodiments, the rocking curve values generally decrease with decreasing AlN thickness. In some embodiments, the smaller rocking curve values are generally more favorable.

FIG. 7B is a continuation of table 701. In some embodiments, the FWHM value for the GaN 002 peak is in a range of approximately 14.4 to 619 arcseconds, and the FWHM value for the GaN 102 peak is in a range of approximately 0 to 2515 arcseconds. In some embodiments, the present invention provides a combination of 002 peak values below 250 arcseconds and 102 peak values below 550 arcseconds with the AlN thicknesses presented in table 1201 and sputtering processes (see table 1301 for some FWHM embodiments provided by the present invention; each row in table 1301 refers to a range of FWHM values for the GaN 002 and 102 peaks).

In some embodiments, the present invention provides a method for producing a gallium nitride (GaN)-based device that includes providing a substrate; sputtering aluminum nitride (AlN) onto the substrate; and sputtering at least a first layer of GaN onto the AlN such that the first layer of GaN has an Omega rocking curve full-width half-maximum (FWHM) X-ray diffraction (XRD) measurement for a 002 peak that is less than 250 arcseconds and a FWHM XRD measurement for a 102 peak that is less than 550 arcseconds.

In some embodiments of the method, the first layer of GaN has a thickness in a range of approximately 10 to 20000 nanometers (nm), and wherein the AlN has a thickness in a range of approximately 5 to 210 nm.

In some embodiments, the present invention provides a gallium-nitride (GaN)-based device that includes a substrate; a first layer of aluminum nitride (AlN) on the substrate; and at least a second layer of GaN on the first layer of AlN, wherein the second layer of GaN has an Omega rocking curve full-width half-maximum (FWHM) X-ray diffraction (XRD) measurement for a 002 peak that is less than 250 arcseconds and a FWHM XRD measurement for a 102 peak that is less than 550 arcseconds.

In some embodiments of the apparatus, the first layer of GaN has a thickness in a range of approximately 10 to 20000 nanometers (nm), wherein the AlN has a thickness in a range of approximately one monolayer to 210 nm.

In some embodiments, the present invention provides a method for growing gallium-polar (Ga-polar) gallium nitride (GaN) on sapphire (in-some such embodiments, the sapphire is substantially a c-plane-oriented sapphire; in some embodiments, a substantially r-plane-oriented sapphire; in some embodiments, a substantially m-plane-oriented sapphire; in some embodiments, a substantially a-plane-oriented sapphire). In some embodiments, the method includes any one or more of the following: (1) substrate preparation (in some embodiments, step 1 is optional), wherein the substrate preparation includes (a) chemical cleaning (epi-ready, and/or degrease, and/or chemical etch), and (b) vacuum outgassing with lower pressures and higher temperatures than atmosphere (e.g., in some embodiments, vacuum below $1e^{-6}$ Torrs, substrate temperature of 800 to 900 degrees C.); (2) surface nitridation, wherein the surface nitridation includes (a) providing $N_2$ radio frequency (RF) plasma with an RF power, an $N_2$ flow rate, and at a substrate temperature for a duration of time (e.g., in some embodiments, RF power: 300-500 watts (W), $N_2$ flow: 2-9 standard cubic centimeters per minute (SCCM), substrate temperature: 300 to 900 degrees C., duration: 10 to 60 minutes), and (b) optionally monitoring reflection high-energy electron diffraction (RHEED) during nitridation; (3) forming an AlN buffer (in some embodiments, step 3 is optional), wherein the forming of the AlN buffer includes (a) depositing a layer of AlN (e.g., in some embodiments, 5 nanometers (nm) to 50 nm of AlN (or AlGaN)) with an RF power on the magnetron gun, a nitrogen flow, an elevated substrate temperature, and an Al/N flux ratio (for example, in some embodiments, RF power: 300-800 W, $N_2$ flow: 2 to 5 SCCM, substrate temperature: 700 to 850 C, and Al/N flux slightly greater than 1:1), (b) in some embodiments, depositing Al for 5 seconds, then providing 10 seconds of RF active nitrogen plasma (once or more), then depositing AlN for 1 minute followed by 30 seconds of annealing (once or more), then a last $N_2$ anneal (just enough to use extra Al on surface), (c) optionally monitoring RHEED pattern change from sapphire to diffused AlN to streaky AlN, and (d) optionally using optical reflectometry to monitor extra metal anneal times. In some embodiments, if the template is AlN as described in steps (1) through (3) above, then gallium is deposited and subsequently evaporated to remove any oxygen from the AlN surface. In some embodiments, the method further includes: (4) GaN nucleation, wherein the GaN nucleation includes (a) providing 10 to 100 nm of high temperature, N-rich GaN (for example in some embodiments, RF power: 300-500 W, $N_2$ flow: 2 to 5 SCCM, substrate temperature: 700 to 850 C, Ga/N flux ratio less than 1:1), (b) optionally monitoring RHEED pattern from streaky to extended chevron (two-dimensional (2D) to three-dimensional (3D) diffraction), (c) optionally monitoring reflectometry intensity corresponding to intentional surface roughening; (5) forming a GaN smoothing layer, wherein the forming of the GaN smoothing layer includes (a) providing 100 to 500 nm of high temperature, Ga-rich GaN (for example, in some embodiments, RF power: 300-500 W, $N_2$ flow: 2 to 5 SCCM, substrate temperature: 700 to 850 C, Ga/N flux ratio greater than 1:1), (b) desorbing extra Ga under $N_2$ (RF plasma off) at an elevated substrate temperature (for example, in some embodiments, 700 to 800 C), (c) optionally monitoring RHEED pattern from extended chevron to streaky (3D to 2D diffraction); (6) forming a thick GaN defect-reduction layer, wherein the forming of the GaN defect-reduction layer includes (a) providing 1 to 5 μm of slightly Ga-rich GaN (for example, in some embodiments, RF power: 300-500 W, $N_2$ flow: 2 to 5 SCCM, substrate temperature: 400 to 800 C, Ga/N flux ratio approximately greater than 1:1, growth rate greater than 0.1 μm/hour), (b) every approximately 15 to 30 minutes, desorbing extra Ga under $N_2$ (RF plasma off) at an elevated substrate temperature (for example, in some embodiments, 700 to 800 C), (c) optionally monitoring RHEED pattern showing sharper streaks with increasing GaN thickness, (d) optionally using optical reflectometry to monitor growth rate, changes in growth mode, and extra Ga anneal times, (e) optionally using a defect-reduction technique such as epitaxial atomic layer sputtering (EALS), plasma-enhanced epitaxy, glancing angle ion-assisted growth, thin AlN inter-layers and AlN/GaN short period superlattice, or any other suitable defect reduction technique, (f) optionally using a doping method such as described above (for example, in some embodiments, dilute concentration of $SiH_4$ in nitrogen is injected into the chamber).

In some embodiments, the present invention provides Group HA-nitride AlN/GaN and AlN/AlGaN superlattice (SL) structures used for threading dislocation (TD) density reduction (i.e., TD filtering) and/or for strain control and engineering in GaN and AlGaN layers and structures grown on sapphire and silicon substrates. In some such embodiments, the sputtering techniques described herein (including, in some embodiments, epitaxial atomic layer sputtering (EALS)) are used to form the high-quality TD filtering and strain-control structures at much lower growth temperatures than conventional methods. In some embodiments, the Group IIIA-nitride SL structures include 50-100 periods of 3 nm-5 nm AlN and 10 nm-30 nm GaN or AlGaN grown under conditions that promote smooth interfaces. In some embodiments, the present invention provides SL structures that include periodic lattice-matched III-nitride/metal-nitride layers, such as GaN/HfN and GaN/ZrN SLs (in some such embodiments, the SL structures additionally have a high out-of-plane electrical conductivity compared to AlN/GaN SLs because of very high resistivity of AlN).

In some embodiments, the present invention provides a method for producing a gallium nitride (GaN)-based device that includes providing a substrate template that includes aluminum nitride; depositing one or more gallium nitride (GaN) nucleation layers on the substrate template; depositing a GaN smoothing layer onto the one or more GaN nucleation layers; and depositing a thick GaN defect-reduction layer onto the GaN smoothing layer.

In some embodiments, sputter epitaxy provides a plurality of benefits including (1) no metal organic precursors, (2) lower process temperatures (as compared to conventional epitaxy techniques), (3) larger wafers, and (4) superior thermal budget, which enables integration.

In some embodiments, the present invention provides a system and method that includes: PVD (e.g., in some embodiments, sputtering) of an AlN Nucleation Layer (in some embodiments, 5 minutes of PVD can replace up to about 1.5 hours of MOCVD), PVD of a GaN:Hf template (in some embodiments, about 500 nm of GaN:Hf can replace up to about 5 μm of MOCVD GaN since the conductivity of GaN:Hf is so high), PVD of a HfN/GaN:Hf distributed Bragg reflector (DBR) template (in some embodiments, the PVD of the HfN/GaN:Hf DBR template enables optical microcavity devices that are lattice-matched to GaN, and have 99.99% reflectivity and high conductivity).

FIG. 8A is a schematic diagram of a template and device epitaxy system 801 for electronics and solid-state lighting (SSL). In some embodiments, system 801 performs processing on a bare wafer 850 in order to produce a metal-mirror device 860. In some embodiments, system 801 includes a plurality of modules 805-810 (in some such embodiments, each one of the plurality of modules 805-810 is a separate deposition chamber; in other embodiments, the plurality of modules 805-810 is contained within a single deposition chamber). In some embodiments, system 801 includes an aluminum nitride (AlN)-nucleation module 805 configured to generate a nucleation layer of AlN (in some such embodiments, the AlN nucleation layer has a thickness of approximately 25 nanometers (nm)) using one or more of the PVD processes described herein. In some embodiments, system 801 further includes a grown-epitaxial metal mirror (GEMM) module 806 configured to generate one or more GEMM layers (in some such embodiments, the GEMM layer(s) is generated according to the descriptions in U.S. Pat. Nos. 7,915,624, 8,253,157, and/or 8,890,183, which were introduced above and incorporated herein by reference). In some embodiments, system 801 further includes GaN modules 807, 808, 809, and 810, which are configured to generate one or more GaN layers using one or more of the PVD processes described herein (e.g., in some embodiments, one or more layers of Hf:GaN are generated at GaN modules 807, 808, 809, and/or 810).

FIG. 8B is a schematic diagram of a template and device epitaxy system 802 for electronics and SSL. In some embodiments, system 802 performs processing on a bare wafer 850 in order to produce an LED-ready device 870. In some embodiments, system 802 includes a plurality of modules 805-808 and 820-821 (in some such embodiments, each one of the plurality of modules 805-808 and 820-821 is a separate deposition chamber; in other embodiments, the plurality of modules 805-808 and 820-821 is contained within a single deposition chamber). In some embodiments, instead of GaN modules 809 and 810, system 802 includes MOCVD modules 821 and 822, which are configured to provide MOCVD processing.

Figure 9:
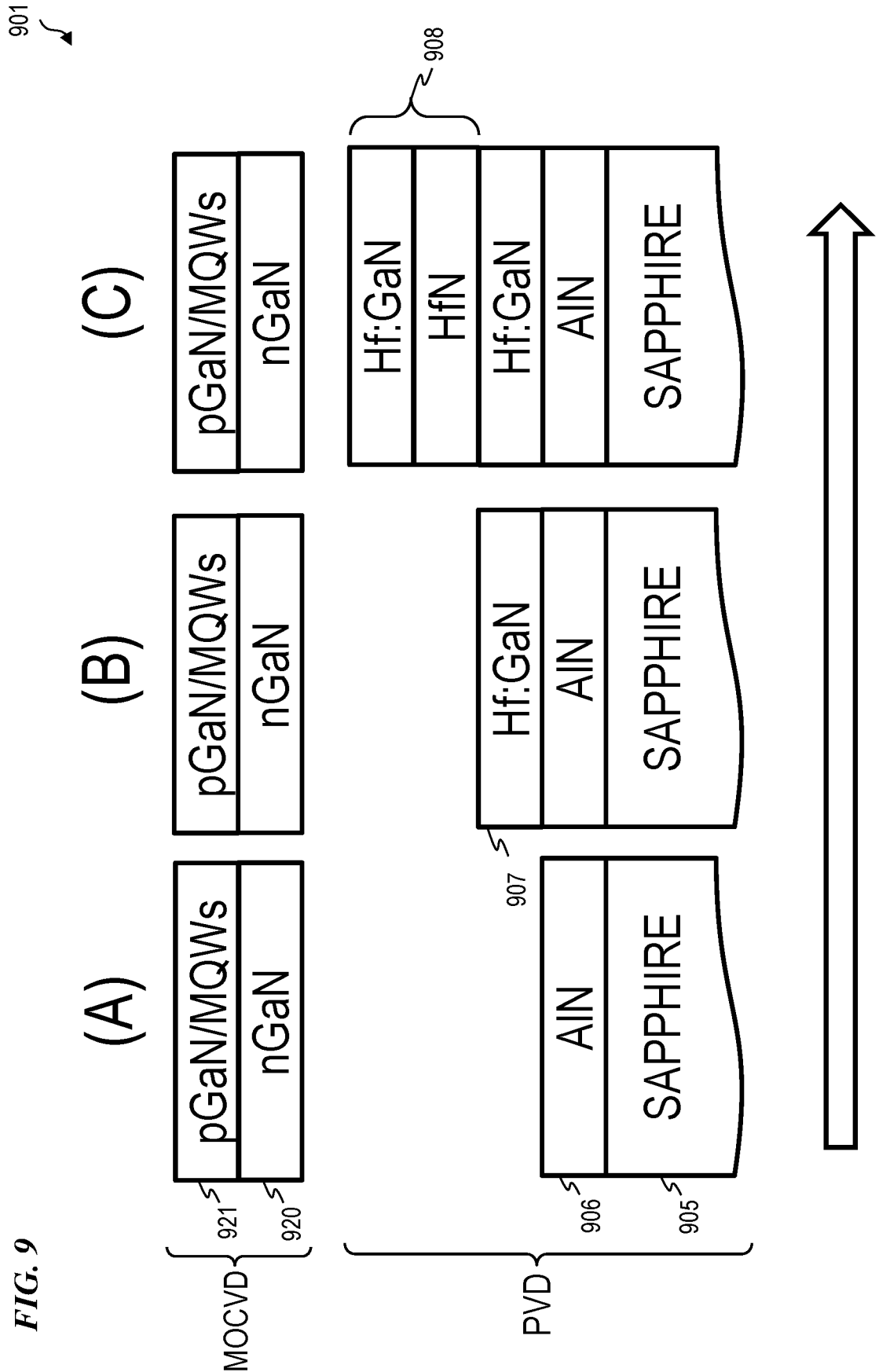
FIG. 9 is a schematic diagram of a template and device epitaxy process 901 for electronics and SSL.

FIG. 9 is a schematic diagram of a template and device epitaxy process 901 for electronics and SSL. In some embodiments, process 901 includes steps (A), (B), and (C). In some embodiments, step (A) includes generating a nucleation layer of AlN 906 on a sapphire substrate 905 using one or more of the PVD processes described herein (e.g., in some embodiments, sputtering), wherein the AlN nucleation layer 906 has a thickness of approximately 25 nm (in some such embodiments, step (A) is performed at module 805 of FIG. 8A). In some embodiments, step (B) includes generating a layer 907 of Hf:GaN on the AlN nucleation layer 906 using one or more of the PVD processes described herein (e.g., in some embodiments, sputtering). In some embodiments, step (B) is performed at modules 807, 808, 809, and/or 810 of FIG. 8A. In some embodiments, step (C) includes generating N periods of alternating layers of Hf:GaN and HfN (e.g., distributed Bragg reflectors) 908 on layer 907 based on the GEMM descriptions in U.S. Pat. Nos. 7,915,624, 8,253,157, and/or 8,890,183, which were introduced above and incorporated herein by reference (in some such embodiments, step (C) is performed at GEMM module 806 of FIG. 8A). In some embodiments, any one or more of steps (A), (B), and (C) further includes generating a layer 920 of n-type GaN and a layer 921 of p-type GaN/multiple quantum wells (MQWs) using a MOCVD process (in some such embodiments, layer 920 has a thickness of approximately 5 micrometers (μm); in other such embodiments, layer 920 has a thickness of approximately less than 1 μm). In some embodiments, layers 920 and 921 are generated at modules 920 and/or 921 of FIG. 8B.

Figure 10:
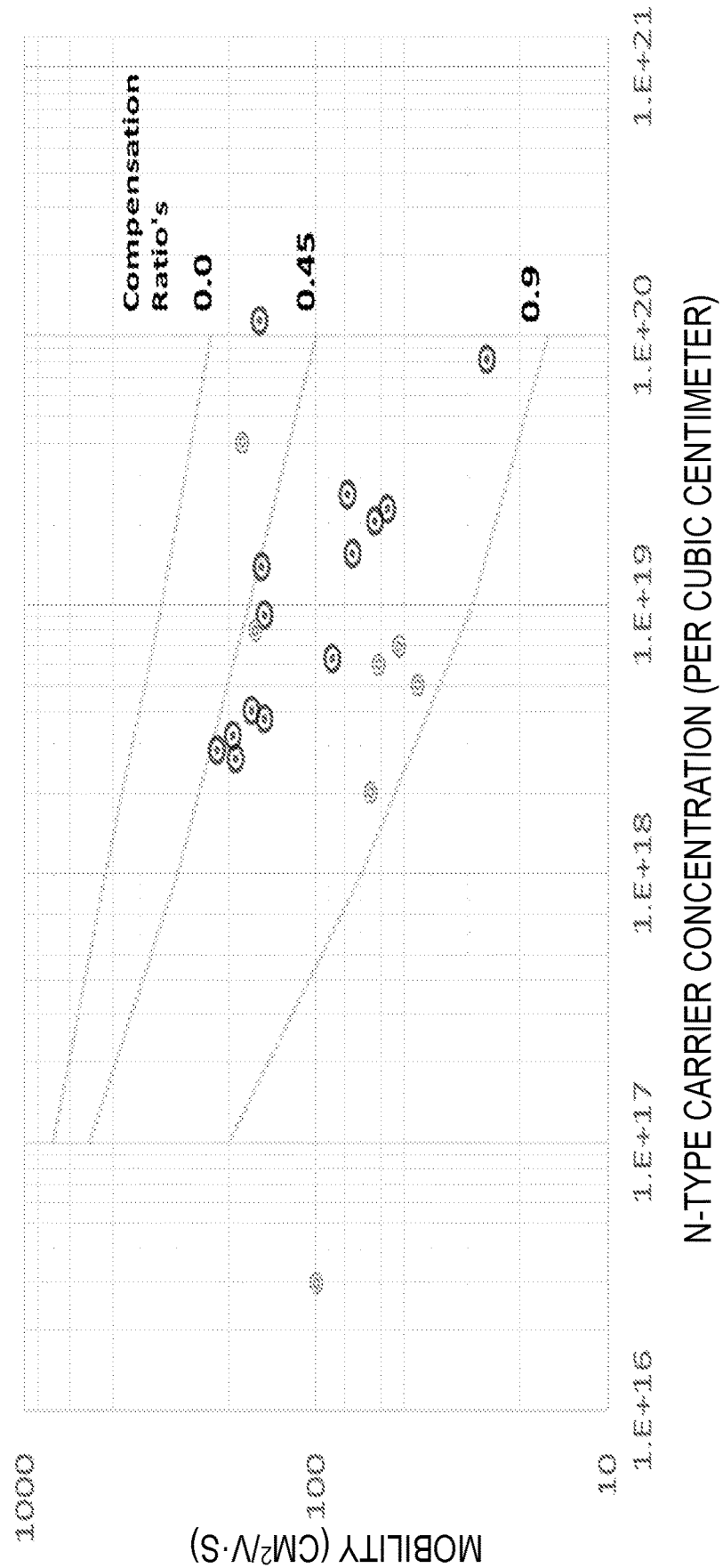
FIG. 10 is a graph 1001 showing n-type carrier concentration (per cubic centimeter) versus adatom mobility ($cm^2$/V·s) for hafnium-doped gallium nitride produced according to some embodiments of the present invention.

FIG. 10 is a graph 1001 showing n-type carrier concentration (per cubic centimeter) versus adatom mobility (cm$^2$/V·s) for hafnium-doped gallium nitride produced according to some embodiments of the present invention.

Figure 11:
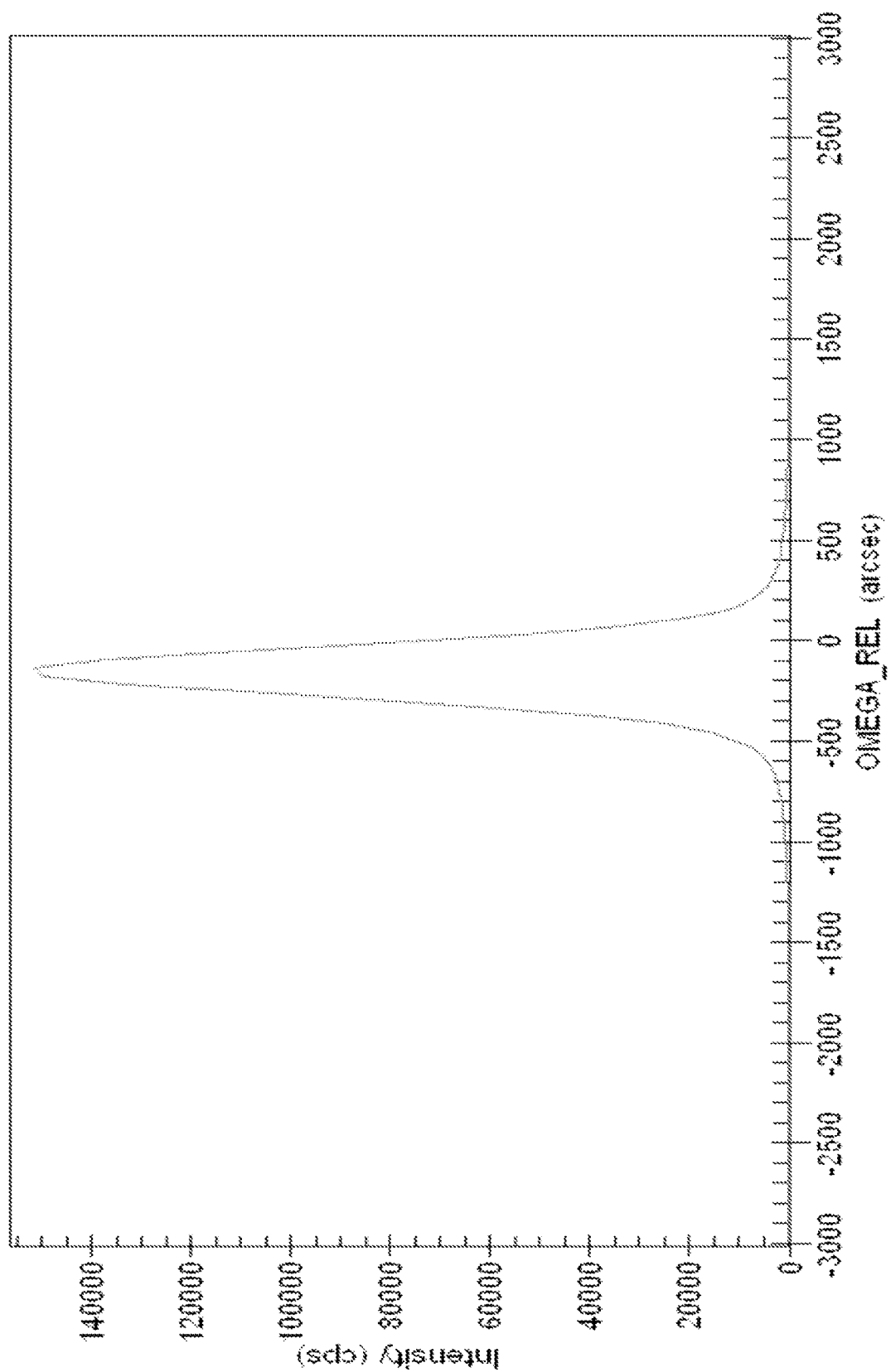
FIG. 11 is a graph 1101 showing the X-ray diffraction (XRD) data for GaN produced according to some embodiments of the present invention.

FIG. 11 is a graph 1101 showing the X-ray diffraction (XRD) data for GaN produced according to some embodiments of the present invention. In some embodiments, the Omega rocking curve full-width half-maximum (FWHM) value for the 002 peak is 300 arcseconds.

Figure 12:
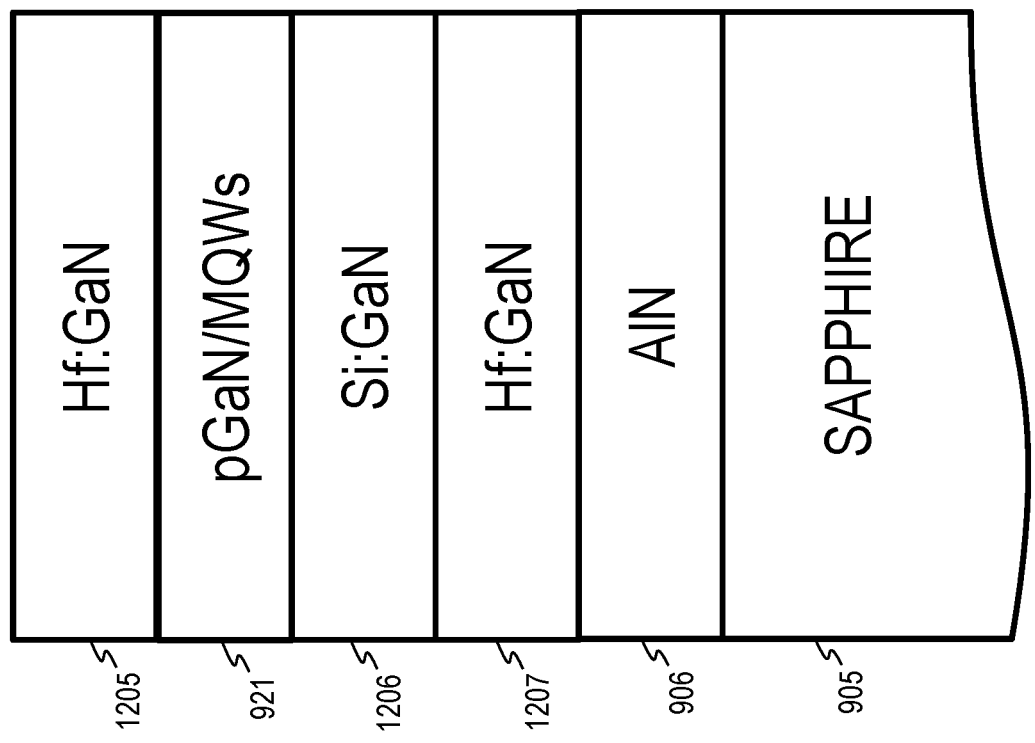
FIG. 12 is a schematic diagram of a GaN template structure 1201 for subsequent LED epitaxial growth.

FIG. 12 is a schematic diagram of a GaN template structure 1201 for subsequent LED epitaxial growth. In some embodiments, structure 1201 includes one or more indium tin oxide (ITO) replacement layers for use with thin film and standard light emitting devices. In some embodiments, the ITO replacement layer(s) is textured (e.g., pyramids, domes, 2D photonic crystals, and the like) and includes a GaN doped with a transitional metal element to form a textured transitional metal doped GaN such as Hf:GaN, Hf:AlGaN, Hf:InGaN, Hf:InGaAlN, or the like. In some embodiments, for p-side-up devices, the ITO replacement layer includes a layer 1205 of Hf:GaN placed directly on top of the p-type GaN/MQWs layer(s) 921, and a layer 1206 of Si:GaN (in some such embodiments, having a thickness of less than 1 μm) placed directly below the p-type GaN/MQWs layer(s) 921. In some embodiments, for p-side-down devices, the ITO replacement layer includes a layer 1207 of Hf:GaN placed directly on top of the AlN nucleation layer(s) 906. In some embodiments, the PVD processes for generating Hf:GaN described herein (e.g., sputtering) have low process temperatures, which allow the ITO layer(s) to be used both pre and post epitaxy (accordingly, in some such embodiments, there is no need for tetrakis dimethylamino hafnium, which is commonly used in MOCVD systems).

Figure 13:
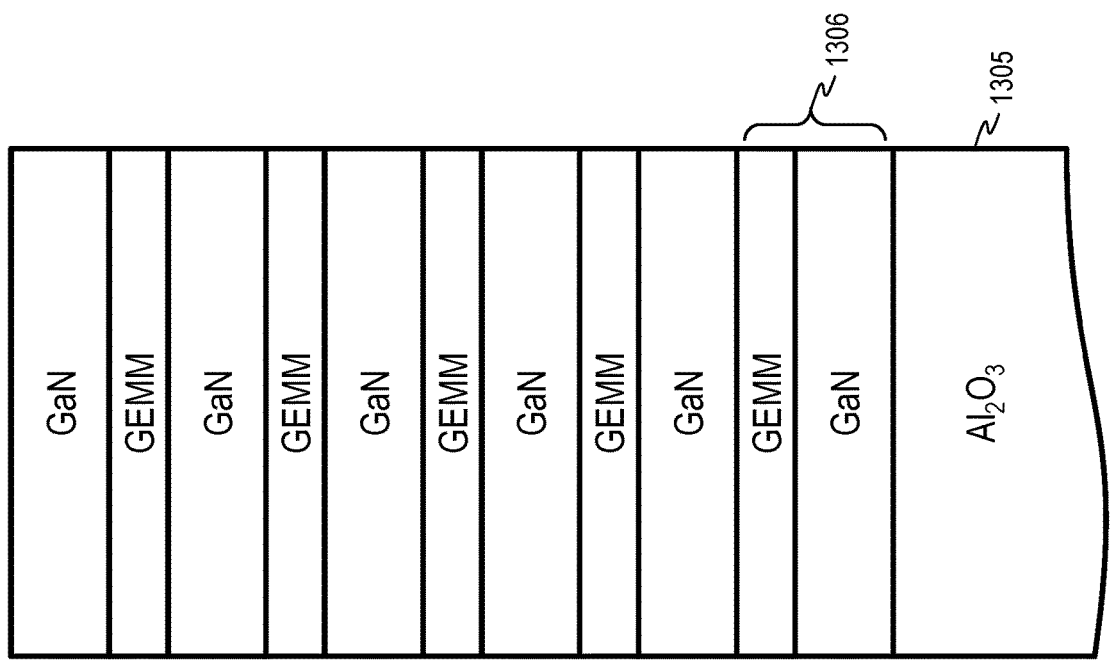
FIG. 13 is a schematic diagram of an epitaxial stack structure 1301 of GEMM/GaN.

FIG. 13 is a schematic diagram of an epitaxial stack structure 1301 of GEMM/GaN. In some embodiments, structure 1301 includes a substrate layer 1305 of sapphire (Al$_2$O$_3$) and five periods 1306 of alternating layers of GEMM and GaN. In some embodiments, structure 1301 is lattice matched for epi-ready growth, highly conductive (low resistivity value), and higher in reflectivity than AlN/GaN distributed Bragg reflectors (DBRs). In some embodiments, the GEMM growth is performed according to the descriptions in U.S. Pat. Nos. 7,915,624, 8,253,157, and/or 8,890,183, which were introduced above and incorporated herein by reference.

Figure 14A:
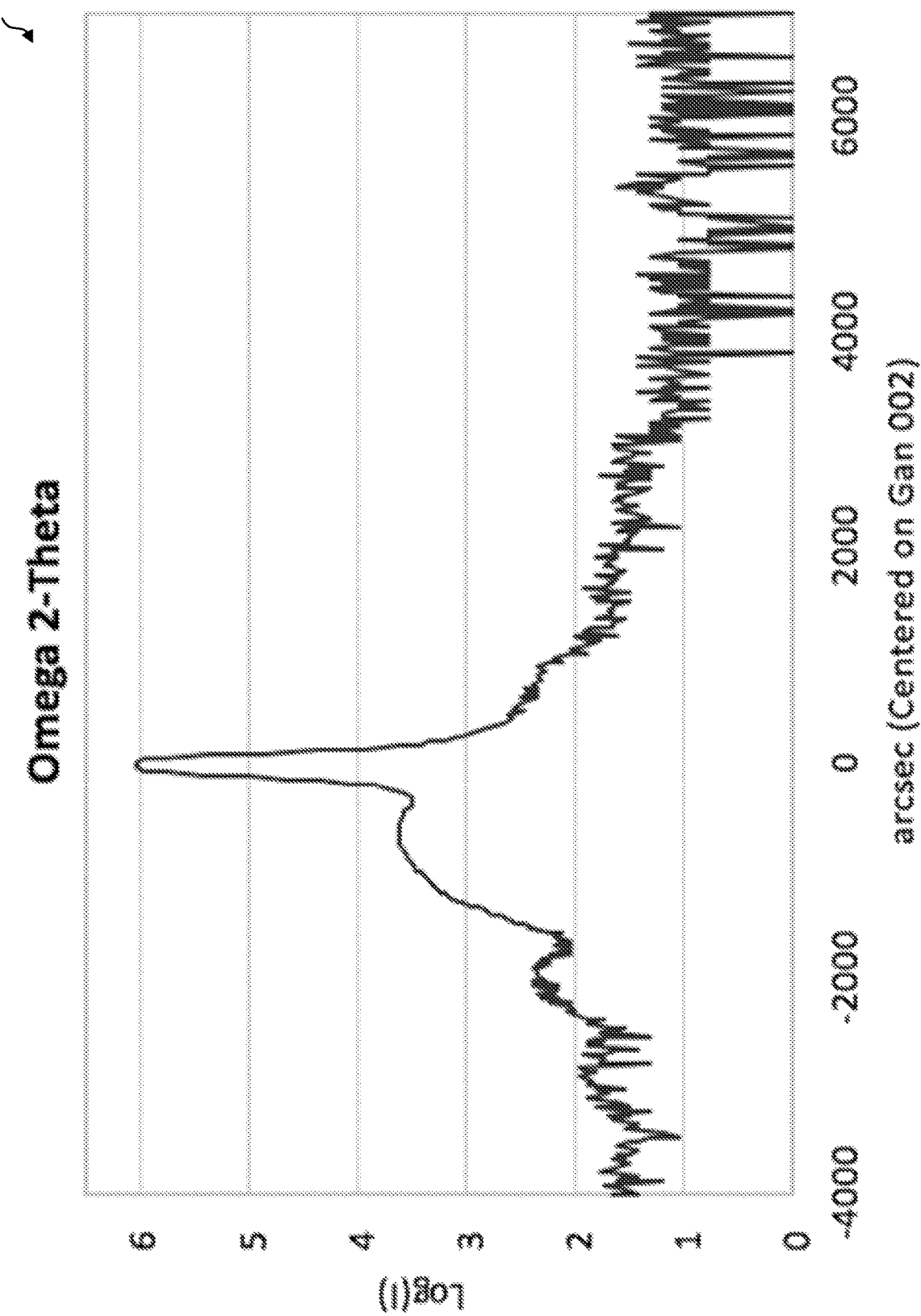
FIG. 14A is a graph 1401 of X-ray diffraction (XRD) data for GaN produced according to some embodiments of the present invention.

FIG. 14A is a graph 1401 of X-ray diffraction (XRD) data for GaN produced according to some embodiments of the present invention. In some embodiments, the GaN is lattice matched with a low rocking curve full-width half-maximum (FWHM) value (e.g., in some embodiments, a 0.35% mismatch).

Figure 14B:
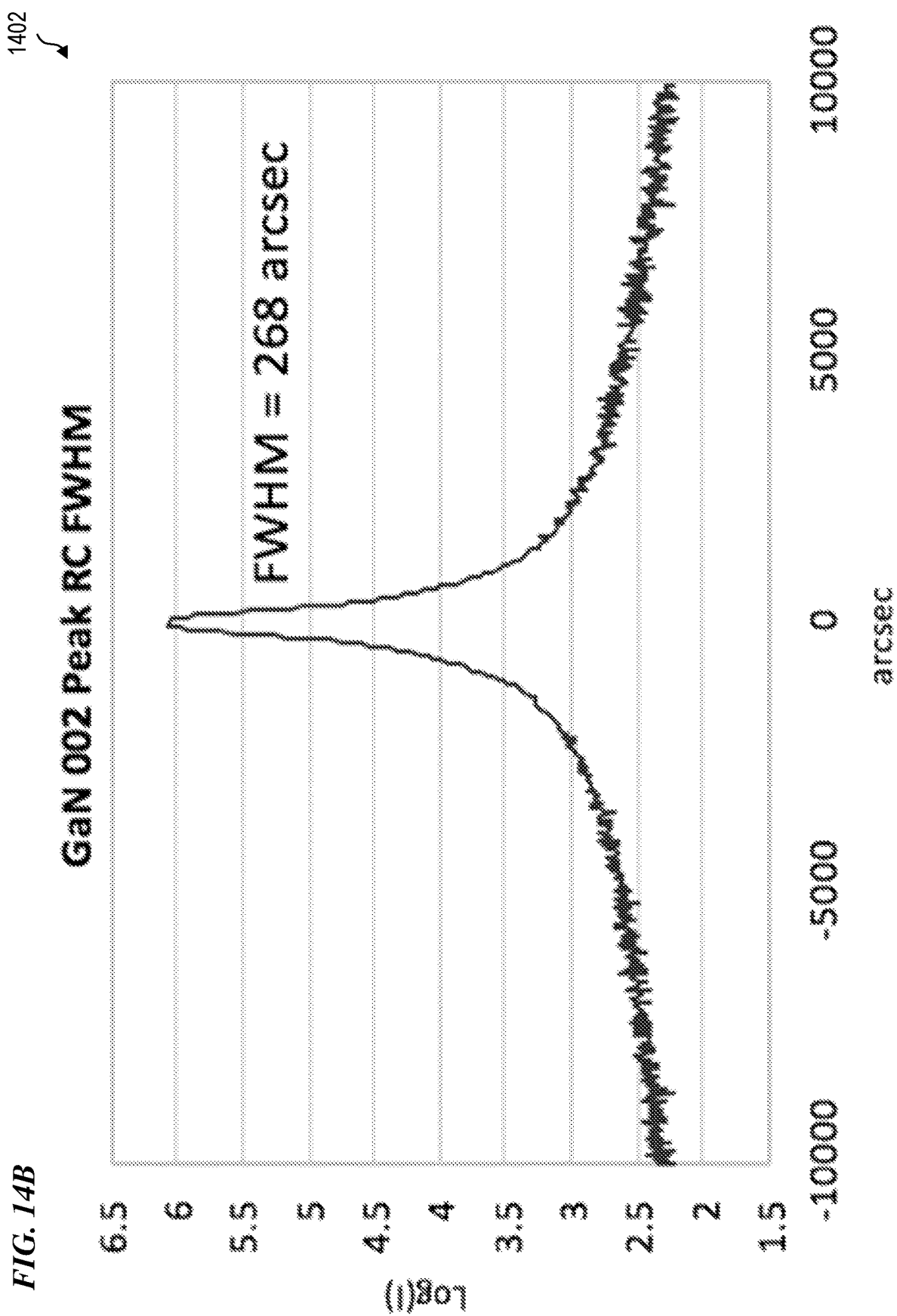
FIG. 14B is a graph 1402 of X-ray diffraction (XRD) data for the GaN produced according to some embodiments of the present invention.

FIG. 14B is a graph 1402 of X-ray diffraction (XRD) data for the GaN produced according to some embodiments of the present invention.

Figure 14C:
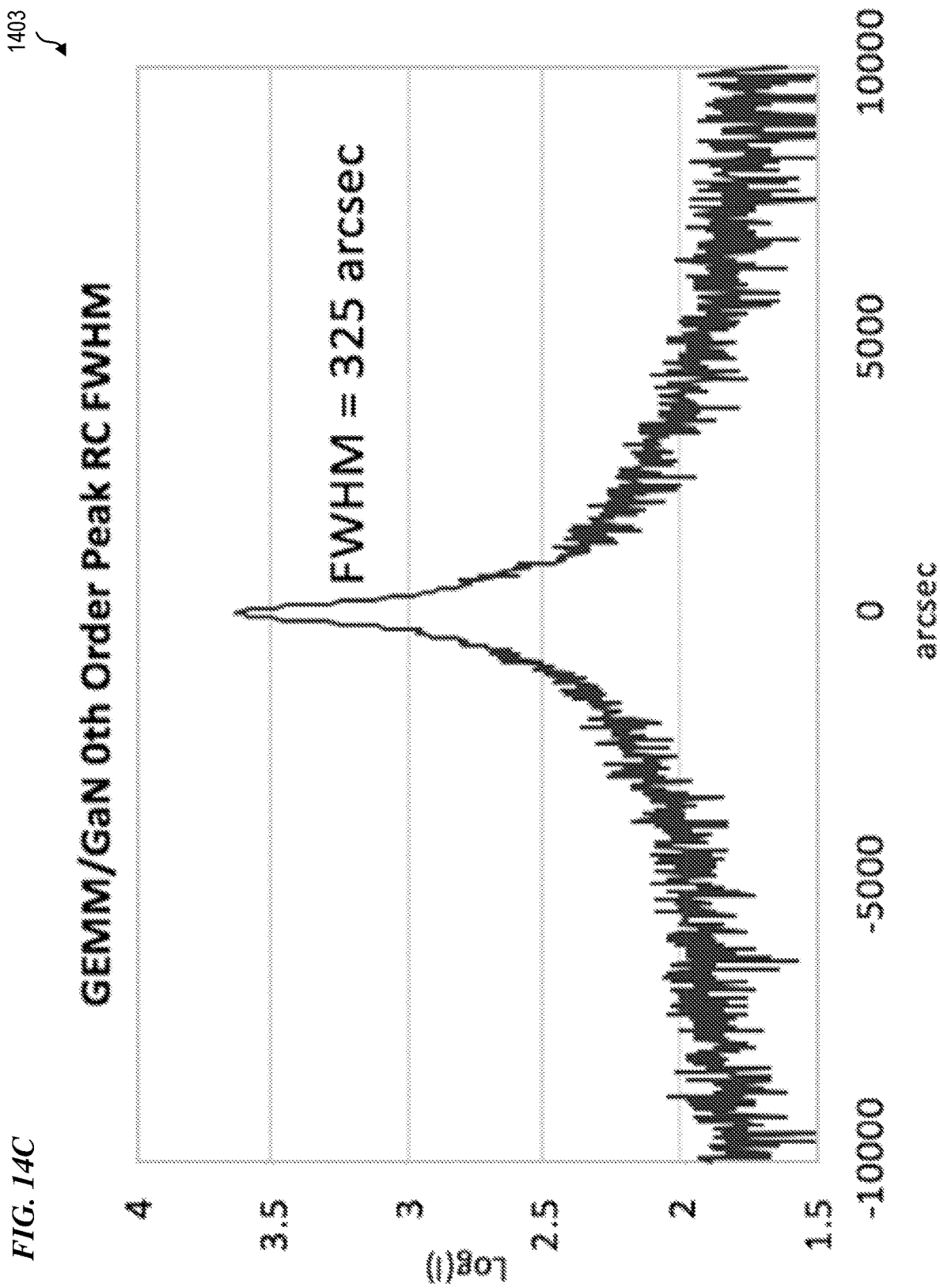
FIG. 14C is a graph 1403 of X-ray diffraction (XRD) data for the GaN produced according to some embodiments of the present invention.

FIG. 14C is a graph 1403 of X-ray diffraction (XRD) data for the GaN produced according to some embodiments of the present invention.

Figure 14D:
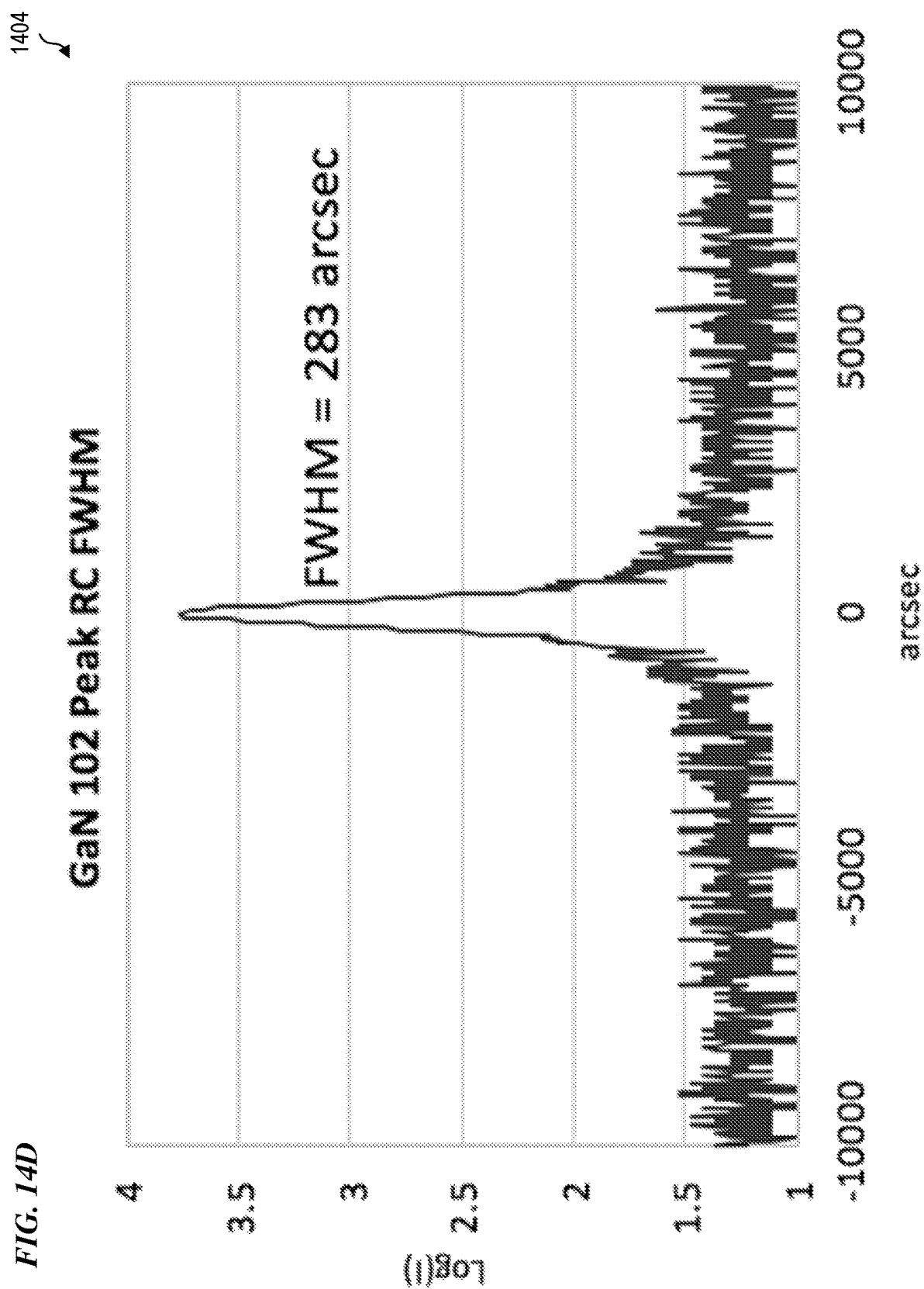
FIG. 14D is a graph 1404 of X-ray diffraction (XRD) data for the GaN produced according to some embodiments of the present invention.

FIG. 14D is a graph 1404 of X-ray diffraction (XRD) data for the GaN produced according to some embodiments of the present invention.

Figure 15:
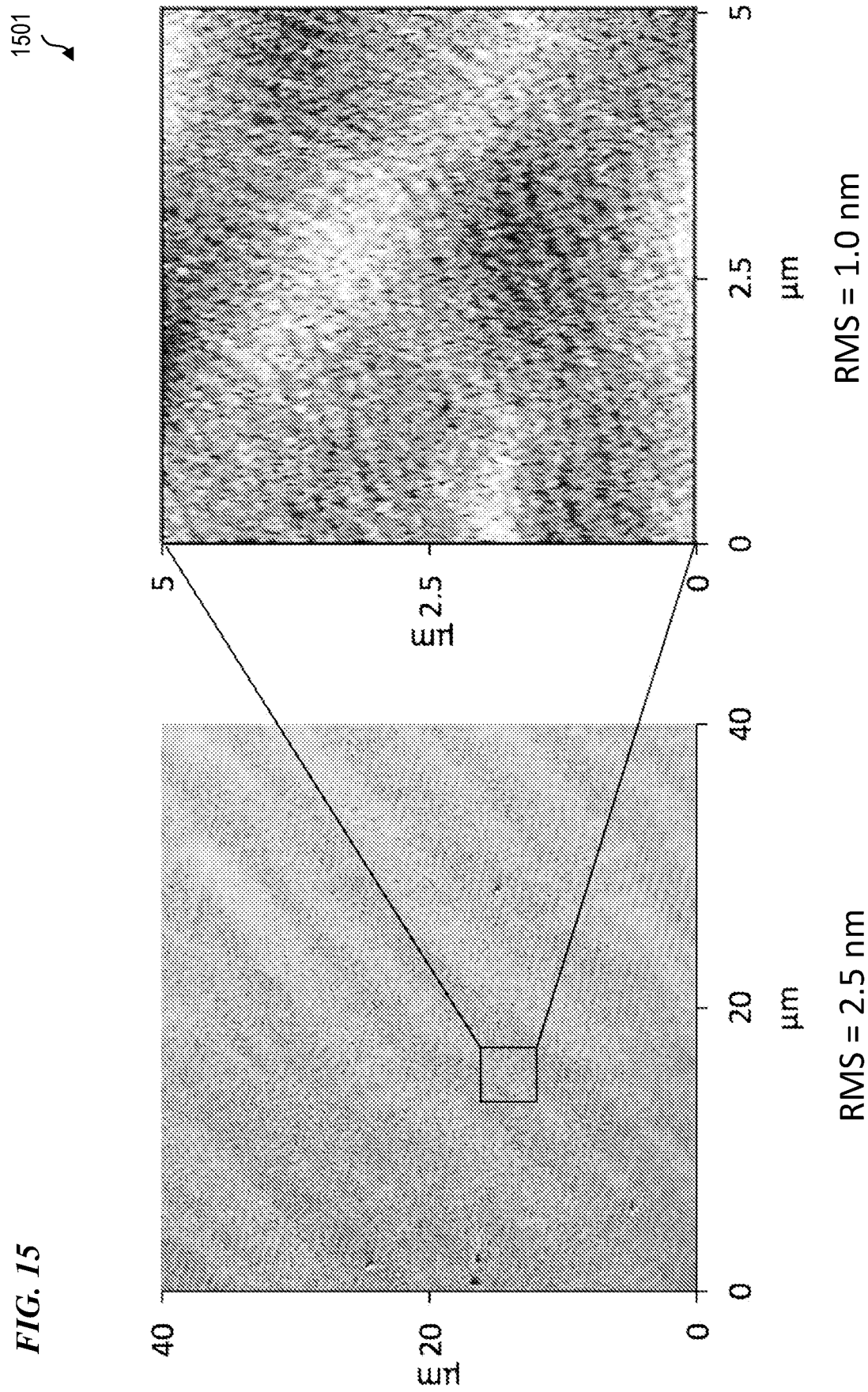
FIG. 15 is a diagram 1501 of atomic-force microscopy (AFM) data for GaN on GEMM produced according to some embodiments of the present invention.

FIG. 15 is a diagram 1501 of atomic-force microscopy (AFM) data for GaN on GEMM produced according to some embodiments of the present invention. In some embodiments, the GaN on GEMM has an ultra-smooth atomic step surface that allows uniform growth of thin quantum wells.

Figure 16:
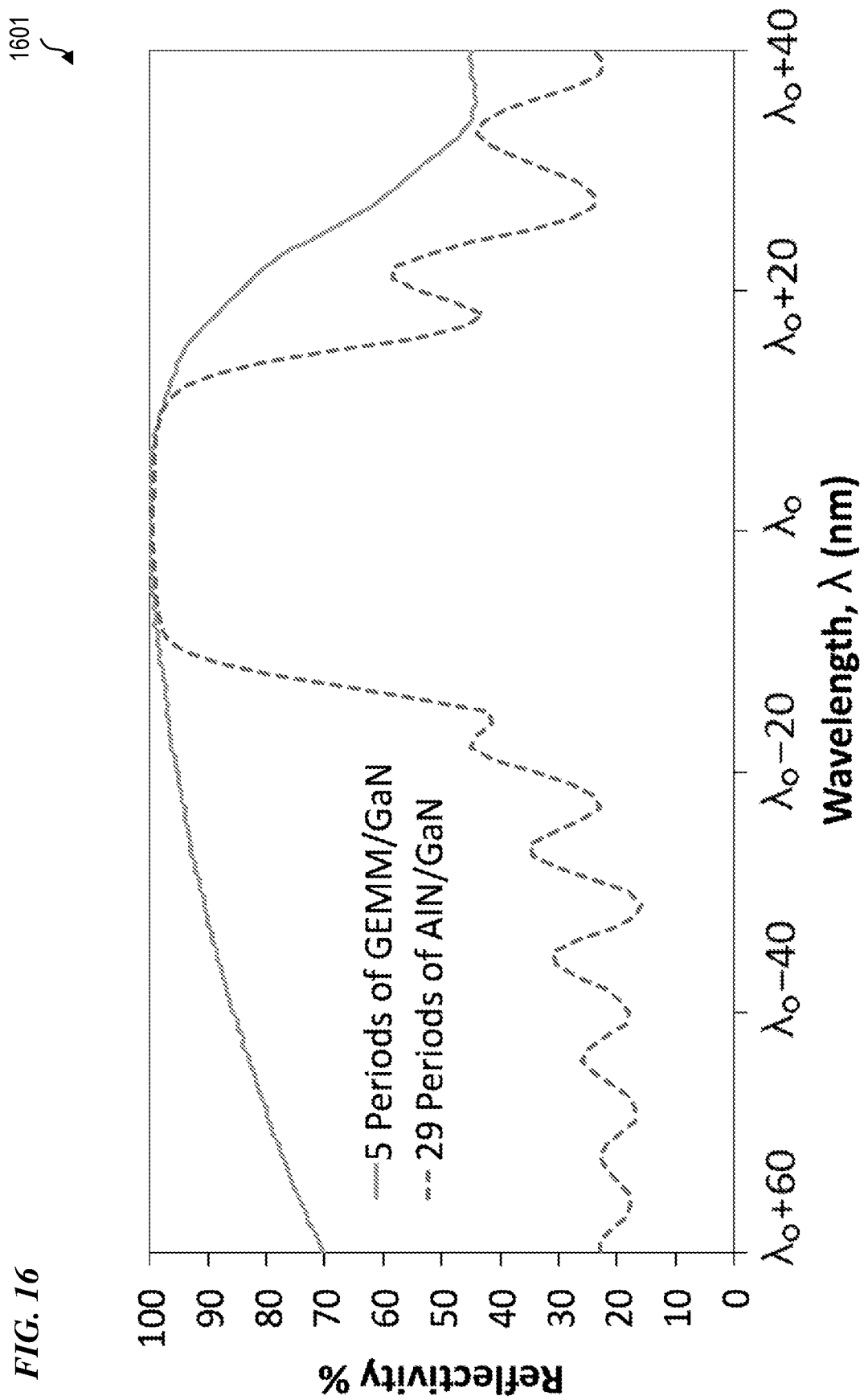
FIG. 16 is a graph 1601 showing a comparison between reflectivity of GEMM/GaN produced according to some embodiments of the present invention (solid line) versus conventional AlN/GaN distributed Bragg reflectors (DBRs) (dotted line).

FIG. 16 is a graph 1601 showing a comparison between reflectivity of GEMM/GaN produced according to some embodiments of the present invention (solid line) versus conventional AlN/GaN distributed Bragg reflectors (DBRs) (dashed line). In some embodiments, the center wavelength 4 is located between 400 nanometers (nm) and 700 nm, depending on materials selection and thicknesses.

Figure 17:
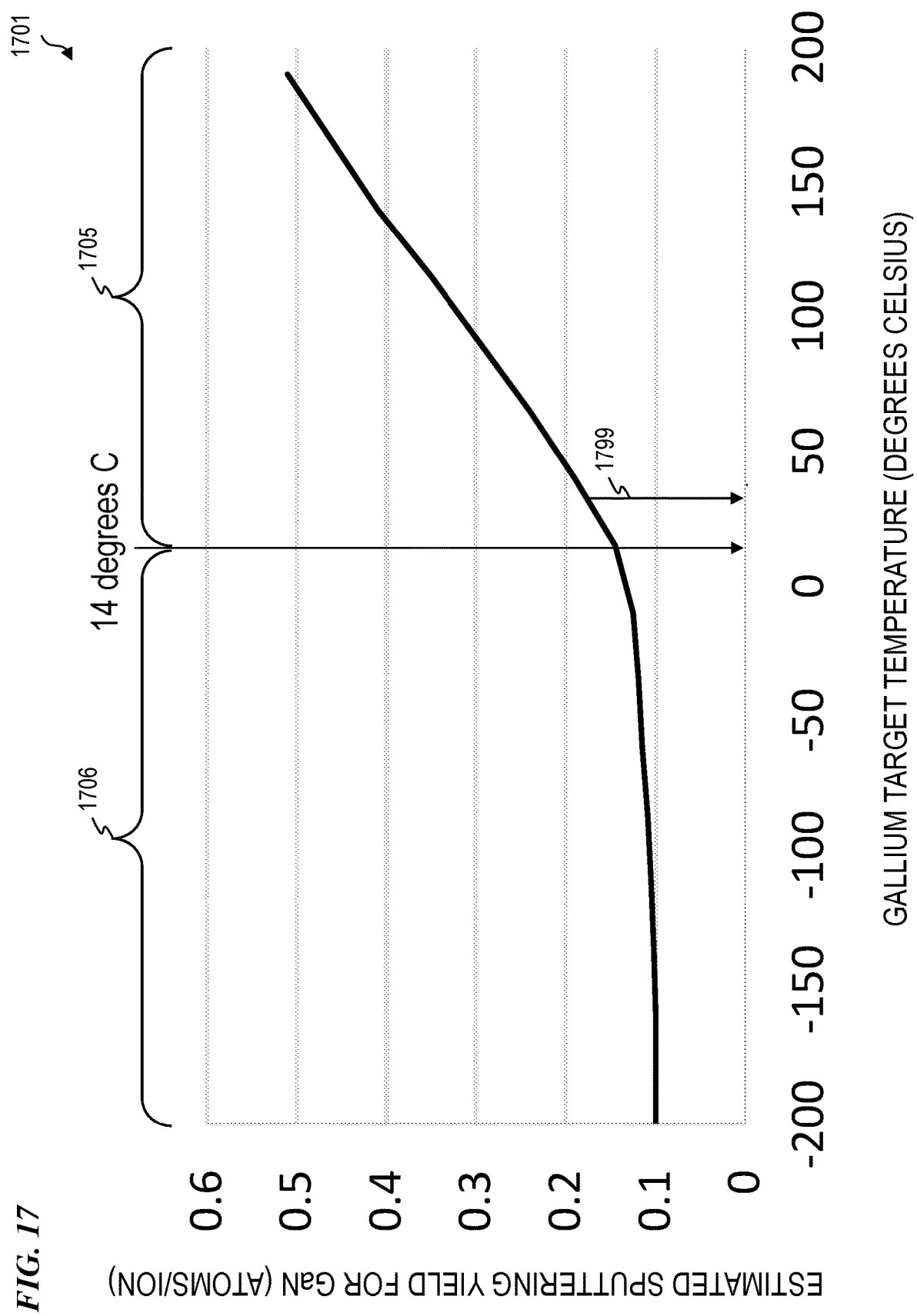
FIG. 17 is a graph 1701 of estimated sputtering yield for gallium nitride (GaN) versus temperature of the gallium target.

FIG. 17 is a graph 1701 of estimated sputtering yield for gallium nitride (GaN) versus temperature of the gallium target. Graph 1701 shows that, in some embodiments, when the gallium target temperature is in region 1705 (i.e., greater than approximately 14 degrees Celsius (C)), the estimated sputtering yield is temperature sensitive. In contrast, graph 1701 shows that, in some embodiments, when the gallium target temperature is in region 1706 (i.e., less than approximately 14 degrees C.), the estimated sputtering yield is temperature insensitive. Graph 1701 further shows that, in some embodiments, the melting point of gallium 1799 (approximately 29 degrees C.) falls within temperature-sensitive region 1705. In some embodiments, the present invention cools the gallium target such that it is within temperature-insensitive region 1706. In some embodiments, the cooling of the gallium target includes providing a temperature gradient across the depth of the gallium target such that a first depth of the gallium target is at a first temperature and a second depth it at a second temperature.

In some embodiments, the temperature of the gallium target is kept low for reliable repeatable manufacturing as well as high-quality films. In some embodiments, if the gallium is a liquid, gallium spitting on the wafer may inhibit manufacturing. In some embodiments, if the target is kept at a temperature near gallium's melting point 1799 (e.g., +/−20 degrees C. or more relative to melting point 1799), the yield of ejected atoms will be highly dependent on slight changes in the process parameters and the energies of the ejected atoms will have a broad distribution.

In some embodiments, reducing the temperature of the gallium sputtering target below 28 degrees Celsius (C) and lower improves the repeatability and quality of the resulting gallium nitride (GaN) films. In some embodiments, the quality of the resulting GaN films improves down to −40 degrees C., and, in some embodiments, reducing the temperature even further (e.g., −200 degrees C.) provides additional improvements in GaN crystal quality. In some embodiments, the reason for the improved film quality is due to a refinement of the gallium purity during the sputtering process where impurities have a lower sputtering yield at lower target temperatures. Additionally, in some embodiments, the improvement is due to a reduction in "gallium spitting" where plasma gases (e.g., noble gases and possibly reactive gases) have a more shallow penetration into the gallium target. In some embodiments, the present invention includes noble gases for sputtering and ion sources (e.g., in some embodiments, helium (He), neon (Ne), argon (Ar), krypton (Kr), xenon (Xe), radon (Rn), and/or oganesson (Og)).

In some embodiments of the epitaxial atomic layer sputtering (EALS) provided by the present invention, the gallium sputtering target is kept solid and colder than its melting point by at least 15 degrees Celsius (C). In some embodiments, the temperature of the gallium sputtering target is equal to or between 0 degrees C. and 15 degrees C., inclusive; in some embodiments, the target temperature is between −15 degrees C. and 0 degrees C., inclusive; in some embodiments, the target temperature is equal to or between −40 degrees C. and −15 degrees C., inclusive; in some embodiments, the target temperature is equal to or between −100 degrees C. and −40 degrees C., inclusive; in some embodiments, the target temperature is equal to or between −200 degrees C. and −100 degrees C., inclusive; in some embodiments, the target temperature is lower than −200 degrees C. In some embodiments, the gallium sputtering target temperature is between 14 degrees C. and −273 degrees C.

In some embodiments, the present invention provides a method for producing a gallium nitride (GaN)-based device that includes providing a substrate template that includes aluminum nitride; and depositing a textured transitional metal doped GaN layer onto the substrate template.

Conventional techniques avoid gallium deposition by sputtering due to gallium's low melting point (approximately 29 degrees C.), especially when the wafer temperature is higher than in most applications by hundreds of degrees and the wafer-to-target distance is just centimeters away.

In some embodiments, the present invention provides GaN growth by sputtering from a gallium target (solid or liquid) with an XRD 102 peak with a FWHM below about 3000 arcseconds. In some embodiments, the present invention provides GaN for use with high-electron-mobility transistors, wherein the GaN has an XRD 102 peak with a FWHM below 1500 arcsec. In some embodiments, the present invention provides GaN for use with light emitting devices, wherein the GaN has an XRD 102 peak with a FWHM below 600 arcseconds (e.g., 300 arcseconds). In some embodiments, the present invention provides smooth non-columnar step growth of GaN by PVD (e.g., sputtering). In some such embodiments, the gallium target is maintained below 14 degrees C. (in some embodiments, the gallium target is maintained at subzero Celsius temperatures and non-water heat-transfer liquids such as alcohols are used). In some embodiments, the present invention provides EALS processes to achieve commercial-grade atomic-force microscopy (AFM), optical, and X-ray diffraction (XRD) results.

In some embodiments, the present invention provides an epitaxial atomic layer sputtering (EALS) process (e.g., GaN growth on GaN, AlN, nucleation layer (described below) or similar template) that includes any one or more of the following: (1) high-temperature annealing; (2) at a higher temperature than normal (e.g., by 20 degrees C. to 50 degrees C. greater), growing Ga:N at a ratio of greater than 1 for 5 to 20 minutes; (3) in a normal growth mode (e.g., 700 degrees C.), growing Ga:N at a ratio of greater than 1 for 20 to 40 minutes; (4a) stop growth and anneal at 750 degrees C. until all excess gallium is evaporated and film is smooth (e.g., anneal for 5 to 10 minutes) or (4b) continue growth but with Ga:N ratio of less than 1 (in some such embodiments, gallium may be turned off or the shutter may be closed); and (5) repeat steps 1 through 4. In some embodiments, at any time during the above steps, RF nitrogen is used instead of $N_2$ or $NH_3$ gases while argon is supplied directly to the gallium target, and in some embodiments, an ion source from the gallium target or a separate ion source is used. In some embodiments, doping with hafnium (Hf), zirconium (Zr), silicon (Si), germanium (Ge), magnesium (Mg), copper (Cu), or any of the other transitional metals is done during the above steps. In some embodiments, alloying GaN with aluminum (Al), indium (In), or any of the other transitional metals including Hf, Zr, or scandium (Sc) is done during the above steps.

In some embodiments, the present invention provides a process for generating a nucleation layer on a dissimilar template (e.g., Si, sapphire, hafnium nitride (HfN), zirconium nitride (ZrN), zinc oxide (ZnO), glass, or the like), wherein the process includes any one or more of the following: (1) thermal cleaning, thermal texturing, chemically assisted; (2) nitridation at elevated temperatures by exposing to nitrogen source including $N_2$, nitrogen ions, $NH_3$ or the like; and (3) deposition of AlN (optional GaN) to a thickness in a range of about 5 nanometers (nm) to 100 nm by sputtering. In some embodiments, at any time during the above steps, RF nitrogen is used instead of $N_2$ or $NH_3$ gases while argon is supplied directly to the gallium target, and in some embodiments, an ion source from the gallium target or a separate ion source is used. In some embodiments, doping with Hf, Zr, Si, Ge, Mg, Cu, or any of the other transitional metals is done during the above steps. In some embodiments, alloying GaN with Al, In, or any of the other transitional metals including, for example, Hf, Zr, or Sc is done during the above steps.

Figure 18:
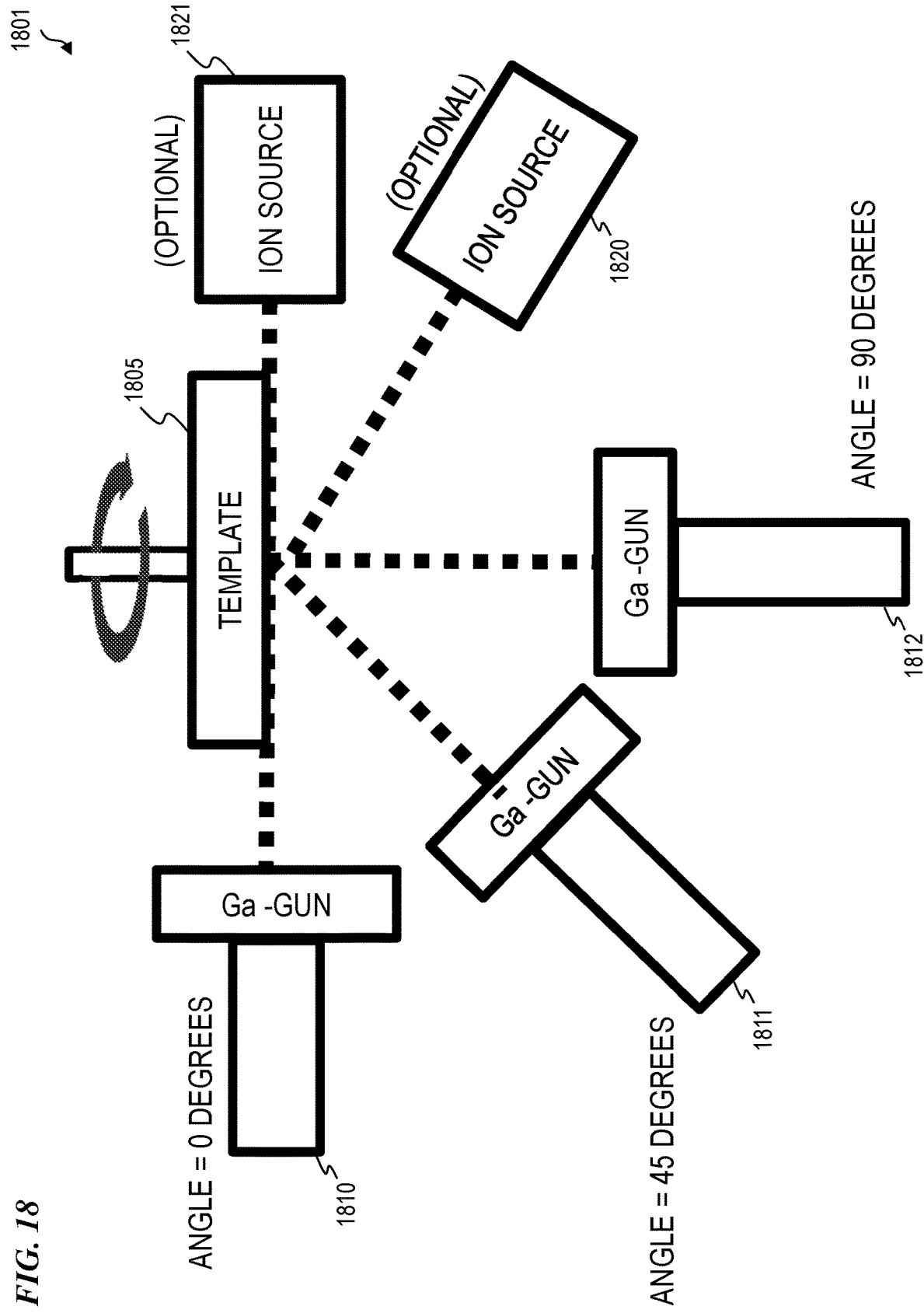
FIG. 18 is a schematic diagram of a sputtering system 1801.

FIG. 18 is a schematic diagram of a sputtering system 1801. In some embodiments, system 1801 includes a plurality of gallium (Ga) guns including Ga gun 1810 (positioned at zero degrees from template 1805), Ga gun 1811 (positioned at 45 degrees from template 1805), and Ga gun 1812 (positioned 90 degrees from template 1805). In some embodiments, system 1801 further includes a plurality of ion sources 1820 and/or 1821. In some embodiments, template 1805 is rotated between the Ga guns 1810-1812 and ion sources 1820 and/or 1821. In some embodiments, for manufacturing stability as well as for the quality of the group IA-nitride films, it is important to provide enough ions to the surface by either sputtering gun or ion gun. In some embodiments, the ion gun is replaced with a photon source (e.g. ultraviolet) or an electron source. In some embodiments, the ion source (e.g., ion source 1820 and/or ion source 1821), whether it be from a dedicated-ion source or from a sputtering target, is best when provided at between shallow angle and 90 degrees to the surface of template 1805. In some embodiments, while these components are in place, argon is fed to the sputtering gun and the amount of nitrogen interaction with the gallium target is minimized to run processes in a reduced nitrogen poisoning regime.

In some embodiments, the present invention provides a method for epitaxially growing a gallium nitride (GaN) structure that includes providing a substrate; growing at least a first GaN layer on a surface of the substrate using a first physical vapor deposition (PVD) process (e.g., in some embodiments, sputtering), wherein the first PVD process includes: providing a solid gallium target, and maintaining the solid gallium target at a first temperature that is less than approximately 29 degrees Celsius.

In some embodiments of the method, the providing of the substrate includes growing an aluminum nitride (AlN) layer on a base of the substrate using a second PVD process (e.g., in some embodiments, sputtering) such that the AlN layer forms the surface of the substrate. In some embodiments, the first PVD process further includes epitaxial atomic layer sputtering (EALS). In some embodiments, the first PVD process further includes EALS, wherein the EALS includes heating the substrate. In some embodiments, the first PVD process further includes magnetron sputtering. In some embodiments, the first temperature is less than approximately 15 degrees Celsius. In some embodiments, the maintaining of the solid gallium target at the first temperature includes fluid-convection cooling the solid gallium target using an alcohol-based fluid. In some embodiments, the first GaN layer has an Omega rocking curve full-width half-maximum (FWHM) X-ray diffraction measurement for both 002 and 102 peaks that is less than approximately 1000 arcseconds.

In some embodiments, the present invention provides a method for growing a gallium nitride (GaN) structure that includes providing a substrate; and growing at least a first GaN layer on a surface of the substrate using a first physical vapor deposition (PVD) process (e.g., in some embodiments, a first sputtering process), wherein the first PVD process includes: providing a solid gallium target, wherein the providing of the solid gallium target includes maintaining the solid gallium target at a first temperature, and implementing epitaxial atomic layer sputtering (EALS) of the at least first GaN layer such that the growing of the at least first GaN layer includes non-columnar step growth of the at least first GaN layer.

In some embodiments, the present invention provides a system for growing a gallium nitride (GaN) structure that includes a load lock configured to load a substrate wafer into the system and remove the GaN structure from the system; and a plurality of deposition modules, wherein the plurality of deposition modules includes a GaN-deposition module configured to grow at least a first GaN layer on a surface of the substrate wafer via a first physical vapor deposition (PVD) process (e.g., in some embodiments, a first sputtering process), wherein the GaN-deposition module includes a solid gallium target that is maintained at a first temperature, and wherein the first PVD process includes epitaxial atomic layer sputtering (EALS) of the at least first GaN layer such that non-columnar step growth of the at least first GaN layer occurs.

In some embodiments, the present invention provides a method for growing a gallium nitride (GaN) structure that includes providing a substrate; and growing at least a first GaN layer on a surface of the substrate using a first sputtering process, wherein the first sputtering process includes: providing a gallium target, and implementing epitaxial atomic layer sputtering (EALS) such that the growing of the at least first GaN layer includes non-columnar step growth of the at least first GaN layer.

In some embodiments, the implementing of the MEE includes controlling a ratio of gallium-to-nitrogen to be greater than 1-to-1 for at least a first time period of the first sputtering process. In some embodiments of the method, the implementing of the MEE includes introducing nitrogen via a radio frequency (RF) nitrogen source.

In some embodiments of the method, the first sputtering process further includes doping the at least first GaN layer with silicon (Si). In some embodiments, the first sputtering process further includes doping the at least first GaN layer by gas injecting a reactant with a carrier gas holding silicon (Si).

In some embodiments of the method, the gallium target is a solid gallium target, wherein the first sputtering process further includes maintaining the solid gallium target at a first temperature that is less than approximately 15 degrees Celsius. In some embodiments, the gallium target is a solid gallium target, wherein the first sputtering process further includes maintaining the solid gallium target at a first temperature, and wherein the maintaining of the solid gallium target at the first temperature includes fluid-convection cooling the solid gallium target using an alcohol-based fluid.

In some embodiments of the method, the providing of the substrate includes growing an aluminum nitride (AlN) layer on a base of the substrate using a second sputtering process such that the AlN layer forms the surface of the substrate. In some embodiments, the method further includes growing a grown-epitaxial metal mirror (GEMM) on the at least first GaN layer. In some embodiments, the method further includes growing a grown-epitaxial metal mirror (GEMM) on the at least first GaN layer, wherein the GEMM includes alternating layers of hafnium (Hf):GaN and hafnium nitride (HfN). In some embodiments, the method further includes growing a grown-epitaxial metal mirror (GEMM) on the at least first GaN layer, wherein the GEMM includes alternating layers of hafnium (Hf):GaN and hafnium nitride (HfN); and growing at least a first quantum well on a surface of the GEMM using a metal-organic chemical vapor deposition (MOCVD) process. In some embodiments, the first sputtering process further includes magnetron sputtering. In some embodiments, the at least first GaN layer has an Omega rocking curve full-width half-maximum (FWHM) X-ray diffraction measurement for both 002 and 102 peaks that is less than approximately 1000 arcseconds. In some embodiments, the at least first GaN layer has an Omega rocking curve full-width half-maximum (FWHM) X-ray diffraction measurement for a 002 peak that is in a range of about 10 arcseconds to about 2500 arcseconds.

In some embodiments, the present invention provides a system for growing a gallium nitride (GaN) structure that includes a load lock configured to load a substrate wafer into the system and remove the GaN structure from the system; and a plurality of deposition chambers, wherein the plurality of deposition chambers includes a GaN-deposition chamber configured to grow at least a first GaN layer on a surface of the substrate wafer via a first sputtering process, and wherein the first sputtering process includes epitaxial atomic layer sputtering (EALS) of the at least first GaN layer such that non-columnar step growth of the at least first GaN layer occurs.

In some embodiments, the system further includes a wafer-handling mechanism configured to automatically transfer the substrate wafer between the plurality of deposition chambers. In some embodiments, the plurality of deposition chambers includes an aluminum nitride (AlN)-deposition chamber configured to grow an AlN layer on a base of the substrate wafer via a second sputtering process such that the AlN layer forms the surface of the substrate wafer. In some embodiments, the plurality of deposition chambers includes a grown-epitaxial metal mirror (GEMM)-deposition chamber configured to grow a GEMM on the at least first GaN layer. In some embodiments, the GaN-deposition chamber includes a solid gallium target that is maintained at a first temperature, and wherein the first temperature is less than approximately 15 degrees Celsius. In some embodiments, the GaN-deposition chamber further includes: a solid gallium target that is maintained at a first temperature; and a fluid-convection cooler configured to cool the solid gallium target via an alcohol-based fluid.

In some embodiments, the GaN-deposition chamber is further configured to dope the at least first GaN layer with silicon (Si). In some embodiments, the GaN-deposition chamber is further configured to grow the at least first GaN layer such that the at least first GaN layer has an Omega rocking curve full-width half-maximum (FWHM) X-ray diffraction measurement for both 002 and 102 peaks that is less than approximately 1000 arcseconds. In some embodiments, the GaN-deposition chamber is further configured to grow the at least first GaN layer such that the at least first GaN layer has an Omega rocking curve full-width half-maximum (FWHM) X-ray diffraction measurement for a 002 peak that is in a range of about 10 arcseconds to about 2500 arcseconds.

In some embodiments, the plurality of deposition chambers further includes: an aluminum nitride (AlN)-deposition chamber configured to grow an AlN layer on a base of the substrate wafer via a second sputtering process such that the AlN layer forms the surface of the substrate wafer; a grown-epitaxial metal mirror (GEMM)-deposition chamber configured to grow a GEMM on the at least first GaN layer, wherein the GEMM includes alternating layers of hafnium (Hf):GaN and hafnium nitride (HfN); and a metal-organic chemical vapor deposition (MOCVD) chamber configured to grow at least a first quantum well on a surface of the GEMM.

In some embodiments, the present invention provides a gallium-nitride structure that includes a substrate; and at least a first gallium nitride (GaN) layer grown on a surface of the substrate, wherein the at least first GaN layer has an Omega rocking curve full-width half-maximum (FWHM) X-ray diffraction measurement for both 002 and 102 peaks that is less than approximately 1000 arcseconds (in some embodiments, the at least first GaN layer has an Omega rocking curve full-width half-maximum (FWHM) X-ray diffraction measurement for a 002 peak that is in a range of about 10 arcseconds to about 2500 arcseconds).

In some embodiments, the structure further includes an aluminum nitride (AlN) layer grown on a base of the substrate such that the AlN layer forms the surface of the substrate. In some embodiments, the structure further includes a grown-epitaxial metal mirror (GEMM) grown on a surface of the at least first GaN layer. In some embodiments, the substrate includes sapphire, the structure further including an aluminum nitride (AlN) layer on a base of the substrate such that the AlN layer forms the surface of the substrate; a grown-epitaxial metal mirror (GEMM) grown on a surface of the at least first GaN layer, wherein the GEMM includes alternating layers of hafnium (Hf):GaN and hafnium nitride (HfN); a layer of n-type GaN grown on a surface of the GEMM; and a layer of p-type GaN/multiple quantum wells (MQWs) grown on the layer of n-type GaN.

In some embodiments, the present invention provides a system for growing a gallium nitride (GaN) structure that includes means for loading a substrate wafer into the system; and means for sputtering at least a first GaN layer on a surface of the substrate wafer, wherein the means for sputtering the at least first GaN layer includes means for implementing epitaxial atomic layer sputtering (EALS) such that non-columnar step growth of the at least first GaN layer occurs.

In some embodiments of the system, the means for sputtering includes means for doping the at least first GaN layer with silicon (Si). In some embodiments, the system further includes means for growing an aluminum nitride (AlN) layer on a base of the substrate such that the AlN layer forms the surface of the substrate. In some embodiments, the system further includes means for growing a grown-epitaxial metal mirror (GEMM) on the at least first GaN layer, wherein the GEMM includes alternating layers of hafnium (Hf):GaN and hafnium nitride (HfN). In some embodiments, the system further includes: means for growing a grown-epitaxial metal mirror (GEMM) on the at least first GaN layer, wherein the GEMM includes alternating layers of hafnium (Hf):GaN and hafnium nitride (HfN); and means for growing at least a first quantum well on a surface of the GEMM.

In some embodiments, the present invention provides a method for growing a gallium nitride (GaN) structure that includes providing a template; and growing at least a first GaN layer on the template using a first sputtering process, wherein the first sputtering process includes: controlling a temperature of a sputtering target, and modulating back and forth between a gallium-rich condition and a gallium-lean condition, wherein the gallium-rich condition includes a gallium-to-nitrogen ratio having a first value that is greater than 1, and wherein the gallium-lean condition includes the gallium-to-nitrogen ratio having a second value that is less than 1.

In some embodiments of the method, the first sputtering process further includes introducing nitrogen via a radio frequency (RF) nitrogen source. In some embodiments, the first sputtering process further includes doping the at least first GaN layer with silicon (Si). In some embodiments, the first sputtering process further includes doping the at least first GaN layer by gas injecting a reactant with a carrier gas holding silicon (Si). In some embodiments, the sputtering target is a solid gallium target, wherein the controlling of the temperature of the solid gallium target includes maintaining the temperature at a first temperature value that is less than approximately 14 degrees Celsius. In some embodiments, the sputtering target is a solid gallium target, and wherein the controlling of the temperature of the solid gallium target includes fluid-convection cooling the solid gallium target using an alcohol as a heat-transfer fluid.

In some embodiments of the method, the providing of the template includes growing an aluminum nitride (AlN) layer on the template. In some embodiments, the providing of the template includes growing an aluminum nitride (AlN) layer on the template using a second sputtering process. In some embodiments, the providing of the template includes growing a first aluminum nitride (AlN) layer on the template using a second sputtering process, wherein the method further includes growing a second aluminum nitride (AlN) layer on the at least first GaN layer using the second sputtering process; and growing a second GaN layer on the second AlN layer using the first sputtering process.

In some embodiments, the method further includes growing a grown-epitaxial metal mirror (GEMM) on the at least first GaN layer, wherein the GEMM includes alternating layers of hafnium (Hf):GaN and hafnium nitride (HfN). In some embodiments, the method further includes growing a grown-epitaxial metal mirror (GEMM) on the at least first GaN layer, wherein the GEMM includes alternating layers of hafnium (Hf):GaN and hafnium nitride (HfN); and growing at least a first quantum well on a surface of the GEMM using a metal-organic chemical vapor deposition (MOCVD) process. In some embodiments, the first sputtering process further includes magnetron sputtering. In some embodiments, the at least first GaN layer has an Omega rocking curve full-width half-maximum (FWHM) X-ray diffraction measurement for a 002 peak that is in a range of about 10 arcseconds to about 2500 arcseconds.

In some embodiments, the present invention provides a system for growing a gallium nitride (GaN) structure that includes a load lock configured to load a substrate wafer into the system and remove the GaN structure from the system; and a plurality of deposition chambers, wherein the plurality of deposition chambers includes a GaN-deposition chamber configured to grow at least a first GaN layer on a template that includes the substrate wafer via a first sputtering process, and wherein the first sputtering process includes a modulation back and forth between a gallium-rich condition and a gallium-lean condition, wherein the gallium-rich condition includes a gallium-to-nitrogen ratio having a first value that is greater than 1, and wherein the gallium-lean condition includes the gallium-to-nitrogen ratio having a second value that is less than 1.

In some embodiments, the system further includes a wafer-handling mechanism configured to automatically transfer the template between the plurality of deposition chambers. In some embodiments, the plurality of deposition chambers includes an aluminum nitride (AlN)-deposition chamber configured to grow an AlN layer on the substrate wafer to form the template via a second sputtering process. In some embodiments, the plurality of deposition chambers includes a grown-epitaxial metal mirror (GEMM)-deposition chamber configured to grow a GEMM on the at least first GaN layer. In some embodiments, the GaN-deposition chamber includes a solid gallium target that is maintained at a first temperature, and wherein the first temperature is less than approximately 14 degrees Celsius. In some embodiments, the GaN-deposition chamber further includes: a solid gallium target that is maintained at a first temperature; and a fluid-convection cooler configured to cool the solid gallium target via an alcohol heat-transfer fluid. In some embodiments, the GaN-deposition chamber is further configured to dope the at least first GaN layer with silicon (Si). In some embodiments, the GaN-deposition chamber is further configured to grow the at least first GaN layer such that the at least first GaN layer has an Omega rocking curve full-width half-maximum (FWHM) X-ray diffraction measurement for a 002 peak that is in a range of about 10 arcseconds to about 2500 arcseconds. In some embodiments, the plurality of deposition chambers further includes: an aluminum nitride (AWN)-deposition chamber configured to grow an AlN layer on the substrate wafer to form the template via a second sputtering process; a grown-epitaxial metal mirror (GEMM)-deposition chamber configured to grow a GEMM on the at least first GaN layer, wherein the GEMM includes alternating layers of hafnium (Hf):GaN and hafnium nitride (HfN); and a metal-organic chemical vapor deposition (MOCVD) chamber configured to grow at least a first quantum well on a surface of the GEMM.

In some embodiments, the present invention provides a gallium-nitride structure that includes a template; and at least a first gallium nitride (GaN) layer grown on the template, wherein the at least first GaN layer has an Omega rocking curve full-width half-maximum (FWHM) X-ray diffraction measurement for a 002 peak that is in a range of about 10 arcseconds to about 2500 arcseconds.

In some embodiments, the template includes an aluminum nitride (AlN) layer grown on a substrate. In some embodiments, the structure further includes a grown-epitaxial metal mirror (GEMM) grown on a surface of the at least first GaN layer. In some embodiments, the template includes an aluminum nitride (AlN) layer grown on a sapphire substrate, the structure further including a grown-epitaxial metal mirror (GEMM) grown on a surface of the at least first GaN layer, wherein the GEMM includes alternating layers of hafnium (Hf):GaN and hafnium nitride (HfN); a layer of n-type GaN grown on a surface of the GEMM; and a layer of p-type GaN/multiple quantum wells (MQWs) grown on the layer of n-type GaN.

In some embodiments, the present invention provides a system for growing a gallium nitride (GaN) structure that includes means for loading a substrate wafer into the system; and means for sputtering at least a first GaN layer on a template that includes the substrate wafer, wherein the means for sputtering the at least first GaN layer includes means for modulating back and forth between a gallium-rich condition and a gallium-lean condition, wherein the gallium-rich condition includes a gallium-to-nitrogen ratio having a first value that is greater than 1, and wherein the gallium-lean condition includes the gallium-to-nitrogen ratio having a second value that is less than 1.

In some embodiments of the system, the means for sputtering includes means for doping the at least first GaN layer with silicon (Si). In some embodiments, the system further includes means for growing an aluminum nitride (AlN) layer on the substrate wafer to form the template. In some embodiments, the system further includes means for growing a grown-epitaxial metal mirror (GEMM) on the at least first GaN layer, wherein the GEMM includes alternating layers of hafnium (Hf):GaN and hafnium nitride (HfN). In some embodiments, the system further includes means for growing a grown-epitaxial metal mirror (GEMM) on the at least first GaN layer, wherein the GEMM includes alternating layers of hafnium (Hf):GaN and hafnium nitride (HfN); and means for growing at least a first quantum well on a surface of the GEMM.

In some embodiments, the present invention provides a method for growing a gallium nitride (GaN) structure that includes providing a template; and growing at least a first GaN layer on the template using a first sputtering process, wherein the first sputtering process includes: providing a gallium sputtering target, wherein the gallium sputtering target has a depth, and maintaining a temperature of the gallium sputtering target at a first temperature value that is less than approximately 14 degrees Celsius. In some embodiments, the maintaining of the temperature of the gallium sputtering target includes providing a temperature gradient across the depth of the gallium sputtering target.

In some embodiments, the present invention provides a method for growing a gallium nitride (GaN) structure that includes providing a template having a surface; and growing at least a first GaN layer on the template using a first sputtering process, wherein the first sputtering process includes: modulating back and forth for at least a first oscillation between a gallium-rich condition on the surface of the template and a gallium-lean condition on the surface of the template, wherein the gallium-rich condition includes a gallium-to-nitrogen ratio having a first value that is greater than 1, and wherein the gallium-lean condition includes the gallium-to-nitrogen ratio having a second value that is less than the first value. In some embodiments, the modulating back and forth includes modulating back and forth for a plurality of oscillations including the first oscillation. In some embodiments, the at least first GaN layer has an Omega rocking curve full-width half-maximum (FWHM) X-ray diffraction measurement for a 102 peak that is in a range of about 10 arcseconds to about 2500 arcseconds.

In some embodiments, the present invention provides a method for growing a gallium nitride (GaN) structure that includes providing a template; and growing at least a first GaN layer on the template using a first sputtering process, wherein the first sputtering process includes: providing a gallium sputtering target, wherein the gallium sputtering target has a depth, and maintaining a temperature of the gallium sputtering target at a first temperature value that is less than approximately 14 degrees Celsius. In some embodiments, the at least first GaN layer has an Omega rocking curve full-width half-maximum (FWHM) X-ray diffraction measurement for a 102 peak that is in a range of about 10 arcseconds to about 2500 arcseconds. In some embodiments, the maintaining of the temperature of the gallium sputtering target includes providing a temperature gradient across the depth of the gallium sputtering target.

In some embodiments, the present invention provides a method for growing a gallium nitride (GaN) structure that includes providing a template; growing a first aluminum nitride (AlN) layer on the template using a first sputtering process; and growing a first GaN layer on the first AlN layer using a second sputtering process. In some embodiments, the method further includes growing a second AlN layer on the first GaN layer using the first sputtering process; and growing a second GaN layer on the second AlN layer using the second sputtering process. In some embodiments, the first GaN layer has an Omega rocking curve full-width half-maximum (FWHM) X-ray diffraction measurement for a 102 peak that is in a range of about 10 arcseconds to about 2500 arcseconds.

In some embodiments, the present invention provides a method for growing a gallium nitride (GaN) structure that includes providing a template having a surface; and growing at least a first GaN layer on the template using a first sputtering process, wherein the first sputtering process includes: growing the at least first GaN layer under at least two conditions, wherein the two conditions include a gallium-rich condition and a gallium-lean condition, wherein the gallium-rich condition includes a gallium-to-nitrogen ratio having a first value that is greater than 1, wherein the gallium-lean condition includes the gallium-to-nitrogen ratio having a second value that is less than the first value; alternating between the two conditions for at least a first growing under a first of the two conditions, a second growing under a second of the two conditions after the first growing, and a third growing under the first of the two conditions after the second growing. In some embodiments, the alternating between the two conditions further includes a fourth growing under the second of the two conditions after the third growing, and a fifth growing under the first of the two conditions after the fourth growing. In some embodiments, the first value of the gallium-to-nitrogen ratio is at least ten percent larger than the second value of the gallium-to-nitrogen ratio. In some embodiments, the first value of the gallium-to-nitrogen ratio is at least fifty percent larger than the second value of the gallium-to-nitrogen ratio. In some embodiments, the first value of the gallium-to-nitrogen ratio is at least two times larger than the second value of the gallium-to-nitrogen ratio.

In some embodiments, the present invention provides a method for growing a gallium nitride (GaN) structure that includes providing a template; growing a first aluminum nitride (AlN) layer on the template using a first sputtering process; and growing a first GaN layer on the first AlN layer using a second sputtering process. In some embodiments, the method further includes growing a second AlN layer on the first GaN layer using the first sputtering process; and growing a second GaN layer on the second AlN layer using the second sputtering process. In some embodiments, the first GaN layer has an Omega rocking curve full-width half-maximum (FWHM) X-ray diffraction measurement for a 102 peak that is in a range of about 10 arcseconds to about 2500 arcseconds. In some embodiments, the method further includes growing a second AlN layer on the first GaN layer using the first sputtering process; growing a second GaN layer on the second AlN layer using the second sputtering process; and growing one or more layers of $Al_xGa_{(1-x)}N$ on the second GaN layer, where x is between 0 and 1, inclusive. In some embodiments, the method further includes growing a second AlN layer on the first GaN layer using the first sputtering process; growing a second GaN layer on the second AlN layer using the second sputtering process; and growing one or more layers of $Al_xGa_{(1-x)}N$ on the second GaN layer, where x varies with depth and is between 0 and 1, inclusive. In some embodiments, the method further includes growing a second AlN layer on the first GaN layer using the first sputtering process; growing a second GaN layer on the second AlN layer using the second sputtering process; and growing one or more layers of compounds on the second GaN layer, wherein the compounds include one or more selected from the group consisting of hafnium nitride (HfN), zirconium nitride (ZrN), aluminum nitride (AlN), gallium nitride (GaN), and scandium nitride (ScN). In some embodiments, the method further includes growing one or more layers of $Al_xGa_{(1-x)}N$ on the first GaN layer, where x is between 0 and 1, inclusive. In some embodiments, first sputtering process further includes doping the at least first GaN layer with silicon (Si). In some embodiments, the method further includes growing one or more layers of $Al_xGa_{(1-x)}N$ on the first GaN layer, where x is between 0 and 1, inclusive. In some embodiments, the method further includes growing one or more layers of $Al_xGa_{(1-x)}N$ on the first GaN layer, where x varies with depth and is between 0 and 1, inclusive. In some embodiments, the method further includes growing one or more layers of compounds on the first GaN layer, wherein the compounds include one or more selected from the group consisting of hafnium nitride (HfN), zirconium nitride (ZrN), aluminum nitride (AlN), gallium nitride (GaN), and scandium nitride (ScN).

In some embodiments, the present invention provides a system for growing a gallium nitride (GaN) structure that includes a load lock configured to load a substrate wafer into the system and remove the GaN structure from the system; and a plurality of deposition chambers, wherein the plurality of deposition chambers includes a first GaN-deposition chamber configured to grow at least a first GaN layer, via a first sputtering process, on a template that includes the substrate wafer, wherein the first GaN-deposition chamber includes a gallium sputtering target, wherein the gallium sputtering target has a depth, and wherein the GaN-deposition chamber is further configured to maintain a temperature of the gallium sputtering target at a first temperature value that is less than approximately 14 degrees Celsius.

In some embodiments, the system further includes a wafer-handling mechanism configured to automatically transfer the template between the plurality of deposition chambers. In some embodiments, the plurality of deposition chambers includes an aluminum nitride (AlN)-deposition chamber configured to grow an AlN layer, via a second sputtering process, on the substrate wafer to form the template. In some embodiments, the plurality of deposition chambers includes a grown-epitaxial metal mirror (GEMM)-deposition chamber configured to grow a GEMM on the at least first GaN layer. In some embodiments, the system further includes a fluid-convection cooler configured to cool the gallium sputtering target via an alcohol heat-transfer fluid. In some embodiments, the GaN-deposition chamber is further configured to maintain a temperature gradient across the depth of the gallium sputtering target. In some embodiments, the plurality of deposition chambers includes a metal-organic chemical vapor deposition (MOCVD) chamber. In some embodiments, the GaN-deposition chamber is further configured to dope the at least first GaN layer with silicon (Si).

In some embodiments, the present invention provides a gallium-nitride structure that includes a template; and at least a first gallium nitride (GaN) layer grown on the template, wherein the at least first GaN layer has an Omega rocking curve full-width half-maximum (FWHM) X-ray diffraction measurement for a 102 peak that is in a range of about 10 arcseconds to about 2500 arcseconds. In some embodiments, the template includes an aluminum nitride (AlN) layer grown on a sapphire substrate, the structure further including a grown-epitaxial metal mirror (GEMM) grown on a surface of the at least first GaN layer, wherein the GEMM includes alternating layers of hafnium (Hf):GaN and hafnium nitride (HfN); a layer of n-type GaN grown on a surface of the GEMM; and a layer of p-type GaN/multiple quantum wells (MQWs) grown on the layer of n-type GaN.

It is specifically contemplated that the present invention includes embodiments having combinations and subcombinations of the various embodiments and features that are individually described herein (i.e., rather than listing every combinatorial of the elements, this specification includes descriptions of representative embodiments and contemplates embodiments that include some of the features from one embodiment combined with some of the features of another embodiment). Further, some embodiments include fewer than all the components described as part of any one of the embodiments described herein. Still further, it is specifically contemplated that the present invention includes embodiments having combinations and subcombinations of the various embodiments described herein and the various embodiments described by the related applications and publications incorporated by reference in paragraphs above of the present application.

It is to be understood that the above description is intended to be illustrative, and not restrictive. Although numerous characteristics and advantages of various embodiments as described herein have been set forth in the foregoing description, together with details of the structure and function of various embodiments, many other embodiments and changes to details will be apparent to those of skill in the art upon reviewing the above description. The scope of the invention should be, therefore, determined with reference to the appended claims, along with the full scope of equivalents to which such claims are entitled. In the appended claims, the terms "including" and "in which" are used as the plain-English equivalents of the respective terms "comprising" and "wherein," respectively. Moreover, the terms "first," "second," and "third," etc., are used merely as labels, and are not intended to impose numerical requirements on their objects.

What is claimed is:

1. A method for growing a Group IIIA metals-based nitride compound structure, said method comprising:
   (a) providing a template having a surface; and
   (b) growing at least a first Group IIIA metals-based nitride compound layer on the template using a first sputtering process, wherein the first sputtering process includes:
     (i) providing a gallium sputtering target, wherein the gallium sputtering target has a depth;
     (ii) growing the at least first Group IIIA metals-based nitride compound layer under at least two surface conditions, wherein the two surface conditions include a gallium-rich surface condition and a gallium-lean surface condition, wherein the gallium-rich surface condition includes a gallium-to-nitrogen ratio having a first value that is greater than 1, wherein the gallium-lean surface condition includes the gallium-to-nitrogen ratio having a second value that is less than the first value;
     (iii) alternating between the two surface conditions for at least a first growing under a first of the two surface conditions, a second growing under a second of the two surface conditions after the first growing, and a third growing under the first of the two surface conditions after the second growing; and
   (c) wherein the Group IIIA metals-based nitride compound comprises a nitride compound structure containing one or more Group IIIA metals where one of the metals is gallium (Ga), including gallium nitride (GaN), gallium aluminum nitride (GaAlN), and aluminum indium gallium nitride (AlInGaN).

2. The method of claim 1, wherein the alternating between the two surface conditions further includes a fourth growing under the second of the two surface conditions after the third growing, and a fifth growing under the first of the two surface conditions after the fourth growing.

3. The method of claim 1, wherein the at least first GaN layer has an Omega rocking curve full-width half-maximum (FWHM) X-ray diffraction measurement for a 102 peak that is in a range of about 10 arcseconds to about 2500 arcseconds.

4. The method of claim 1, wherein the first sputtering process further includes introducing nitrogen via a radio frequency (RF) nitrogen source.

5. The method of claim 1, wherein the first sputtering process further includes doping the at least first GaN layer with a dopant selected from the group consisting of silicon (Si), germanium (Ge), hafnium (Hf), zirconium (Zr), carbon (C), magnesium (Mg), titanium (Ti), oxygen (O), sulfur (S), selenium (Se), and tellurium (Te).

6. The method of claim 1, wherein the providing of the template includes growing an aluminum nitride (AlN) layer on the template using a second sputtering process.

7. The method of claim 1, further comprising growing a grown-epitaxial metal mirror (GEMM) en between the template and the at least first Group IIIA metals-based nitride compound layer.

8. The method of claim 1, further comprising growing a grown-epitaxial metal mirror (GEMM) on the at least first Group IIIA metals-based nitride compound layer.

9. A method for growing a Group IIIA metals-based nitride compound structure, said method comprising:
(a) providing a template; and
(b) growing at least a first GaN Group IIIA metals-based nitride compound layer on the template using a first sputtering process, wherein the first sputtering process includes:
    (i) providing a gallium sputtering target, wherein the gallium sputtering target has a depth; and
    (ii) maintaining gallium sputtering target in a frozen state substantially across its depth by maintaining a temperature of the gallium sputtering target at a first temperature value that is less than approximately −40 degrees Celsius; and
(c) wherein the Group IIIA metals-based nitride compound comprises a nitride compound structure containing one or more Group IIIA metals where one of the metals is gallium (Ga), including gallium nitride (GaN), gallium aluminum nitride (GaAlN), and aluminum indium gallium nitride (AlInGaN).

10. The method of claim 9, wherein the at least first GaN layer has an Omega rocking curve full-width half-maximum (FWHM) X-ray diffraction measurement for a 102 peak that is in a range of about 10 arcseconds to about 2500 arcseconds.

11. The method of claim 9, wherein the first sputtering process further includes doping the at least first Group IIIA metals-based nitride compound layer with a dopant selected from the group consisting of silicon (Si), germanium (Ge), hafnium (Hf), zirconium (Zr), carbon (C), magnesium (Mg), titanium (Ti), oxygen (O), sulfur (S), selenium (Se), and tellurium (Te).

12. The method of claim 9, wherein the maintaining of the temperature of the gallium sputtering target includes fluid-convection cooling the solid gallium target using a cryogenic heat transfer fluid like liquid nitrogen or liquid hydrogen.

13. A method for growing a Group IIIA metals-based nitride compound structure comprising:
(a) providing a gallium sputtering target having a surface, wherein the gallium sputtering target has a depth;
(b) growing at least a first Group IIIA metals-based nitride compound layer on a template using a first sputtering process, wherein the first sputtering process includes:
    (i) maintaining the gallium sputtering target in a frozen state substantially across its depth by maintaining a temperature of the gallium sputtering target at a first temperature value that is less than approximately 14 degrees Celsius;
    (ii) growing the at least first Group IIIA metals-based nitride compound layer under at least two surface conditions, wherein the two surface conditions include a gallium-rich surface condition and a gallium-lean surface condition, wherein the gallium-rich surface condition includes a gallium-to-nitrogen ratio having a first value that is greater than 1, wherein the gallium-lean surface condition includes the gallium-to-nitrogen ratio having a second value that is less than the first value;
    (iii) alternating between the two surface conditions for at least a first growing under a first of the two surface conditions, a second growing under a second of the two surface conditions after the first growing, and a third growing under the first of the two surface conditions after the second growing; and
(c) wherein the Group IIIA metals-based nitride compound comprises a nitride compound structure containing one or more Group IIIA metals where one of the metals is gallium (Ga), including gallium nitride (GaN), gallium aluminum nitride (GaAlN), and aluminum indium gallium nitride (AlInGaN).

14. The method of claim 13, wherein the alternating between the two surface conditions further includes a fourth growing under the second of the two surface conditions after the third growing, and a fifth growing under the first of the two surface conditions after the fourth growing.

15. The method of claim 13, wherein the at least first Group IIIA metals-based nitride compound layer has an Omega rocking curve full-width half-maximum (FWHM) X-ray diffraction measurement for a 102 peak that is in a range of 10 arcseconds to 2500 arcseconds.

16. The method of claim 13, wherein the first sputtering process further includes introducing nitrogen via a radio frequency (RF) nitrogen source.

17. The method of claim 13, wherein the first sputtering process further includes doping the at least first Group IIIA metals-based nitride compound layer with a dopant selected from the group consisting of silicon (Si), germanium (Ge), hafnium (Hf), zirconium (Zr), carbon (C), magnesium (Mg), titanium (Ti), oxygen (O), sulfur (S), selenium (Se), and tellurium (Te).

18. The method of claim 13, wherein the providing of the template includes growing an aluminum nitride (AlN) layer on the template using a second sputtering process.

19. A method for growing a Group IIIA metals-based nitride compound structure, said method comprising:
(a) providing a template;
(b) growing a first zirconium hafnium nitride ($Zr_{(x)}Hf_{(1-x)}N$) layer on the template using a first sputtering process;
(c) growing a first indium gallium nitride (InGaN) layer on the first $Zr_{(x)}Hf_{(1-x)}N$ layer using a second sputtering process;
(d) wherein the Group IIIA metals-based nitride compound comprises a nitride compound structure containing one or more Group IIIA metals where one of the metals is gallium (Ga), including gallium nitride (GaN), gallium aluminum nitride (GaAlN), and aluminum indium gallium nitride (AlInGaN).

20. The method of claim 19, further comprising:
(a) growing a second $Zr_{(x)}Hf_{(1-x)}N$ layer on the first InGaN layer using the first sputtering process; and
(b) growing a second InGaN layer on the second $Zr_{(x)}Hf_{(1-x)}N$ layer using the second sputtering process.

* * * * *